(12) United States Patent
Domingues Dos Santos et al.

(10) Patent No.: US 10,199,384 B2
(45) Date of Patent: Feb. 5, 2019

(54) FERROELECTRIC MEMORY DEVICE

(71) Applicant: ARKEMA FRANCE, Colombes (FR)

(72) Inventors: Fabrice Domingues Dos Santos, Lyons (FR); Thierry Lannuzel, Villeurbanne (FR)

(73) Assignee: ARKEMA FRANCE, Colombes (FR)

( * ) Notice: Subject to any disclaimer, the term of this patent is extended or adjusted under 35 U.S.C. 154(b) by 122 days.

(21) Appl. No.: 14/785,544

(22) PCT Filed: Apr. 16, 2014

(86) PCT No.: PCT/FR2014/050926
§ 371 (c)(1),
(2) Date: Oct. 19, 2015

(87) PCT Pub. No.: WO2014/170606
PCT Pub. Date: Oct. 23, 2014

(65) Prior Publication Data
US 2016/0071852 A1    Mar. 10, 2016

(30) Foreign Application Priority Data

Apr. 19, 2013    (FR) ...................................... 13 53571

(51) Int. Cl.
*H01L 27/115*    (2017.01)
*H01L 29/51*    (2006.01)
(Continued)

(52) U.S. Cl.
CPC ...... *H01L 27/11507* (2013.01); *C08F 214/22* (2013.01); *H01G 4/14* (2013.01);
(Continued)

(58) Field of Classification Search
None
See application file for complete search history.

(56) References Cited

U.S. PATENT DOCUMENTS 6,355,749 B1    3/2002    Chung
7,842,390 B2    11/2010   Chung et al.
(Continued)

FOREIGN PATENT DOCUMENTS

JP    2007525337 A    9/2007
JP    2007324543 A    12/2007
(Continued)

OTHER PUBLICATIONS

Kim et al., Flexible Organic Transistor Memory Devices, Nano Lett., 2010, vol. 10 (8), pp. 2884-2890.*
(Continued)

*Primary Examiner* — Callie E Shosho
*Assistant Examiner* — Patrick N English
(74) *Attorney, Agent, or Firm* — Millen, White, Zelano and Branigan, P.C.

(57) ABSTRACT

The invention relates to a ferroelectric memory device comprising at least one layer comprising a ferroelectric polymer, and at least two electrodes either side thereof, the ferroelectric polymer being of general formula P(VDF-X-Y), wherein VDF is vinylidene fluoride motifs, X is trifluoroethylene or tetrafluoroethylene motifs, and Y is motifs from a third monomer, the molar proportion of Y motifs in the polymer being less than or equal to 6.5%.

17 Claims, 1 Drawing Sheet

(51) Int. Cl.
*H01L 29/78* (2006.01)
*H01L 51/05* (2006.01)
*H01L 27/11507* (2017.01)
*H01G 4/14* (2006.01)
*H01L 21/28* (2006.01)
*H01L 29/66* (2006.01)
*H01L 27/10* (2006.01)
*H01L 29/861* (2006.01)
*H01L 27/28* (2006.01)
*H01L 49/02* (2006.01)
*C08F 214/22* (2006.01)
*H01G 4/33* (2006.01)
*H01G 7/06* (2006.01)
*H01G 4/18* (2006.01)
*H01L 51/00* (2006.01)
*H01L 27/1159* (2017.01)
*H01L 27/11502* (2017.01)
*H01L 27/11585* (2017.01)

(52) U.S. Cl.
CPC .............. *H01G 4/18* (2013.01); *H01G 4/33* (2013.01); *H01G 7/06* (2013.01); *H01L 21/28291* (2013.01); *H01L 27/101* (2013.01); *H01L 27/1159* (2013.01); *H01L 27/285* (2013.01); *H01L 28/40* (2013.01); *H01L 29/516* (2013.01); *H01L 29/6684* (2013.01); *H01L 29/78391* (2014.09); *H01L 29/861* (2013.01); *H01L 51/0034* (2013.01); *H01L 51/0043* (2013.01); *H01L 51/0575* (2013.01); *H01L 27/11502* (2013.01); *H01L 27/11585* (2013.01); *H01L 28/55* (2013.01); *H01L 51/004* (2013.01)

(56) References Cited

U.S. PATENT DOCUMENTS

| | | | |
|---|---|---|---|
| 8,552,127 | B2 | 10/2013 | Bauer et al. |
| 9,559,320 | B2 | 1/2017 | Blom |
| 2002/0146567 | A1* | 10/2002 | Zhang ............... C08F 214/22 428/421 |
| 2004/0109367 | A1* | 6/2004 | Toyoda ............... G11C 11/22 365/200 |
| 2007/0166838 | A1* | 7/2007 | Marsman ........... H01L 21/0212 438/3 |
| 2007/0281372 | A1 | 12/2007 | Takiguchi |
| 2008/0081195 | A1 | 4/2008 | Chung et al. |
| 2009/0030152 | A1* | 1/2009 | Zhang ............... H01G 4/186 525/199 |
| 2009/0285981 | A1* | 11/2009 | Dyreklev ............ G11C 11/22 427/131 |
| 2011/0110015 | A1 | 5/2011 | Zhang et al. |
| 2012/0116039 | A1 | 5/2012 | Bauer et al. |
| 2014/0135464 | A1 | 5/2014 | Bauer et al. |

FOREIGN PATENT DOCUMENTS

| | | |
|---|---|---|
| JP | 2010528471 A | 8/2010 |
| WO | 2004078814 A2 | 9/2004 |
| WO | 2005064653 A | 7/2005 |
| WO | 2008041998 A1 | 4/2008 |
| WO | 2008143509 A | 11/2008 |
| WO | 2009005555 A2 | 1/2009 |
| WO | 2010116105 A1 | 10/2010 |
| WO | 2012084579 A1 | 6/2012 |

OTHER PUBLICATIONS

Chen et al., P(VDF-TrFE-CFE) terpolymer thin-film for high performance nonvolatile memory, Applied Physics Letters, vol. 102, Feb. 11, 2013, pp. 1-5 (Year: 2013).*
Tajitsu et al., Ferroelectric Behavior of Thin Films of Vinylidene Fluoride/Trifluoroethylene/Hexafluoropropylene Copolymer, 1997, Jpn. J. Appl. Phys., vol. 36, pp. 6114-6117 (Year: 1997).*
International Search Report for PCT/FR2014/050926 dated Jun. 20, 2014.
Naber, Ronald C. G. et al., "Organic nonvolatile memory devices based on ferroelectricity," Advanced Materials, Mar. 2010, vol. 22, No. 9, pp. 933-945.
Office action in corresponding China Office Action 201480034917.1 dated Jul. 10, 2018.
Chen et al.; P(VDF-TrFE-CFE) terpolymer thin-film for high performance nonvolatile memory; Applied Physics Letters 102: 063-103 • Feb. 2013.

* cited by examiner

FERROELECTRIC MEMORY DEVICE

FIELD OF THE INVENTION

The present invention relates to a ferroelectric memory device comprising a ferroelectric polymer. The invention also relates to the use of this polymer in the manufacture of a ferroelectric memory device.

TECHNICAL BACKGROUND

The ability to store information is an essential property for many applications of organic electronics. RFID chips, for example, have to be able to receive and emit stored information, which is communicated by radio signal. In point of fact, the storage of information is based on the use of memory devices, in which advantage is taken of the hysteretic behavior of a physical property of a material in response to an applied electric field. The information stored is read by measuring the physical property in question.

A disadvantage of conventional means for the storage of information, such as capacitors, is the tendency of the latter to run down over (the term used is volatility of the memory); it is thus necessary to restore the information stored at regular time intervals, which is not possible for devices, such as RFID chips, which do not have available a permanent energy source.

Consequently, it is important to have available nonvolatile and rewritable memory devices. One of the possible routes for achieving this is to resort to a ferroelectric polymer. This is because the latter exhibits a zero-field remanent polymerization which it is possible to reverse by the application of an appropriate voltage.

Many authors have provided for the use of the polyvinylidene fluoride/trifluoroethylene copolymer, or P(VDF-TrFE), for this type of application.

Thus, the document WO 02/43071 describes ferroelectric memory circuits based on the use of ferroelectric polymers of the polyvinylidene fluoride family and in particular P(VDF-TrFE). The document plans to make available a contact layer comprising a conducting polymer, in contact with the layer of ferroelectric polymer, in order to improve the performance of the circuits.

The document *High-performance solution-processed polymer ferroelectric field-effect transistors* by Naber et al. in *Nature Materials*, 4 243-248 (2005), describes the use of a P(VDF-TrFE) polymer as gate insulator, in combination with poly[2-methoxy-5-(2'-ethylhexyloxy)-p-phenylene-vinylene] as semiconducting material, for the preparation of a ferroelectric field-effect transistor.

The document *Printed non-volatile memory for a sheet-type communication system* by Sekitani et al. in *IEEE Transactions on Electron Devices*, 56, 1027-1035 (2009), describes the use of printing technologies for the manufacture of nonvolatile memory devices with a ferroelectric ink based on P(VDF-TrFE).

The document *Organic nonvolatile memory devices based on ferroelectricity* by Naber et al. in *Adv. Mater.*, 22, 933-945 (2010), is a review of the different types of nonvolatile memory devices using a ferroelectric polymer. Only PVDF and P(VDF-TrFE) are mentioned as suitable ferroelectric polymers.

The document *Recent advances in ferroelectric polymer thin films for memory applications* by Furukawa et al. in *Current Applied Physics*, 10, e62-e67 (2010), is a review of the properties of P(VDF-TrFE) copolymers in the context of their applications in memory devices.

The document *Compression of cross-linked poly(vinylidene fluoride-co-trifluoroethylene) films for facile ferroelectric polarization* by Shin et al. in *ACS Appl. Mater. Interfaces*, 3, 4736-4743 (2011), describes a process for crosslinking P(VDF-TrFE) and is concerned with the effects of the pressure on the ferroelectric properties of the polymer.

The document *Organic ferroelectric memory devices with inkjet-printed polymer electrodes on flexible substrates*, by Bhansali et al. in *Microelectronic Engineering*, 105, 68-73 (2013), describes the manufacture of a matrix ferroelectric memory device by printing semiconducting electrodes made of poly(3,4-ethylenedioxythiophene):polystyrenesulfonate on a P(VDF-TrFE) layer.

However, P(VDF-TrFE) copolymers have the disadvantage of exhibiting a high coercive field strength (of more than 50 V/µm). The coercive field strength is the threshold electric field value which makes possible the cooperative switching of the dipoles of the material and thus the inversion of its polarization. When the coercive field strength is high, it is necessary to apply high voltages to the memory devices, which results in an excessive consumption of energy, risks of electrical breakdown of the material and also the need to use very thin layers of ferroelectric material.

The document *P(VDF-TrFE-CFE) terpolymer thin-film for high performance nonvolatile memory* by Chen et al. in *Applied Physics Letters*, 102, 063103 (2013), suggests the use of a terpolymer comprising a molar proportion of 60.3% of VDF, 32.6% of TrFE and 7.1% of chlorofluoroethylene for the manufacture of ferroelectric memory devices.

This terpolymer, which belongs to the category of "relaxer" polymers, exhibits a lower coercive field strength than P(VDF-TrFE) copolymers, of the order of 20 V/µm. On the other hand, the document does not specify that the remanent polarization of the terpolymer is low, which makes it difficult to use it for nonvolatile memories, and neither does it specify that its Curie temperature is low and close to ambient temperature. In point of fact, above the Curie temperature, the material loses is ferroelectric properties. The use of this polymer in memories thus cannot be envisaged in practice.

Thus, there exists a need to develop ferroelectric memory devices simultaneously exhibiting a relatively low coercive field strength, a relatively high remanent polarization and a relatively high Curie temperature.

SUMMARY OF THE INVENTION

The invention relates first to a ferroelectric memory device comprising at least one layer which comprises a ferroelectric polymer and at least two electrodes on either side of this layer, the ferroelectric polymer being of general formula P(VDF-X-Y), in which VDF (or $VF_2$) represents vinylidene fluoride units, X represents trifluoroethylene or tetrafluoroethylene units and Y represents units resulting from a third monomer, the molar proportion of Y units in the polymer being less than or equal to 6.5%.

According to the invention, X is different from Y.

According to an embodiment, Y represents tetrafluoroethylene, vinyl fluoride, perfluoro (alkyl vinyl) ether, bromotrifluoroethylene, chlorofluoroethylene, chlorotrifluoroethylene, hexafluoropropylene, tetrafluoropropene, chlorotrifluoropropene, trifluoropropene or pentafluoropropene units and Y preferably represents chlorotrifluoroethylene units.

According to one embodiment, X represents trifluoroethylene units.

According to one embodiment, the molar proportion of Y units in the polymer has a value from 0.1 to 6.5%, preferably from 0.5 to 6% and more particularly preferably from 2 to 5%.

According to one embodiment, the molar ratio of the VDF units to the X units in the polymer has a value from 55:45 to 80:20 and preferably from 60:40 to 75:25.

According to one embodiment, the ferroelectric polymer layer has a thickness of less than 1 μm, preferably a thickness of 10 nm to 900 nm, and more particularly preferably a thickness of 100 nm to 800 nm.

According to one embodiment, the device comprises a semiconducting material, preferably a semiconducting polymer, as a mixture with the ferroelectric polymer or in the form of a separate layer.

According to one embodiment, the device comprises or is a ferroelectric capacitor.

According to one embodiment, the device comprises or is a ferroelectric field-effect transistor.

According to one embodiment, the device comprises or is a ferroelectric diode.

According to one embodiment, the device is an integrated memory device comprising two arrays of electrodes on either side of a ferroelectric polymer layer or on either side of a plurality of ferroelectric polymer layers.

Another subject matter of the invention is the use of a ferroelectric polymer of general formula P(VDF-X-Y), in which VDF represents vinylidene fluoride units, X represents trifluoroethylene or tetrafluoroethylene units and Y represents units resulting from a third monomer, the molar proportion of Y units in the polymer being less than or equal to 6.5%, in the manufacture of a ferroelectric memory device.

According to one embodiment of this use, the ferroelectric polymer is as described above and/or the ferroelectric memory device is as described above and/or the ferroelectric polymer is positioned in a layer as described above.

According to one embodiment, the ferroelectric polymer is deposited on a substrate by spin coating, spraying or printing.

The present invention makes it possible to overcome the disadvantages of the state of the art. It more particularly provides ferroelectric memory devices simultaneously exhibiting a relatively low coercitive field strength, a relatively high remanent polarization and a relatively high Curie temperature.

These ferroelectric memory devices are preferably printed and flexible devices. They advantageously exhibit small dimensions. They can advantageously be manufactured by techniques of printed electronics or microelectronics.

This is accomplished by virtue of the use of polymers of P(VDF-TrFE-Y) or P(VDF-TFE-Y) type, VDF representing vinylidene fluoride, TrFE representing trifluoroethylene, TFE representing tetrafluoroethylene and Y representing a third monomer, the content of third monomer being relatively low (in particular less than or equal to 6.5%).

In comparison with the P(VDF-TrFE) copolymers of the state of the art, The polymers of the invention advantageously exhibit a lower coercitive field strength, in particular of less than 50 V/μm and, in some embodiments, of less than 40 V/μm, or less than 35 V/μm, or less than 30 V/μm, or less than 25 V/μm, or less than 20 V/μm.

In comparison with relaxer terpolymers, such as P(VDF-TrFE-CFE) of the abovementioned paper by Chen, the polymers of the invention advantageously exhibit a higher remanent polarization and in particular a remanent polarization of greater than 15 mC/m² and, in some embodiments, greater than 20 mC/m², greater than 25 mC/m², greater than 30 mC/m², greater than 35 mC/m², greater than 40 mC/m², or greater than 45 mC/m².

In comparison with relaxer terpolymers, such as P(VDF-TrFE-CFE) of the abovementioned paper by Chen, the polymers of the invention advantageously exhibit a higher Curie temperature and in particular a Curie temperature of greater than 20° C. and, in some embodiments, greater than 25° C., greater than 30° C., greater than 35° C., greater than 40° C., greater than 45° C., or greater than 50° C.

To sum up, the polymers according to the invention offer an excellent compromise in physical properties, by virtue of which they represent a material of choice for the manufacture of ferroelectric memory devices.

A preferred third monomer Y is chlorotrifluoroethylene ($CF_2=CClF$), which is available on an industrial scale and thus exhibits a greater ease of use than that of CFE, for example.

A preferred polymer is thus P(VDF-TrFE-CTFE).

DESCRIPTION OF EMBODIMENTS OF THE INVENTION

Figure 1:
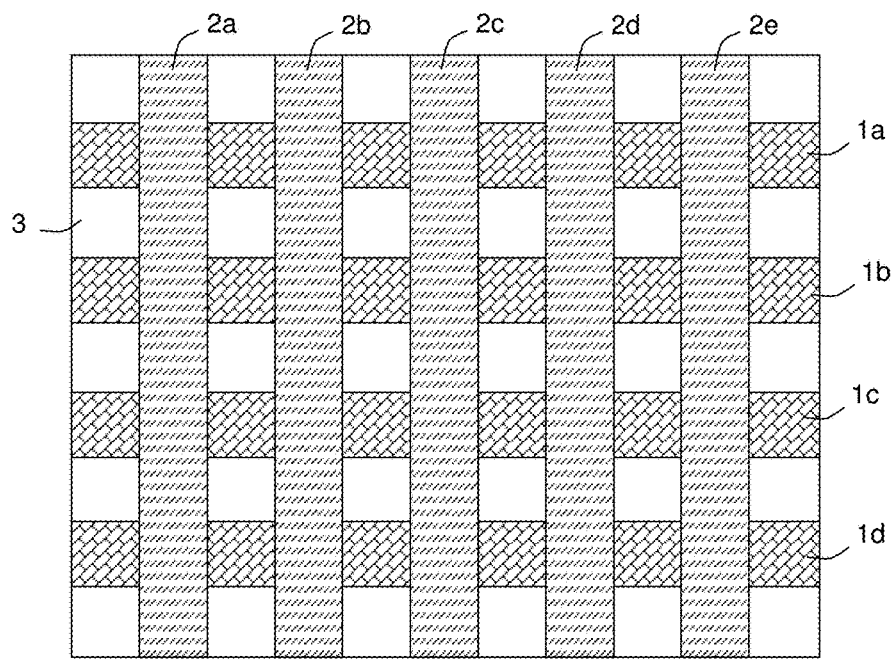
FIG. 1 diagrammatically represents an embodiment of an integrated memory device according to the invention, in top view.

The invention is now described in more detail and without implied limitation in the description which follows. Unless otherwise indicated, all the percentages are percentages in moles. The molecular weights are expressed in g/mol. Depending on the context, the symbols VDF, X, Y, and the like, represent either the structural units of the polymer or the monomers used for the manufacture of the polymer.

Although P(VDF-X-Y) polymers having the claimed composition can be produced by using any known process, such as emulsion polymerization, suspension polymerization and solution polymerization, it is preferable to use the process described in WO 2010/116105. This process makes it possible to obtain polymers of high molecular weight and of suitable structuring.

In short, the preferred process comprises the following stages:
the charging of an initial mixture of VDF and X (without Y) to a stirred autoclave containing water;
the heating of the autoclave to a predetermined temperature close to the polymerization temperature;
the injection into the autoclave of a radical polymerization initiator mixed with water, in order to achieve a pressure in the autoclave which is preferably at least 80 bar, in order to form a suspension of VDF and X monomers in water;
the injection into the autoclave of a second mixture of VDF, X and Y;
as soon as the polymerization reaction begins, the continuous injection of said second mixture into the autoclave reactor, in order to maintain the pressure at an essentially constant level, preferably of at least 80 bar.

The radical polymerization initiator can be an organic peroxide, such as a peroxydicarbonate. It is generally used in an amount of 0.1 to 10 g per kilogram of total charge of monomers. Preferably, the amount used is from 0.5 to 5 g/kg.

The initial mixture advantageously comprises only VDF and X in a proportion equal to that of the final polymer desired.

The second mixture advantageously has a composition which is adjusted so that the total composition of monomers introduced into the autoclave, including the initial mixture and the second mixture, is equal to or approximately equal to the composition of the final polymer desired.

The ratio by weight of the second mixture to the initial mixture is preferably from 0.5 to 2, more preferably from 0.8 to 1.6.

The implementation of this process with an initial mixture and a second mixture renders the process independent of the phase of initiation of the action, which is often unpredictable. The polymers thus obtained are in the form of a powder, without crust or skin.

The pressure in the autoclave reactor is preferably from 80 to 110 bar, and the temperature is maintained at a level preferably of 40° C. to 60° C.

The second mixture is injected continuously into the autoclave. It can be compressed before being injected into the autoclave, for example by using a compressor or two successive compressors, generally to a pressure greater than the pressure in the autoclave.

Although, according to some embodiments, additional monomers can be used as starting materials (in a minor amount, such as, for example, less than 5% or less than 2% or less than 1%) and although the resulting polymer of the invention can consequently comprise a minor amount (such as, for example, less than 5% or less than 2% or less than 1%) of other structural units than those mentioned above, only VDF, X and Y monomers are preferably used as starting materials, so that the polymer is composed solely of VDF, X and Y.

The monomer Y can be tetrafluoroethylene (TFE), when the monomer X is TrFE. Furthermore, whatever the monomer X, the monomer Y can be vinyl fluoride (VF), a perfluoro(alkyl vinyl) ether (PAVE), bromotrifluoroethylene, chlorofluoroethylene, chlorotrifluoroethylene (CTFE), hexafluoropropylene (HFP) or tetrafluoropropene. It can also be a chlorotrifluoropropene, a trifluoropropene or a pentafluoropropene.

Chlorofluoroethylene denotes either 1-chloro-1-fluoroethylene (it is this isomer which is denoted hereinafter by the abbreviation of CFE), or 1-chloro-2-fluoroethylene.

Tetrafluoropropene preferably denotes 2,3,3,3-tetrafluoropropene (1234yf).

The chlorotrifluoropropene is preferably 2-chloro-3,3,3-trifluoropropene (or 1233xf).

The trifluoropropene is preferably 3,3,3-trifluoropropene (or 1243zf).

The pentafluoropropene is preferably 1,1,3,3,3-pentafluoropropene (1225zc) or 1,2,3,3,3-pentafluoropropene (1225ye).

The perfluoro(alkyl vinyl) ether is of general formula $R_f$—O—CF=CF$_2$, $R_f$ being an alkyl group, preferably a C1 to C4 alkyl group. Preferred examples are PPVE (perfluoro(propyl vinyl) ether) and PMVE (perfluoro(methyl vinyl) ether).

It is possible to use a combination of several of the monomers Y above (for example CFE and CTFE, and the like), in which case the ranges shown in the patent application relating to the content of monomer Y are to be understood for the total of all the monomers Y.

However, according to a preferred embodiment, a single type of monomer Y is used and the polymer of the invention is thus preferably a terpolymer consisting exclusively of VDF units, of X units of a single type and of Y units of a single type.

After synthesis, the polymer is washed and dried.

The weight-average molar mass Mw of the polymer is preferably at least 100 000, preferably at least 200 000 and more preferably at least 300 000 or at least 400 000. It can be adjusted by modifying certain parameters of the process, such as the temperature in the reactor, or by adding a transfer agent.

The molecular weight distribution can be estimated by SEC (size exclusion chromatography) with dimethylformamide (DMF) as eluant, with an assembly of three columns of increasing porosity. The stationary phase is a styrene-DVB gel. The detection process is based on a measurement of the refractive index and the calibration is carried out with polystyrene standards. The sample is dissolved at 0.5 g/l in DMF and filtered through a 0.45 μm nylon filter.

The molecular weight can also be evaluated by measuring the melt flow index at 230° C. under a load of 5 kg according to ASTM D1238 (ISO 1133).

Furthermore, the molecular weight can also be characterized by a measurement of the viscosity in solution according to ISO 1628. Methyl ethyl ketone (MEK) is a preferred solvent of the terpolymers for the determination of the viscosity number.

Generally, the molar proportion of the monomers Y with respect to the total amount of monomers in the starting materials and/or the molar proportion of the structural units Y in the polymer has a value: from 0.1 to 0.2%; or from 0.2 to 0.3%; or from 0.3 to 0.4%; or from 0.4 to 0.5%; or from 0.5 to 0.6%; or from 0.6 to 0.7%; or from 0.7 to 0.8%; or from 0.8 to 0.9%; or from 0.9 to 1%; or from 1 to 1.1%; or from 1.1 to 1.2%; or from 1.2 to 1.3%; or from 1.3 to 1.4%; or from 1.4 to 1.5%; or from 1.5 to 1.6%; or from 1.6 to 1.7%; or from 1.7 to 1.8%; or from 1.8 to 1.9%; or from 1.9 to 2.0%; or from 2.0 to 2.1%; or from 2.1 to 2.2%; or from 2.2 to 2.3%; or from 2.3 to 2.4%; or from 2.4 to 2.5%; or from 2.5 to 2.6%; or from 2.6 to 2.7%; or from 2.7 to 2.8%; or from 2.8 to 2.9%; or from 2.9 to 3.0%; or from 3.0 to 3.1%; or from 3.1 to 3.2%; or from 3.2 to 3.3%; or from 3.3 to 3.4%; or from 3.4 to 3.5%; or from 3.5 to 3.6%; or from 3.6 to 3.7%; or from 3.7 to 3.8%; or from 3.8 to 3.9%; or from 3.9 to 4.0%; or from 4.0 to 4.1%; or from 4.1 to 4.2%; or from 4.2 to 4.3%; or from 4.3 to 4.4%; or from 4.4 to 4.5%; or from 4.5 to 4.6%; or from 4.6 to 4.7%; or from 4.7 to 4.8%; or from 4.8 to 4.9%; or from 4.9 to 5.0%; or from 5.0 to 5.1%; or from 5.1 to 5.2%; or from 5.2 to 5.3%; or from 5.3 to 5.4%; or from 5.4 to 5.5%; or from 5.5 to 5.6%; or from 5.6 to 5.7%; or from 5.7 to 5.8%; or from 5.8 to 5.9%; or from 5.9 to 6.0%; or from 6.0 to 6.1%; or from 6.1 to 6.2%; or from 6.2 to 6.3%; or from 6.3 to 6.4%; or from 6.4 to 6.5%.

Preferred ranges are, for example, those from 0.5 to 6.5%, from 1 to 6.5%, from 2 to 6.5%, from 2.5 to 6.5%, from 3 to 6.5%, from 3.5 to 6.5%, from 4 to 6.5%, from 4.5 to 6.5%, from 5 to 6.5%, from 5.5 to 6.5% and from 6 to 6.5%.

Other preferred ranges are, for example, those from 1 to 6%, from 1 to 5.5%, from 1 to 5%, from 1 to 4.5%, from 1 to 4%, from 1 to 3.5%, from 1 to 3%, from 1 to 2.5%, from 1 to 2% and from 1 to 1.5%.

Other preferred ranges are, for example, those from 1.5 to 5.5%, from 2 to 5%, from 2.5 to 4.5% and from 3 to 4%.

Generally, the VDF/X molar ratio of the molars used as starting materials and/or the VDF/X molar ratio in the polymer is from 55:45 to 80:20 and more preferably from 60:40 to 75:25.

According to some embodiments, the VDF/X molar ratio is from 55:45 to 56:44 or from 56:44 to 57:43 or from 57:43 to 58:42 or from 58:42 to 59:41 or from 59:41 to 60:40 or from 60:40 to 61:39 or from 61:39 to 62:38 or from 62:38 to 63:37 or from 63:37 to 64:36 or from 64:36 to 65:35 or from 65:35 to 66:34 or from 66:34 to 67:33 or from 67:33 to 68:32 or from 68:32 to 69:31 or from 69:31 to 70:30 or from 70:30 to 71:29 or from 71:29 to 72:28 or from 72:28 to 73:27 or from 73:27 to 74:24 or from 74:24 to 75:25 or from 75:25 to 76:24 or from 76:24 to 77:23 or from 77:23 to 78:22 or from 78:22 to 79:21 or from 79:21 to 80:20.

More generally, the molar composition of the polymers of the invention can be determined by various means. Conventional methods for the elemental analysis of carbon, fluorine and chlorine or bromine elements result in a system of two or three independent equations comprising two independent unknowns (% $VF_2$ and % X, with % Y=100−(% $VF_2$+% X)), which makes it possible to unambiguously calculate the composition by weight of the polymers, from which the molar composition is deduced.

It is also possible to employ multinuclear NMR techniques, in this instance proton ($^1H$) and fluorine ($^{19}F$), by analysis of a solution of the polymer in an appropriate deuterated solvent. The NMR spectrum is recorded on an FT-NMR spectrometer equipped with a multinuclear probe. The specific signals given by the different monomers in the spectra produced according to one or other nucleus are then located. Thus, for example, the unit TrFE (CFH═$CF_2$) gives, in proton NMR, a specific signal characteristic of the CFH group (at approximately 5 ppm). It is the same for the $CH_2$ groups of the $VF_2$ (unresolved peak centered at 3 ppm). The relative integration of the two signals gives the relative abundance of the two monomers, that is to say the VDF/TrFE molar ratio.

In the same way, the $CF_3$ of the propenes and of the end group of the perfluoro(alkyl vinyl) ethers gives a characteristic and well-isolated signal in fluorine NMR. The combination of the relative integrations of the different signals obtained in proton NMR and in fluorine NMR results in a system of equations, the solution of which results in the molar concentrations of the different monomer units being obtained.

Finally, it is possible to combine the elemental analysis, for example for the heteroatoms, such as chlorine or bromine, and the NMR analysis. Thus it is that the content of CTFE can be determined by a measurement of the content of chlorine by elemental analysis.

A person skilled in the art thus has available a range of methods or combinations of methods allowing him to determine, unambiguously and with the necessary accuracy, the composition of the polymers of the invention.

Examples of preferred polymers used in the context of the invention are those having the compositions summarized in the following tables (the composition relating either to the monomers of the reaction mixture or to the structural units present in the polymer obtained):

| Polymer No. | Nature of the starting monomers | VDF:X ratio | Content of Y |
|---|---|---|---|
| A1 | X is TrFE, Y is CTFE | from 55:45 to 60:40 | from 0.5 to 1% |
| A2 | X is TrFE, Y is CTFE | from 55:45 to 60:40 | from 1 to 1.5% |
| A3 | X is TrFE, Y is CTFE | from 55:45 to 60:40 | from 1.5 to 2% |
| A4 | X is TrFE, Y is CTFE | from 55:45 to 60:40 | from 2 to 2.5% |
| A5 | X is TrFE, Y is CTFE | from 55:45 to 60:40 | from 2.5 to 3% |
| A6 | X is TrFE, Y is CTFE | from 55:45 to 60:40 | from 3 to 3.5% |
| A7 | X is TrFE, Y is CTFE | from 55:45 to 60:40 | from 3.5 to 4% |

-continued

| Polymer No. | Nature of the starting monomers | VDF:X ratio | Content of Y |
|---|---|---|---|
| A8 | X is TrFE, Y is CTFE | from 55:45 to 60:40 | from 4 to 4.5% |
| A9 | X is TrFE, Y is CTFE | from 55:45 to 60:40 | from 4.5 to 5% |
| A10 | X is TrFE, Y is CTFE | from 55:45 to 60:40 | from 5 to 5.5% |
| A11 | X is TrFE, Y is CTFE | from 55:45 to 60:40 | from 5.5 to 6% |
| A12 | X is TrFE, Y is CTFE | from 55:45 to 60:40 | from 6 to 6.5% |
| A13 | X is TrFE, Y is CTFE | from 60:40 to 65:35 | from 0.5 to 1% |
| A14 | X is TrFE, Y is CTFE | from 60:40 to 65:35 | from 1 to 1.5% |
| A15 | X is TrFE, Y is CTFE | from 60:40 to 65:35 | from 1.5 to 2% |
| A16 | X is TrFE, Y is CTFE | from 60:40 to 65:35 | from 2 to 2.5% |
| A17 | X is TrFE, Y is CTFE | from 60:40 to 65:35 | from 2.5 to 3% |
| A18 | X is TrFE, Y is CTFE | from 60:40 to 65:35 | from 3 to 3.5% |
| A19 | X is TrFE, Y is CTFE | from 60:40 to 65:35 | from 3.5 to 4% |
| A20 | X is TrFE, Y is CTFE | from 60:40 to 65:35 | from 4 to 4.5% |
| A21 | X is TrFE, Y is CTFE | from 60:40 to 65:35 | from 4.5 to 5% |
| A22 | X is TrFE, Y is CTFE | from 60:40 to 65:35 | from 5 to 5.5% |
| A23 | X is TrFE, Y is CTFE | from 60:40 to 65:35 | from 5.5 to 6% |
| A24 | X is TrFE, Y is CTFE | from 60:40 to 65:35 | from 6 to 6.5% |
| A25 | X is TrFE, Y is CTFE | from 65:35 to 70:30 | from 0.5 to 1% |
| A26 | X is TrFE, Y is CTFE | from 65:35 to 70:30 | from 1 to 1.5% |
| A27 | X is TrFE, Y is CTFE | from 65:35 to 70:30 | from 1.5 to 2% |
| A28 | X is TrFE, Y is CTFE | from 65:35 to 70:30 | from 2 to 2.5% |
| A29 | X is TrFE, Y is CTFE | from 65:35 to 70:30 | from 2.5 to 3% |
| A30 | X is TrFE, Y is CTFE | from 65:35 to 70:30 | from 3 to 3.5% |
| A31 | X is TrFE, Y is CTFE | from 65:35 to 70:30 | from 3.5 to 4% |
| A32 | X is TrFE, Y is CTFE | from 65:35 to 70:30 | from 4 to 4.5% |
| A33 | X is TrFE, Y is CTFE | from 65:35 to 70:30 | from 4.5 to 5% |
| A34 | X is TrFE, Y is CTFE | from 65:35 to 70:30 | from 5 to 5.5% |
| A35 | X is TrFE, Y is CTFE | from 65:35 to 70:30 | from 5.5 to 6% |
| A36 | X is TrFE, Y is CTFE | from 65:35 to 70:30 | from 6 to 6.5% |
| A37 | X is TrFE, Y is CTFE | from 70:30 to 75:25 | from 0.5 to 1% |
| A38 | X is TrFE, Y is CTFE | from 70:30 to 75:25 | from 1 to 1.5% |
| A39 | X is TrFE, Y is CTFE | from 70:30 to 75:25 | from 1.5 to 2% |
| A40 | X is TrFE, Y is CTFE | from 70:30 to 75:25 | from 2 to 2.5% |
| A41 | X is TrFE, Y is CTFE | from 70:30 to 75:25 | from 2.5 to 3% |
| A42 | X is TrFE, Y is CTFE | from 70:30 to 75:25 | from 3 to 3.5% |
| A43 | X is TrFE, Y is CTFE | from 70:30 to 75:25 | from 3.5 to 4% |
| A44 | X is TrFE, Y is CTFE | from 70:30 to 75:25 | from 4 to 4.5% |
| A45 | X is TrFE, Y is CTFE | from 70:30 to 75:25 | from 4.5 to 5% |
| A46 | X is TrFE, Y is CTFE | from 70:30 to 75:25 | from 5 to 5.5% |
| A47 | X is TrFE, Y is CTFE | from 70:30 to 75:25 | from 5.5 to 6% |
| A48 | X is TrFE, Y is CTFE | from 70:30 to 75:25 | from 6 to 6.5% |
| A49 | X is TrFE, Y is CTFE | from 75:25 to 80:20 | from 0.5 to 1% |
| A50 | X is TrFE, Y is CTFE | from 75:25 to 80:20 | from 1 to 1.5% |
| A51 | X is TrFE, Y is CTFE | from 75:25 to 80:20 | from 1.5 to 2% |
| A52 | X is TrFE, Y is CTFE | from 75:25 to 80:20 | from 2 to 2.5% |
| A53 | X is TrFE, Y is CTFE | from 75:25 to 80:20 | from 2.5 to 3% |
| A54 | X is TrFE, Y is CTFE | from 75:25 to 80:20 | from 3 to 3.5% |
| A55 | X is TrFE, Y is CTFE | from 75:25 to 80:20 | from 3.5 to 4% |
| A56 | X is TrFE, Y is CTFE | from 75:25 to 80:20 | from 4 to 4.5% |
| A57 | X is TrFE, Y is CTFE | from 75:25 to 80:20 | from 4.5 to 5% |
| A58 | X is TrFE, Y is CTFE | from 75:25 to 80:20 | from 5 to 5.5% |
| A59 | X is TrFE, Y is CTFE | from 75:25 to 80:20 | from 5.5 to 6% |
| A60 | X is TrFE, Y is CTFE | from 75:25 to 80:20 | from 6 to 6.5% |
| B1 | X is TFE, Y is CTFE | from 55:45 to 60:40 | from 0.5 to 1% |
| B2 | X is TFE, Y is CTFE | from 55:45 to 60:40 | from 1 to 1.5% |
| B3 | X is TFE, Y is CTFE | from 55:45 to 60:40 | from 1.5 to 2% |
| B4 | X is TFE, Y is CTFE | from 55:45 to 60:40 | from 2 to 2.5% |
| B5 | X is TFE, Y is CTFE | from 55:45 to 60:40 | from 2.5 to 3% |
| B6 | X is TFE, Y is CTFE | from 55:45 to 60:40 | from 3 to 3.5% |
| B7 | X is TFE, Y is CTFE | from 55:45 to 60:40 | from 3.5 to 4% |
| B8 | X is TFE, Y is CTFE | from 55:45 to 60:40 | from 4 to 4.5% |
| B9 | X is TFE, Y is CTFE | from 55:45 to 60:40 | from 4.5 to 5% |
| B10 | X is TFE, Y is CTFE | from 55:45 to 60:40 | from 5 to 5.5% |
| B11 | X is TFE, Y is CTFE | from 55:45 to 60:40 | from 5.5 to 6% |
| B12 | X is TFE, Y is CTFE | from 55:45 to 60:40 | from 6 to 6.5% |
| B13 | X is TFE, Y is CTFE | from 60:40 to 65:35 | from 0.5 to 1% |
| B14 | X is TFE, Y is CTFE | from 60:40 to 65:35 | from 1 to 1.5% |
| B15 | X is TFE, Y is CTFE | from 60:40 to 65:35 | from 1.5 to 2% |
| B16 | X is TFE, Y is CTFE | from 60:40 to 65:35 | from 2 to 2.5% |
| B17 | X is TFE, Y is CTFE | from 60:40 to 65:35 | from 2.5 to 3% |
| B18 | X is TFE, Y is CTFE | from 60:40 to 65:35 | from 3 to 3.5% |
| B19 | X is TFE, Y is CTFE | from 60:40 to 65:35 | from 3.5 to 4% |
| B20 | X is TFE, Y is CTFE | from 60:40 to 65:35 | from 4 to 4.5% |
| B21 | X is TFE, Y is CTFE | from 60:40 to 65:35 | from 4.5 to 5% |
| B22 | X is TFE, Y is CTFE | from 60:40 to 65:35 | from 5 to 5.5% |
| B23 | X is TFE, Y is CTFE | from 60:40 to 65:35 | from 5.5 to 6% |

-continued

| Polymer No. | Nature of the starting monomers | VDF:X ratio | Content of Y |
|---|---|---|---|
| B24 | X is TFE, Y is CTFE | from 60:40 to 65:35 | from 6 to 6.5% |
| B25 | X is TFE, Y is CTFE | from 65:35 to 70:30 | from 0.5 to 1% |
| B26 | X is TFE, Y is CTFE | from 65:35 to 70:30 | from 1 to 1.5% |
| B27 | X is TFE, Y is CTFE | from 65:35 to 70:30 | from 1.5 to 2% |
| B28 | X is TFE, Y is CTFE | from 65:35 to 70:30 | from 2 to 2.5% |
| B29 | X is TFE, Y is CTFE | from 65:35 to 70:30 | from 2.5 to 3% |
| B30 | X is TFE, Y is CTFE | from 65:35 to 70:30 | from 3 to 3.5% |
| B31 | X is TFE, Y is CTFE | from 65:35 to 70:30 | from 3.5 to 4% |
| B32 | X is TFE, Y is CTFE | from 65:35 to 70:30 | from 4 to 4.5% |
| B33 | X is TFE, Y is CTFE | from 65:35 to 70:30 | from 4.5 to 5% |
| B34 | X is TFE, Y is CTFE | from 65:35 to 70:30 | from 5 to 5.5% |
| B35 | X is TFE, Y is CTFE | from 65:35 to 70:30 | from 5.5 to 6% |
| B36 | X is TFE, Y is CTFE | from 65:35 to 70:30 | from 6 to 6.5% |
| B37 | X is TFE, Y is CTFE | from 70:30 to 75:25 | from 0.5 to 1% |
| B38 | X is TFE, Y is CTFE | from 70:30 to 75:25 | from 1 to 1.5% |
| B39 | X is TFE, Y is CTFE | from 70:30 to 75:25 | from 1.5 to 2% |
| B40 | X is TFE, Y is CTFE | from 70:30 to 75:25 | from 2 to 2.5% |
| B41 | X is TFE, Y is CTFE | from 70:30 to 75:25 | from 2.5 to 3% |
| B42 | X is TFE, Y is CTFE | from 70:30 to 75:25 | from 3 to 3.5% |
| B43 | X is TFE, Y is CTFE | from 70:30 to 75:25 | from 3.5 to 4% |
| B44 | X is TFE, Y is CTFE | from 70:30 to 75:25 | from 4 to 4.5% |
| B45 | X is TFE, Y is CTFE | from 70:30 to 75:25 | from 4.5 to 5% |
| B46 | X is TFE, Y is CTFE | from 70:30 to 75:25 | from 5 to 5.5% |
| B47 | X is TFE, Y is CTFE | from 70:30 to 75:25 | from 5.5 to 6% |
| B48 | X is TFE, Y is CTFE | from 70:30 to 75:25 | from 6 to 6.5% |
| B49 | X is TFE, Y is CTFE | from 75:25 to 80:20 | from 0.5 to 1% |
| B50 | X is TFE, Y is CTFE | from 75:25 to 80:20 | from 1 to 1.5% |
| B51 | X is TFE, Y is CTFE | from 75:25 to 80:20 | from 1.5 to 2% |
| B52 | X is TFE, Y is CTFE | from 75:25 to 80:20 | from 2 to 2.5% |
| B53 | X is TFE, Y is CTFE | from 75:25 to 80:20 | from 2.5 to 3% |
| B54 | X is TFE, Y is CTFE | from 75:25 to 80:20 | from 3 to 3.5% |
| B55 | X is TFE, Y is CTFE | from 75:25 to 80:20 | from 3.5 to 4% |
| B56 | X is TFE, Y is CTFE | from 75:25 to 80:20 | from 4 to 4.5% |
| B57 | X is TFE, Y is CTFE | from 75:25 to 80:20 | from 4.5 to 5% |
| B58 | X is TFE, Y is CTFE | from 75:25 to 80:20 | from 5 to 5.5% |
| B59 | X is TFE, Y is CTFE | from 75:25 to 80:20 | from 5.5 to 6% |
| B60 | X is TFE, Y is CTFE | from 75:25 to 80:20 | from 6 to 6.5% |
| C1 | X is TrFE, Y is CFE | from 55:45 to 60:40 | from 0.5 to 1% |
| C2 | X is TrFE, Y is CFE | from 55:45 to 60:40 | from 1 to 1.5% |
| C3 | X is TrFE, Y is CFE | from 55:45 to 60:40 | from 1.5 to 2% |
| C4 | X is TrFE, Y is CFE | from 55:45 to 60:40 | from 2 to 2.5% |
| C5 | X is TrFE, Y is CFE | from 55:45 to 60:40 | from 2.5 to 3% |
| C6 | X is TrFE, Y is CFE | from 55:45 to 60:40 | from 3 to 3.5% |
| C7 | X is TrFE, Y is CFE | from 55:45 to 60:40 | from 3.5 to 4% |
| C8 | X is TrFE, Y is CFE | from 55:45 to 60:40 | from 4 to 4.5% |
| C9 | X is TrFE, Y is CFE | from 55:45 to 60:40 | from 4.5 to 5% |
| C10 | X is TrFE, Y is CFE | from 55:45 to 60:40 | from 5 to 5.5% |
| C11 | X is TrFE, Y is CFE | from 55:45 to 60:40 | from 5.5 to 6% |
| C12 | X is TrFE, Y is CFE | from 55:45 to 60:40 | from 6 to 6.5% |
| C13 | X is TrFE, Y is CFE | from 60:40 to 65:35 | from 0.5 to 1% |
| C14 | X is TrFE, Y is CFE | from 60:40 to 65:35 | from 1 to 1.5% |
| C15 | X is TrFE, Y is CFE | from 60:40 to 65:35 | from 1.5 to 2% |
| C16 | X is TrFE, Y is CFE | from 60:40 to 65:35 | from 2 to 2.5% |
| C17 | X is TrFE, Y is CFE | from 60:40 to 65:35 | from 2.5 to 3% |
| C18 | X is TrFE, Y is CFE | from 60:40 to 65:35 | from 3 to 3.5% |
| C19 | X is TrFE, Y is CFE | from 60:40 to 65:35 | from 3.5 to 4% |
| C20 | X is TrFE, Y is CFE | from 60:40 to 65:35 | from 4 to 4.5% |
| C21 | X is TrFE, Y is CFE | from 60:40 to 65:35 | from 4.5 to 5% |
| C22 | X is TrFE, Y is CFE | from 60:40 to 65:35 | from 5 to 5.5% |
| C23 | X is TrFE, Y is CFE | from 60:40 to 65:35 | from 5.5 to 6% |
| C24 | X is TrFE, Y is CFE | from 60:40 to 65:35 | from 6 to 6.5% |
| C25 | X is TrFE, Y is CFE | from 65:35 to 70:30 | from 0.5 to 1% |
| C26 | X is TrFE, Y is CFE | from 65:35 to 70:30 | from 1 to 1.5% |
| C27 | X is TrFE, Y is CFE | from 65:35 to 70:30 | from 1.5 to 2% |
| C28 | X is TrFE, Y is CFE | from 65:35 to 70:30 | from 2 to 2.5% |
| C29 | X is TrFE, Y is CFE | from 65:35 to 70:30 | from 2.5 to 3% |
| C30 | X is TrFE, Y is CFE | from 65:35 to 70:30 | from 3 to 3.5% |
| C31 | X is TrFE, Y is CFE | from 65:35 to 70:30 | from 3.5 to 4% |
| C32 | X is TrFE, Y is CFE | from 65:35 to 70:30 | from 4 to 4.5% |
| C33 | X is TrFE, Y is CFE | from 65:35 to 70:30 | from 4.5 to 5% |
| C34 | X is TrFE, Y is CFE | from 65:35 to 70:30 | from 5 to 5.5% |
| C35 | X is TrFE, Y is CFE | from 65:35 to 70:30 | from 5.5 to 6% |
| C36 | X is TrFE, Y is CFE | from 65:35 to 70:30 | from 6 to 6.5% |
| C37 | X is TrFE, Y is CFE | from 70:30 to 75:25 | from 0.5 to 1% |
| C38 | X is TrFE, Y is CFE | from 70:30 to 75:25 | from 1 to 1.5% |
| C39 | X is TrFE, Y is CFE | from 70:30 to 75:25 | from 1.5 to 2% |
| C40 | X is TrFE, Y is CFE | from 70:30 to 75:25 | from 2 to 2.5% |
| C41 | X is TrFE, Y is CFE | from 70:30 to 75:25 | from 2.5 to 3% |
| C42 | X is TrFE, Y is CFE | from 70:30 to 75:25 | from 3 to 3.5% |
| C43 | X is TrFE, Y is CFE | from 70:30 to 75:25 | from 3.5 to 4% |
| C44 | X is TrFE, Y is CFE | from 70:30 to 75:25 | from 4 to 4.5% |
| C45 | X is TrFE, Y is CFE | from 70:30 to 75:25 | from 4.5 to 5% |
| C46 | X is TrFE, Y is CFE | from 70:30 to 75:25 | from 5 to 5.5% |
| C47 | X is TrFE, Y is CFE | from 70:30 to 75:25 | from 5.5 to 6% |
| C48 | X is TrFE, Y is CFE | from 70:30 to 75:25 | from 6 to 6.5% |
| C49 | X is TrFE, Y is CFE | from 75:25 to 80:20 | from 0.5 to 1% |
| C50 | X is TrFE, Y is CFE | from 75:25 to 80:20 | from 1 to 1.5% |
| C51 | X is TrFE, Y is CFE | from 75:25 to 80:20 | from 1.5 to 2% |
| C52 | X is TrFE, Y is CFE | from 75:25 to 80:20 | from 2 to 2.5% |
| C53 | X is TrFE, Y is CFE | from 75:25 to 80:20 | from 2.5 to 3% |
| C54 | X is TrFE, Y is CFE | from 75:25 to 80:20 | from 3 to 3.5% |
| C55 | X is TrFE, Y is CFE | from 75:25 to 80:20 | from 3.5 to 4% |
| C56 | X is TrFE, Y is CFE | from 75:25 to 80:20 | from 4 to 4.5% |
| C57 | X is TrFE, Y is CFE | from 75:25 to 80:20 | from 4.5 to 5% |
| C58 | X is TrFE, Y is CFE | from 75:25 to 80:20 | from 5 to 5.5% |
| C59 | X is TrFE, Y is CFE | from 75:25 to 80:20 | from 5.5 to 6% |
| C60 | X is TrFE, Y is CFE | from 75:25 to 80:20 | from 6 to 6.5% |
| D1 | X is TFE, Y is CFE | from 55:45 to 60:40 | from 0.5 to 1% |
| D2 | X is TFE, Y is CFE | from 55:45 to 60:40 | from 1 to 1.5% |
| D3 | X is TFE, Y is CFE | from 55:45 to 60:40 | from 1.5 to 2% |
| D4 | X is TFE, Y is CFE | from 55:45 to 60:40 | from 2 to 2.5% |
| D5 | X is TFE, Y is CFE | from 55:45 to 60:40 | from 2.5 to 3% |
| D6 | X is TFE, Y is CFE | from 55:45 to 60:40 | from 3 to 3.5% |
| D7 | X is TFE, Y is CFE | from 55:45 to 60:40 | from 3.5 to 4% |
| D8 | X is TFE, Y is CFE | from 55:45 to 60:40 | from 4 to 4.5% |
| D9 | X is TFE, Y is CFE | from 55:45 to 60:40 | from 4.5 to 5% |
| D10 | X is TFE, Y is CFE | from 55:45 to 60:40 | from 5 to 5.5% |
| D11 | X is TFE, Y is CFE | from 55:45 to 60:40 | from 5.5 to 6% |
| D12 | X is TFE, Y is CFE | from 55:45 to 60:40 | from 6 to 6.5% |
| D13 | X is TFE, Y is CFE | from 60:40 to 65:35 | from 0.5 to 1% |
| D14 | X is TFE, Y is CFE | from 60:40 to 65:35 | from 1 to 1.5% |
| D15 | X is TFE, Y is CFE | from 60:40 to 65:35 | from 1.5 to 2% |
| D16 | X is TFE, Y is CFE | from 60:40 to 65:35 | from 2 to 2.5% |
| D17 | X is TFE, Y is CFE | from 60:40 to 65:35 | from 2.5 to 3% |
| D18 | X is TFE, Y is CFE | from 60:40 to 65:35 | from 3 to 3.5% |
| D19 | X is TFE, Y is CFE | from 60:40 to 65:35 | from 3.5 to 4% |
| D20 | X is TFE, Y is CFE | from 60:40 to 65:35 | from 4 to 4.5% |
| D21 | X is TFE, Y is CFE | from 60:40 to 65:35 | from 4.5 to 5% |
| D22 | X is TFE, Y is CFE | from 60:40 to 65:35 | from 5 to 5.5% |
| D23 | X is TFE, Y is CFE | from 60:40 to 65:35 | from 5.5 to 6% |
| D24 | X is TFE, Y is CFE | from 60:40 to 65:35 | from 6 to 6.5% |
| D25 | X is TFE, Y is CFE | from 65:35 to 70:30 | from 0.5 to 1% |
| D26 | X is TFE, Y is CFE | from 65:35 to 70:30 | from 1 to 1.5% |
| D27 | X is TFE, Y is CFE | from 65:35 to 70:30 | from 1.5 to 2% |
| D28 | X is TFE, Y is CFE | from 65:35 to 70:30 | from 2 to 2.5% |
| D29 | X is TFE, Y is CFE | from 65:35 to 70:30 | from 2.5 to 3% |
| D30 | X is TFE, Y is CFE | from 65:35 to 70:30 | from 3 to 3.5% |
| D31 | X is TFE, Y is CFE | from 65:35 to 70:30 | from 3.5 to 4% |
| D32 | X is TFE, Y is CFE | from 65:35 to 70:30 | from 4 to 4.5% |
| D33 | X is TFE, Y is CFE | from 65:35 to 70:30 | from 4.5 to 5% |
| D34 | X is TFE, Y is CFE | from 65:35 to 70:30 | from 5 to 5.5% |
| D35 | X is TFE, Y is CFE | from 65:35 to 70:30 | from 5.5 to 6% |
| D36 | X is TFE, Y is CFE | from 65:35 to 70:30 | from 6 to 6.5% |
| D37 | X is TFE, Y is CFE | from 70:30 to 75:25 | from 0.5 to 1% |
| D38 | X is TFE, Y is CFE | from 70:30 to 75:25 | from 1 to 1.5% |
| D39 | X is TFE, Y is CFE | from 70:30 to 75:25 | from 1.5 to 2% |
| D40 | X is TFE, Y is CFE | from 70:30 to 75:25 | from 2 to 2.5% |
| D41 | X is TFE, Y is CFE | from 70:30 to 75:25 | from 2.5 to 3% |
| D42 | X is TFE, Y is CFE | from 70:30 to 75:25 | from 3 to 3.5% |
| D43 | X is TFE, Y is CFE | from 70:30 to 75:25 | from 3.5 to 4% |
| D44 | X is TFE, Y is CFE | from 70:30 to 75:25 | from 4 to 4.5% |
| D45 | X is TFE, Y is CFE | from 70:30 to 75:25 | from 4.5 to 5% |
| D46 | X is TFE, Y is CFE | from 70:30 to 75:25 | from 5 to 5.5% |
| D47 | X is TFE, Y is CFE | from 70:30 to 75:25 | from 5.5 to 6% |
| D48 | X is TFE, Y is CFE | from 70:30 to 75:25 | from 6 to 6.5% |
| D49 | X is TFE, Y is CFE | from 75:25 to 80:20 | from 0.5 to 1% |
| D50 | X is TFE, Y is CFE | from 75:25 to 80:20 | from 1 to 1.5% |
| D51 | X is TFE, Y is CFE | from 75:25 to 80:20 | from 1.5 to 2% |
| D52 | X is TFE, Y is CFE | from 75:25 to 80:20 | from 2 to 2.5% |
| D53 | X is TFE, Y is CFE | from 75:25 to 80:20 | from 2.5 to 3% |
| D54 | X is TFE, Y is CFE | from 75:25 to 80:20 | from 3 to 3.5% |
| D55 | X is TFE, Y is CFE | from 75:25 to 80:20 | from 3.5 to 4% |

-continued

| Polymer No. | Nature of the starting monomers | VDF:X ratio | Content of Y |
|---|---|---|---|
| D56 | X is TFE, Y is CFE | from 75:25 to 80:20 | from 4 to 4.5% |
| D57 | X is TFE, Y is CFE | from 75:25 to 80:20 | from 4.5 to 5% |
| D58 | X is TFE, Y is CFE | from 75:25 to 80:20 | from 5 to 5.5% |
| D59 | X is TFE, Y is CFE | from 75:25 to 80:20 | from 5.5 to 6% |
| D60 | X is TFE, Y is CFE | from 75:25 to 80:20 | from 6 to 6.5% |
| E1 | X is TrFE, Y is HFP | from 55:45 to 60:40 | from 0.5 to 1% |
| E2 | X is TrFE, Y is HFP | from 55:45 to 60:40 | from 1 to 1.5% |
| E3 | X is TrFE, Y is HFP | from 55:45 to 60:40 | from 1.5 to 2% |
| E4 | X is TrFE, Y is HFP | from 55:45 to 60:40 | from 2 to 2.5% |
| E5 | X is TrFE, Y is HFP | from 55:45 to 60:40 | from 2.5 to 3% |
| E6 | X is TrFE, Y is HFP | from 55:45 to 60:40 | from 3 to 3.5% |
| E7 | X is TrFE, Y is HFP | from 55:45 to 60:40 | from 3.5 to 4% |
| E8 | X is TrFE, Y is HFP | from 55:45 to 60:40 | from 4 to 4.5% |
| E9 | X is TrFE, Y is HFP | from 55:45 to 60:40 | from 4.5 to 5% |
| E10 | X is TrFE, Y is HFP | from 55:45 to 60:40 | from 5 to 5.5% |
| E11 | X is TrFE, Y is HFP | from 55:45 to 60:40 | from 5.5 to 6% |
| E12 | X is TrFE, Y is HFP | from 55:45 to 60:40 | from 6 to 6.5% |
| E13 | X is TrFE, Y is HFP | from 60:40 to 65:35 | from 0.5 to 1% |
| E14 | X is TrFE, Y is HFP | from 60:40 to 65:35 | from 1 to 1.5% |
| E15 | X is TrFE, Y is HFP | from 60:40 to 65:35 | from 1.5 to 2% |
| E16 | X is TrFE, Y is HFP | from 60:40 to 65:35 | from 2 to 2.5% |
| E17 | X is TrFE, Y is HFP | from 60:40 to 65:35 | from 2.5 to 3% |
| E18 | X is TrFE, Y is HFP | from 60:40 to 65:35 | from 3 to 3.5% |
| E19 | X is TrFE, Y is HFP | from 60:40 to 65:35 | from 3.5 to 4% |
| E20 | X is TrFE, Y is HFP | from 60:40 to 65:35 | from 4 to 4.5% |
| E21 | X is TrFE, Y is HFP | from 60:40 to 65:35 | from 4.5 to 5% |
| E22 | X is TrFE, Y is HFP | from 60:40 to 65:35 | from 5 to 5.5% |
| E23 | X is TrFE, Y is HFP | from 60:40 to 65:35 | from 5.5 to 6% |
| E24 | X is TrFE, Y is HFP | from 60:40 to 65:35 | from 6 to 6.5% |
| E25 | X is TrFE, Y is HFP | from 65:35 to 70:30 | from 0.5 to 1% |
| E26 | X is TrFE, Y is HFP | from 65:35 to 70:30 | from 1 to 1.5% |
| E27 | X is TrFE, Y is HFP | from 65:35 to 70:30 | from 1.5 to 2% |
| E28 | X is TrFE, Y is HFP | from 65:35 to 70:30 | from 2 to 2.5% |
| E29 | X is TrFE, Y is HFP | from 65:35 to 70:30 | from 2.5 to 3% |
| E30 | X is TrFE, Y is HFP | from 65:35 to 70:30 | from 3 to 3.5% |
| E31 | X is TrFE, Y is HFP | from 65:35 to 70:30 | from 3.5 to 4% |
| E32 | X is TrFE, Y is HFP | from 65:35 to 70:30 | from 4 to 4.5% |
| E33 | X is TrFE, Y is HFP | from 65:35 to 70:30 | from 4.5 to 5% |
| E34 | X is TrFE, Y is HFP | from 65:35 to 70:30 | from 5 to 5.5% |
| E35 | X is TrFE, Y is HFP | from 65:35 to 70:30 | from 5.5 to 6% |
| E36 | X is TrFE, Y is HFP | from 65:35 to 70:30 | from 6 to 6.5% |
| E37 | X is TrFE, Y is HFP | from 70:30 to 75:25 | from 0.5 to 1% |
| E38 | X is TrFE, Y is HFP | from 70:30 to 75:25 | from 1 to 1.5% |
| E39 | X is TrFE, Y is HFP | from 70:30 to 75:25 | from 1.5 to 2% |
| E40 | X is TrFE, Y is HFP | from 70:30 to 75:25 | from 2 to 2.5% |
| E41 | X is TrFE, Y is HFP | from 70:30 to 75:25 | from 2.5 to 3% |
| E42 | X is TrFE, Y is HFP | from 70:30 to 75:25 | from 3 to 3.5% |
| E43 | X is TrFE, Y is HFP | from 70:30 to 75:25 | from 3.5 to 4% |
| E44 | X is TrFE, Y is HFP | from 70:30 to 75:25 | from 4 to 4.5% |
| E45 | X is TrFE, Y is HFP | from 70:30 to 75:25 | from 4.5 to 5% |
| E46 | X is TrFE, Y is HFP | from 70:30 to 75:25 | from 5 to 5.5% |
| E47 | X is TrFE, Y is HFP | from 70:30 to 75:25 | from 5.5 to 6% |
| E48 | X is TrFE, Y is HFP | from 70:30 to 75:25 | from 6 to 6.5% |
| E49 | X is TrFE, Y is HFP | from 75:25 to 80:20 | from 0.5 to 1% |
| E50 | X is TrFE, Y is HFP | from 75:25 to 80:20 | from 1 to 1.5% |
| E51 | X is TrFE, Y is HFP | from 75:25 to 80:20 | from 1.5 to 2% |
| E52 | X is TrFE, Y is HFP | from 75:25 to 80:20 | from 2 to 2.5% |
| E53 | X is TrFE, Y is HFP | from 75:25 to 80:20 | from 2.5 to 3% |
| E54 | X is TrFE, Y is HFP | from 75:25 to 80:20 | from 3 to 3.5% |
| E55 | X is TrFE, Y is HFP | from 75:25 to 80:20 | from 3.5 to 4% |
| E56 | X is TrFE, Y is HFP | from 75:25 to 80:20 | from 4 to 4.5% |
| E57 | X is TrFE, Y is HFP | from 75:25 to 80:20 | from 4.5 to 5% |
| E58 | X is TrFE, Y is HFP | from 75:25 to 80:20 | from 5 to 5.5% |
| E59 | X is TrFE, Y is HFP | from 75:25 to 80:20 | from 5.5 to 6% |
| E60 | X is TrFE, Y is HFP | from 75:25 to 80:20 | from 6 to 6.5% |
| F1 | X is TFE, Y is HFP | from 55:45 to 60:40 | from 0.5 to 1% |
| F2 | X is TFE, Y is HFP | from 55:45 to 60:40 | from 1 to 1.5% |
| F3 | X is TFE, Y is HFP | from 55:45 to 60:40 | from 1.5 to 2% |
| F4 | X is TFE, Y is HFP | from 55:45 to 60:40 | from 2 to 2.5% |
| F5 | X is TFE, Y is HFP | from 55:45 to 60:40 | from 2.5 to 3% |
| F6 | X is TFE, Y is HFP | from 55:45 to 60:40 | from 3 to 3.5% |
| F7 | X is TFE, Y is HFP | from 55:45 to 60:40 | from 3.5 to 4% |
| F8 | X is TFE, Y is HFP | from 55:45 to 60:40 | from 4 to 4.5% |
| F9 | X is TFE, Y is HFP | from 55:45 to 60:40 | from 4.5 to 5% |
| F10 | X is TFE, Y is HFP | from 55:45 to 60:40 | from 5 to 5.5% |
| F11 | X is TFE, Y is HFP | from 55:45 to 60:40 | from 5.5 to 6% |
| F12 | X is TFE, Y is HFP | from 55:45 to 60:40 | from 6 to 6.5% |
| F13 | X is TFE, Y is HFP | from 60:40 to 65:35 | from 0.5 to 1% |
| F14 | X is TFE, Y is HFP | from 60:40 to 65:35 | from 1 to 1.5% |
| F15 | X is TFE, Y is HFP | from 60:40 to 65:35 | from 1.5 to 2% |
| F16 | X is TFE, Y is HFP | from 60:40 to 65:35 | from 2 to 2.5% |
| F17 | X is TFE, Y is HFP | from 60:40 to 65:35 | from 2.5 to 3% |
| F18 | X is TFE, Y is HFP | from 60:40 to 65:35 | from 3 to 3.5% |
| F19 | X is TFE, Y is HFP | from 60:40 to 65:35 | from 3.5 to 4% |
| F20 | X is TFE, Y is HFP | from 60:40 to 65:35 | from 4 to 4.5% |
| F21 | X is TFE, Y is HFP | from 60:40 to 65:35 | from 4.5 to 5% |
| F22 | X is TFE, Y is HFP | from 60:40 to 65:35 | from 5 to 5.5% |
| F23 | X is TFE, Y is HFP | from 60:40 to 65:35 | from 5.5 to 6% |
| F24 | X is TFE, Y is HFP | from 60:40 to 65:35 | from 6 to 6.5% |
| F25 | X is TFE, Y is HFP | from 65:35 to 70:30 | from 0.5 to 1% |
| F26 | X is TFE, Y is HFP | from 65:35 to 70:30 | from 1 to 1.5% |
| F27 | X is TFE, Y is HFP | from 65:35 to 70:30 | from 1.5 to 2% |
| F28 | X is TFE, Y is HFP | from 65:35 to 70:30 | from 2 to 2.5% |
| F29 | X is TFE, Y is HFP | from 65:35 to 70:30 | from 2.5 to 3% |
| F30 | X is TFE, Y is HFP | from 65:35 to 70:30 | from 3 to 3.5% |
| F31 | X is TFE, Y is HFP | from 65:35 to 70:30 | from 3.5 to 4% |
| F32 | X is TFE, Y is HFP | from 65:35 to 70:30 | from 4 to 4.5% |
| F33 | X is TFE, Y is HFP | from 65:35 to 70:30 | from 4.5 to 5% |
| F34 | X is TFE, Y is HFP | from 65:35 to 70:30 | from 5 to 5.5% |
| F35 | X is TFE, Y is HFP | from 65:35 to 70:30 | from 5.5 to 6% |
| F36 | X is TFE, Y is HFP | from 65:35 to 70:30 | from 6 to 6.5% |
| F37 | X is TFE, Y is HFP | from 70:30 to 75:25 | from 0.5 to 1% |
| F38 | X is TFE, Y is HFP | from 70:30 to 75:25 | from 1 to 1.5% |
| F39 | X is TFE, Y is HFP | from 70:30 to 75:25 | from 1.5 to 2% |
| F40 | X is TFE, Y is HFP | from 70:30 to 75:25 | from 2 to 2.5% |
| F41 | X is TFE, Y is HFP | from 70:30 to 75:25 | from 2.5 to 3% |
| F42 | X is TFE, Y is HFP | from 70:30 to 75:25 | from 3 to 3.5% |
| F43 | X is TFE, Y is HFP | from 70:30 to 75:25 | from 3.5 to 4% |
| F44 | X is TFE, Y is HFP | from 70:30 to 75:25 | from 4 to 4.5% |
| F45 | X is TFE, Y is HFP | from 70:30 to 75:25 | from 4.5 to 5% |
| F46 | X is TFE, Y is HFP | from 70:30 to 75:25 | from 5 to 5.5% |
| F47 | X is TFE, Y is HFP | from 70:30 to 75:25 | from 5.5 to 6% |
| F48 | X is TFE, Y is HFP | from 70:30 to 75:25 | from 6 to 6.5% |
| F49 | X is TFE, Y is HFP | from 75:25 to 80:20 | from 0.5 to 1% |
| F50 | X is TFE, Y is HFP | from 75:25 to 80:20 | from 1 to 1.5% |
| F51 | X is TFE, Y is HFP | from 75:25 to 80:20 | from 1.5 to 2% |
| F52 | X is TFE, Y is HFP | from 75:25 to 80:20 | from 2 to 2.5% |
| F53 | X is TFE, Y is HFP | from 75:25 to 80:20 | from 2.5 to 3% |
| F54 | X is TFE, Y is HFP | from 75:25 to 80:20 | from 3 to 3.5% |
| F55 | X is TFE, Y is HFP | from 75:25 to 80:20 | from 3.5 to 4% |
| F56 | X is TFE, Y is HFP | from 75:25 to 80:20 | from 4 to 4.5% |
| F57 | X is TFE, Y is HFP | from 75:25 to 80:20 | from 4.5 to 5% |
| F58 | X is TFE, Y is HFP | from 75:25 to 80:20 | from 5 to 5.5% |
| F59 | X is TFE, Y is HFP | from 75:25 to 80:20 | from 5.5 to 6% |
| F60 | X is TFE, Y is HFP | from 75:25 to 80:20 | from 6 to 6.5% |
| G1 | X is TrFE, Y is VF | from 55:45 to 60:40 | from 0.5 to 1% |
| G2 | X is TrFE, Y is VF | from 55:45 to 60:40 | from 1 to 1.5% |
| G3 | X is TrFE, Y is VF | from 55:45 to 60:40 | from 1.5 to 2% |
| G4 | X is TrFE, Y is VF | from 55:45 to 60:40 | from 2 to 2.5% |
| G5 | X is TrFE, Y is VF | from 55:45 to 60:40 | from 2.5 to 3% |
| G6 | X is TrFE, Y is VF | from 55:45 to 60:40 | from 3 to 3.5% |
| G7 | X is TrFE, Y is VF | from 55:45 to 60:40 | from 3.5 to 4% |
| G8 | X is TrFE, Y is VF | from 55:45 to 60:40 | from 4 to 4.5% |
| G9 | X is TrFE, Y is VF | from 55:45 to 60:40 | from 4.5 to 5% |
| G10 | X is TrFE, Y is VF | from 55:45 to 60:40 | from 5 to 5.5% |
| G11 | X is TrFE, Y is VF | from 55:45 to 60:40 | from 5.5 to 6% |
| G12 | X is TrFE, Y is VF | from 55:45 to 60:40 | from 6 to 6.5% |
| G13 | X is TrFE, Y is VF | from 60:40 to 65:35 | from 0.5 to 1% |
| G14 | X is TrFE, Y is VF | from 60:40 to 65:35 | from 1 to 1.5% |
| G15 | X is TrFE, Y is VF | from 60:40 to 65:35 | from 1.5 to 2% |
| G16 | X is TrFE, Y is VF | from 60:40 to 65:35 | from 2 to 2.5% |
| G17 | X is TrFE, Y is VF | from 60:40 to 65:35 | from 2.5 to 3% |
| G18 | X is TrFE, Y is VF | from 60:40 to 65:35 | from 3 to 3.5% |
| G19 | X is TrFE, Y is VF | from 60:40 to 65:35 | from 3.5 to 4% |
| G20 | X is TrFE, Y is VF | from 60:40 to 65:35 | from 4 to 4.5% |
| G21 | X is TrFE, Y is VF | from 60:40 to 65:35 | from 4.5 to 5% |
| G22 | X is TrFE, Y is VF | from 60:40 to 65:35 | from 5 to 5.5% |
| G23 | X is TrFE, Y is VF | from 60:40 to 65:35 | from 5.5 to 6% |
| G24 | X is TrFE, Y is VF | from 60:40 to 65:35 | from 6 to 6.5% |
| G25 | X is TrFE, Y is VF | from 65:35 to 70:30 | from 0.5 to 1% |
| G26 | X is TrFE, Y is VF | from 65:35 to 70:30 | from 1 to 1.5% |
| G27 | X is TrFE, Y is VF | from 65:35 to 70:30 | from 1.5 to 2% |

| Polymer No. | Nature of the starting monomers | VDF:X ratio | Content of Y |
| --- | --- | --- | --- |
| G28 | X is TrFE, Y is VF | from 65:35 to 70:30 | from 2 to 2.5% |
| G29 | X is TrFE, Y is VF | from 65:35 to 70:30 | from 2.5 to 3% |
| G30 | X is TrFE, Y is VF | from 65:35 to 70:30 | from 3 to 3.5% |
| G31 | X is TrFE, Y is VF | from 65:35 to 70:30 | from 3.5 to 4% |
| G32 | X is TrFE, Y is VF | from 65:35 to 70:30 | from 4 to 4.5% |
| G33 | X is TrFE, Y is VF | from 65:35 to 70:30 | from 4.5 to 5% |
| G34 | X is TrFE, Y is VF | from 65:35 to 70:30 | from 5 to 5.5% |
| G35 | X is TrFE, Y is VF | from 65:35 to 70:30 | from 5.5 to 6% |
| G36 | X is TrFE, Y is VF | from 65:35 to 70:30 | from 6 to 6.5% |
| G37 | X is TrFE, Y is VF | from 70:30 to 75:25 | from 0.5 to 1% |
| G38 | X is TrFE, Y is VF | from 70:30 to 75:25 | from 1 to 1.5% |
| G39 | X is TrFE, Y is VF | from 70:30 to 75:25 | from 1.5 to 2% |
| G40 | X is TrFE, Y is VF | from 70:30 to 75:25 | from 2 to 2.5% |
| G41 | X is TrFE, Y is VF | from 70:30 to 75:25 | from 2.5 to 3% |
| G42 | X is TrFE, Y is VF | from 70:30 to 75:25 | from 3 to 3.5% |
| G43 | X is TrFE, Y is VF | from 70:30 to 75:25 | from 3.5 to 4% |
| G44 | X is TrFE, Y is VF | from 70:30 to 75:25 | from 4 to 4.5% |
| G45 | X is TrFE, Y is VF | from 70:30 to 75:25 | from 4.5 to 5% |
| G46 | X is TrFE, Y is VF | from 70:30 to 75:25 | from 5 to 5.5% |
| G47 | X is TrFE, Y is VF | from 70:30 to 75:25 | from 5.5 to 6% |
| G48 | X is TrFE, Y is VF | from 70:30 to 75:25 | from 6 to 6.5% |
| G49 | X is TrFE, Y is VF | from 75:25 to 80:20 | from 0.5 to 1% |
| G50 | X is TrFE, Y is VF | from 75:25 to 80:20 | from 1 to 1.5% |
| G51 | X is TrFE, Y is VF | from 75:25 to 80:20 | from 1.5 to 2% |
| G52 | X is TrFE, Y is VF | from 75:25 to 80:20 | from 2 to 2.5% |
| G53 | X is TrFE, Y is VF | from 75:25 to 80:20 | from 2.5 to 3% |
| G54 | X is TrFE, Y is VF | from 75:25 to 80:20 | from 3 to 3.5% |
| G55 | X is TrFE, Y is VF | from 75:25 to 80:20 | from 3.5 to 4% |
| G56 | X is TrFE, Y is VF | from 75:25 to 80:20 | from 4 to 4.5% |
| G57 | X is TrFE, Y is VF | from 75:25 to 80:20 | from 4.5 to 5% |
| G58 | X is TrFE, Y is VF | from 75:25 to 80:20 | from 5 to 5.5% |
| G59 | X is TrFE, Y is VF | from 75:25 to 80:20 | from 5.5 to 6% |
| G60 | X is TrFE, Y is VF | from 75:25 to 80:20 | from 6 to 6.5% |
| H1 | X is TFE, Y is VF | from 55:45 to 60:40 | from 0.5 to 1% |
| H2 | X is TFE, Y is VF | from 55:45 to 60:40 | from 1 to 1.5% |
| H3 | X is TFE, Y is VF | from 55:45 to 60:40 | from 1.5 to 2% |
| H4 | X is TFE, Y is VF | from 55:45 to 60:40 | from 2 to 2.5% |
| H5 | X is TFE, Y is VF | from 55:45 to 60:40 | from 2.5 to 3% |
| H6 | X is TFE, Y is VF | from 55:45 to 60:40 | from 3 to 3.5% |
| H7 | X is TFE, Y is VF | from 55:45 to 60:40 | from 3.5 to 4% |
| H8 | X is TFE, Y is VF | from 55:45 to 60:40 | from 4 to 4.5% |
| H9 | X is TFE, Y is VF | from 55:45 to 60:40 | from 4.5 to 5% |
| H10 | X is TFE, Y is VF | from 55:45 to 60:40 | from 5 to 5.5% |
| H11 | X is TFE, Y is VF | from 55:45 to 60:40 | from 5.5 to 6% |
| H12 | X is TFE, Y is VF | from 55:45 to 60:40 | from 6 to 6.5% |
| H13 | X is TFE, Y is VF | from 60:40 to 65:35 | from 0.5 to 1% |
| H14 | X is TFE, Y is VF | from 60:40 to 65:35 | from 1 to 1.5% |
| H15 | X is TFE, Y is VF | from 60:40 to 65:35 | from 1.5 to 2% |
| H16 | X is TFE, Y is VF | from 60:40 to 65:35 | from 2 to 2.5% |
| H17 | X is TFE, Y is VF | from 60:40 to 65:35 | from 2.5 to 3% |
| H18 | X is TFE, Y is VF | from 60:40 to 65:35 | from 3 to 3.5% |
| H19 | X is TFE, Y is VF | from 60:40 to 65:35 | from 3.5 to 4% |
| H20 | X is TFE, Y is VF | from 60:40 to 65:35 | from 4 to 4.5% |
| H21 | X is TFE, Y is VF | from 60:40 to 65:35 | from 4.5 to 5% |
| H22 | X is TFE, Y is VF | from 60:40 to 65:35 | from 5 to 5.5% |
| H23 | X is TFE, Y is VF | from 60:40 to 65:35 | from 5.5 to 6% |
| H24 | X is TFE, Y is VF | from 60:40 to 65:35 | from 6 to 6.5% |
| H25 | X is TFE, Y is VF | from 65:35 to 70:30 | from 0.5 to 1% |
| H26 | X is TFE, Y is VF | from 65:35 to 70:30 | from 1 to 1.5% |
| H27 | X is TFE, Y is VF | from 65:35 to 70:30 | from 1.5 to 2% |
| H28 | X is TFE, Y is VF | from 65:35 to 70:30 | from 2 to 2.5% |
| H29 | X is TFE, Y is VF | from 65:35 to 70:30 | from 2.5 to 3% |
| H30 | X is TFE, Y is VF | from 65:35 to 70:30 | from 3 to 3.5% |
| H31 | X is TFE, Y is VF | from 65:35 to 70:30 | from 3.5 to 4% |
| H32 | X is TFE, Y is VF | from 65:35 to 70:30 | from 4 to 4.5% |
| H33 | X is TFE, Y is VF | from 65:35 to 70:30 | from 4.5 to 5% |
| H34 | X is TFE, Y is VF | from 65:35 to 70:30 | from 5 to 5.5% |
| H35 | X is TFE, Y is VF | from 65:35 to 70:30 | from 5.5 to 6% |
| H36 | X is TFE, Y is VF | from 65:35 to 70:30 | from 6 to 6.5% |
| H37 | X is TFE, Y is VF | from 70:30 to 75:25 | from 0.5 to 1% |
| H38 | X is TFE, Y is VF | from 70:30 to 75:25 | from 1 to 1.5% |
| H39 | X is TFE, Y is VF | from 70:30 to 75:25 | from 1.5 to 2% |
| H40 | X is TFE, Y is VF | from 70:30 to 75:25 | from 2 to 2.5% |
| H41 | X is TFE, Y is VF | from 70:30 to 75:25 | from 2.5 to 3% |
| H42 | X is TFE, Y is VF | from 70:30 to 75:25 | from 3 to 3.5% |
| H43 | X is TFE, Y is VF | from 70:30 to 75:25 | from 3.5 to 4% |
| H44 | X is TFE, Y is VF | from 70:30 to 75:25 | from 4 to 4.5% |
| H45 | X is TFE, Y is VF | from 70:30 to 75:25 | from 4.5 to 5% |
| H46 | X is TFE, Y is VF | from 70:30 to 75:25 | from 5 to 5.5% |
| H47 | X is TFE, Y is VF | from 70:30 to 75:25 | from 5.5 to 6% |
| H48 | X is TFE, Y is VF | from 70:30 to 75:25 | from 6 to 6.5% |
| H49 | X is TFE, Y is VF | from 75:25 to 80:20 | from 0.5 to 1% |
| H50 | X is TFE, Y is VF | from 75:25 to 80:20 | from 1 to 1.5% |
| H51 | X is TFE, Y is VF | from 75:25 to 80:20 | from 1.5 to 2% |
| H52 | X is TFE, Y is VF | from 75:25 to 80:20 | from 2 to 2.5% |
| H53 | X is TFE, Y is VF | from 75:25 to 80:20 | from 2.5 to 3% |
| H54 | X is TFE, Y is VF | from 75:25 to 80:20 | from 3 to 3.5% |
| H55 | X is TFE, Y is VF | from 75:25 to 80:20 | from 3.5 to 4% |
| H56 | X is TFE, Y is VF | from 75:25 to 80:20 | from 4 to 4.5% |
| H57 | X is TFE, Y is VF | from 75:25 to 80:20 | from 4.5 to 5% |
| H58 | X is TFE, Y is VF | from 75:25 to 80:20 | from 5 to 5.5% |
| H59 | X is TFE, Y is VF | from 75:25 to 80:20 | from 5.5 to 6% |
| H60 | X is TFE, Y is VF | from 75:25 to 80:20 | from 6 to 6.5% |
| I1 | X is TrFE, Y is 1234yf | from 55:45 to 60:40 | from 0.5 to 1% |
| I2 | X is TrFE, Y is 1234yf | from 55:45 to 60:40 | from 1 to 1.5% |
| I3 | X is TrFE, Y is 1234yf | from 55:45 to 60:40 | from 1.5 to 2% |
| I4 | X is TrFE, Y is 1234yf | from 55:45 to 60:40 | from 2 to 2.5% |
| I5 | X is TrFE, Y is 1234yf | from 55:45 to 60:40 | from 2.5 to 3% |
| I6 | X is TrFE, Y is 1234yf | from 55:45 to 60:40 | from 3 to 3.5% |
| I7 | X is TrFE, Y is 1234yf | from 55:45 to 60:40 | from 3.5 to 4% |
| I8 | X is TrFE, Y is 1234yf | from 55:45 to 60:40 | from 4 to 4.5% |
| I9 | X is TrFE, Y is 1234yf | from 55:45 to 60:40 | from 4.5 to 5% |
| I10 | X is TrFE, Y is 1234yf | from 55:45 to 60:40 | from 5 to 5.5% |
| I11 | X is TrFE, Y is 1234yf | from 55:45 to 60:40 | from 5.5 to 6% |
| I12 | X is TrFE, Y is 1234yf | from 55:45 to 60:40 | from 6 to 6.5% |
| I13 | X is TrFE, Y is 1234yf | from 60:40 to 65:35 | from 0.5 to 1% |
| I14 | X is TrFE, Y is 1234yf | from 60:40 to 65:35 | from 1 to 1.5% |
| I15 | X is TrFE, Y is 1234yf | from 60:40 to 65:35 | from 1.5 to 2% |
| I16 | X is TrFE, Y is 1234yf | from 60:40 to 65:35 | from 2 to 2.5% |
| I17 | X is TrFE, Y is 1234yf | from 60:40 to 65:35 | from 2.5 to 3% |
| I18 | X is TrFE, Y is 1234yf | from 60:40 to 65:35 | from 3 to 3.5% |
| I19 | X is TrFE, Y is 1234yf | from 60:40 to 65:35 | from 3.5 to 4% |
| I20 | X is TrFE, Y is 1234yf | from 60:40 to 65:35 | from 4 to 4.5% |
| I21 | X is TrFE, Y is 1234yf | from 60:40 to 65:35 | from 4.5 to 5% |
| I22 | X is TrFE, Y is 1234yf | from 60:40 to 65:35 | from 5 to 5.5% |
| I23 | X is TrFE, Y is 1234yf | from 60:40 to 65:35 | from 5.5 to 6% |
| I24 | X is TrFE, Y is 1234yf | from 60:40 to 65:35 | from 6 to 6.5% |
| I25 | X is TrFE, Y is 1234yf | from 65:35 to 70:30 | from 0.5 to 1% |
| I26 | X is TrFE, Y is 1234yf | from 65:35 to 70:30 | from 1 to 1.5% |
| I27 | X is TrFE, Y is 1234yf | from 65:35 to 70:30 | from 1.5 to 2% |
| I28 | X is TrFE, Y is 1234yf | from 65:35 to 70:30 | from 2 to 2.5% |
| I29 | X is TrFE, Y is 1234yf | from 65:35 to 70:30 | from 2.5 to 3% |
| I30 | X is TrFE, Y is 1234yf | from 65:35 to 70:30 | from 3 to 3.5% |
| I31 | X is TrFE, Y is 1234yf | from 65:35 to 70:30 | from 3.5 to 4% |
| I32 | X is TrFE, Y is 1234yf | from 65:35 to 70:30 | from 4 to 4.5% |
| I33 | X is TrFE, Y is 1234yf | from 65:35 to 70:30 | from 4.5 to 5% |
| I34 | X is TrFE, Y is 1234yf | from 65:35 to 70:30 | from 5 to 5.5% |
| I35 | X is TrFE, Y is 1234yf | from 65:35 to 70:30 | from 5.5 to 6% |
| I36 | X is TrFE, Y is 1234yf | from 65:35 to 70:30 | from 6 to 6.5% |
| I37 | X is TrFE, Y is 1234yf | from 70:30 to 75:25 | from 0.5 to 1% |
| I38 | X is TrFE, Y is 1234yf | from 70:30 to 75:25 | from 1 to 1.5% |
| I39 | X is TrFE, Y is 1234yf | from 70:30 to 75:25 | from 1.5 to 2% |
| I40 | X is TrFE, Y is 1234yf | from 70:30 to 75:25 | from 2 to 2.5% |
| I41 | X is TrFE, Y is 1234yf | from 70:30 to 75:25 | from 2.5 to 3% |
| I42 | X is TrFE, Y is 1234yf | from 70:30 to 75:25 | from 3 to 3.5% |
| I43 | X is TrFE, Y is 1234yf | from 70:30 to 75:25 | from 3.5 to 4% |
| I44 | X is TrFE, Y is 1234yf | from 70:30 to 75:25 | from 4 to 4.5% |
| I45 | X is TrFE, Y is 1234yf | from 70:30 to 75:25 | from 4.5 to 5% |
| I46 | X is TrFE, Y is 1234yf | from 70:30 to 75:25 | from 5 to 5.5% |
| I47 | X is TrFE, Y is 1234yf | from 70:30 to 75:25 | from 5.5 to 6% |
| I48 | X is TrFE, Y is 1234yf | from 70:30 to 75:25 | from 6 to 6.5% |
| I49 | X is TrFE, Y is 1234yf | from 75:25 to 80:20 | from 0.5 to 1% |
| I50 | X is TrFE, Y is 1234yf | from 75:25 to 80:20 | from 1 to 1.5% |
| I51 | X is TrFE, Y is 1234yf | from 75:25 to 80:20 | from 1.5 to 2% |
| I52 | X is TrFE, Y is 1234yf | from 75:25 to 80:20 | from 2 to 2.5% |
| I53 | X is TrFE, Y is 1234yf | from 75:25 to 80:20 | from 2.5 to 3% |
| I54 | X is TrFE, Y is 1234yf | from 75:25 to 80:20 | from 3 to 3.5% |
| I55 | X is TrFE, Y is 1234yf | from 75:25 to 80:20 | from 3.5 to 4% |
| I56 | X is TrFE, Y is 1234yf | from 75:25 to 80:20 | from 4 to 4.5% |
| I57 | X is TrFE, Y is 1234yf | from 75:25 to 80:20 | from 4.5 to 5% |
| I58 | X is TrFE, Y is 1234yf | from 75:25 to 80:20 | from 5 to 5.5% |
| I59 | X is TrFE, Y is 1234yf | from 75:25 to 80:20 | from 5.5 to 6% |

-continued

| Polymer No. | Nature of the starting monomers | VDF:X ratio | Content of Y |
|---|---|---|---|
| I60 | X is TrFE, Y is 1234yf | from 75:25 to 80:20 | from 6 to 6.5% |
| J1 | X is TFE, Y is 1234yf | from 55:45 to 60:40 | from 0.5 to 1% |
| J2 | X is TFE, Y is 1234yf | from 55:45 to 60:40 | from 1 to 1.5% |
| J3 | X is TFE, Y is 1234yf | from 55:45 to 60:40 | from 1.5 to 2% |
| J4 | X is TFE, Y is 1234yf | from 55:45 to 60:40 | from 2 to 2.5% |
| J5 | X is TFE, Y is 1234yf | from 55:45 to 60:40 | from 2.5 to 3% |
| J6 | X is TFE, Y is 1234yf | from 55:45 to 60:40 | from 3 to 3.5% |
| J7 | X is TFE, Y is 1234yf | from 55:45 to 60:40 | from 3.5 to 4% |
| J8 | X is TFE, Y is 1234yf | from 55:45 to 60:40 | from 4 to 4.5% |
| J9 | X is TFE, Y is 1234yf | from 55:45 to 60:40 | from 4.5 to 5% |
| J10 | X is TFE, Y is 1234yf | from 55:45 to 60:40 | from 5 to 5.5% |
| J11 | X is TFE, Y is 1234yf | from 55:45 to 60:40 | from 5.5 to 6% |
| J12 | X is TFE, Y is 1234yf | from 55:45 to 60:40 | from 6 to 6.5% |
| J13 | X is TFE, Y is 1234yf | from 60:40 to 65:35 | from 0.5 to 1% |
| J14 | X is TFE, Y is 1234yf | from 60:40 to 65:35 | from 1 to 1.5% |
| J15 | X is TFE, Y is 1234yf | from 60:40 to 65:35 | from 1.5 to 2% |
| J16 | X is TFE, Y is 1234yf | from 60:40 to 65:35 | from 2 to 2.5% |
| J17 | X is TFE, Y is 1234yf | from 60:40 to 65:35 | from 2.5 to 3% |
| J18 | X is TFE, Y is 1234yf | from 60:40 to 65:35 | from 3 to 3.5% |
| J19 | X is TFE, Y is 1234yf | from 60:40 to 65:35 | from 3.5 to 4% |
| J20 | X is TFE, Y is 1234yf | from 60:40 to 65:35 | from 4 to 4.5% |
| J21 | X is TFE, Y is 1234yf | from 60:40 to 65:35 | from 4.5 to 5% |
| J22 | X is TFE, Y is 1234yf | from 60:40 to 65:35 | from 5 to 5.5% |
| J23 | X is TFE, Y is 1234yf | from 60:40 to 65:35 | from 5.5 to 6% |
| J24 | X is TFE, Y is 1234yf | from 60:40 to 65:35 | from 6 to 6.5% |
| J25 | X is TFE, Y is 1234yf | from 65:35 to 70:30 | from 0.5 to 1% |
| J26 | X is TFE, Y is 1234yf | from 65:35 to 70:30 | from 1 to 1.5% |
| J27 | X is TFE, Y is 1234yf | from 65:35 to 70:30 | from 1.5 to 2% |
| J28 | X is TFE, Y is 1234yf | from 65:35 to 70:30 | from 2 to 2.5% |
| J29 | X is TFE, Y is 1234yf | from 65:35 to 70:30 | from 2.5 to 3% |
| J30 | X is TFE, Y is 1234yf | from 65:35 to 70:30 | from 3 to 3.5% |
| J31 | X is TFE, Y is 1234yf | from 65:35 to 70:30 | from 3.5 to 4% |
| J32 | X is TFE, Y is 1234yf | from 65:35 to 70:30 | from 4 to 4.5% |
| J33 | X is TFE, Y is 1234yf | from 65:35 to 70:30 | from 4.5 to 5% |
| J34 | X is TFE, Y is 1234yf | from 65:35 to 70:30 | from 5 to 5.5% |
| J35 | X is TFE, Y is 1234yf | from 65:35 to 70:30 | from 5.5 to 6% |
| J36 | X is TFE, Y is 1234yf | from 65:35 to 70:30 | from 6 to 6.5% |
| J37 | X is TFE, Y is 1234yf | from 70:30 to 75:25 | from 0.5 to 1% |
| J38 | X is TFE, Y is 1234yf | from 70:30 to 75:25 | from 1 to 1.5% |
| J39 | X is TFE, Y is 1234yf | from 70:30 to 75:25 | from 1.5 to 2% |
| J40 | X is TFE, Y is 1234yf | from 70:30 to 75:25 | from 2 to 2.5% |
| J41 | X is TFE, Y is 1234yf | from 70:30 to 75:25 | from 2.5 to 3% |
| J42 | X is TFE, Y is 1234yf | from 70:30 to 75:25 | from 3 to 3.5% |
| J43 | X is TFE, Y is 1234yf | from 70:30 to 75:25 | from 3.5 to 4% |
| J44 | X is TFE, Y is 1234yf | from 70:30 to 75:25 | from 4 to 4.5% |
| J45 | X is TFE, Y is 1234yf | from 70:30 to 75:25 | from 4.5 to 5% |
| J46 | X is TFE, Y is 1234yf | from 70:30 to 75:25 | from 5 to 5.5% |
| J47 | X is TFE, Y is 1234yf | from 70:30 to 75:25 | from 5.5 to 6% |
| J48 | X is TFE, Y is 1234yf | from 70:30 to 75:25 | from 6 to 6.5% |
| J49 | X is TFE, Y is 1234yf | from 75:25 to 80:20 | from 0.5 to 1% |
| J50 | X is TFE, Y is 1234yf | from 75:25 to 80:20 | from 1 to 1.5% |
| J51 | X is TFE, Y is 1234yf | from 75:25 to 80:20 | from 1.5 to 2% |
| J52 | X is TFE, Y is 1234yf | from 75:25 to 80:20 | from 2 to 2.5% |
| J53 | X is TFE, Y is 1234yf | from 75:25 to 80:20 | from 2.5 to 3% |
| J54 | X is TFE, Y is 1234yf | from 75:25 to 80:20 | from 3 to 3.5% |
| J55 | X is TFE, Y is 1234yf | from 75:25 to 80:20 | from 3.5 to 4% |
| J56 | X is TFE, Y is 1234yf | from 75:25 to 80:20 | from 4 to 4.5% |
| J57 | X is TFE, Y is 1234yf | from 75:25 to 80:20 | from 4.5 to 5% |
| J58 | X is TFE, Y is 1234yf | from 75:25 to 80:20 | from 5 to 5.5% |
| J59 | X is TFE, Y is 1234yf | from 75:25 to 80:20 | from 5.5 to 6% |
| J60 | X is TFE, Y is 1234yf | from 75:25 to 80:20 | from 6 to 6.5% |
| K1 | X is TrFE, Y is CBrF=CF2 | from 55:45 to 60:40 | from 0.5 to 1% |
| K2 | X is TrFE, Y is CBrF=CF2 | from 55:45 to 60:40 | from 1 to 1.5% |
| K3 | X is TrFE, Y is CBrF=CF2 | from 55:45 to 60:40 | from 1.5 to 2% |
| K4 | X is TrFE, Y is CBrF=CF2 | from 55:45 to 60:40 | from 2 to 2.5% |
| K5 | X is TrFE, Y is CBrF=CF2 | from 55:45 to 60:40 | from 2.5 to 3% |
| K6 | X is TrFE, Y is CBrF=CF2 | from 55:45 to 60:40 | from 3 to 3.5% |
| K7 | X is TrFE, Y is CBrF=CF2 | from 55:45 to 60:40 | from 3.5 to 4% |
| K8 | X is TrFE, Y is CBrF=CF2 | from 55:45 to 60:40 | from 4 to 4.5% |
| K9 | X is TrFE, Y is CBrF=CF2 | from 55:45 to 60:40 | from 4.5 to 5% |
| K10 | X is TrFE, Y is CBrF=CF2 | from 55:45 to 60:40 | from 5 to 5.5% |
| K11 | X is TrFE, Y is CBrF=CF2 | from 55:45 to 60:40 | from 5.5 to 6% |
| K12 | X is TrFE, Y is CBrF=CF2 | from 55:45 to 60:40 | from 6 to 6.5% |
| K13 | X is TrFE, Y is CBrF=CF2 | from 60:40 to 65:35 | from 0.5 to 1% |
| K14 | X is TrFE, Y is CBrF=CF2 | from 60:40 to 65:35 | from 1 to 1.5% |
| K15 | X is TrFE, Y is CBrF=CF2 | from 60:40 to 65:35 | from 1.5 to 2% |
| K16 | X is TrFE, Y is CBrF=CF2 | from 60:40 to 65:35 | from 2 to 2.5% |
| K17 | X is TrFE, Y is CBrF=CF2 | from 60:40 to 65:35 | from 2.5 to 3% |
| K18 | X is TrFE, Y is CBrF=CF2 | from 60:40 to 65:35 | from 3 to 3.5% |
| K19 | X is TrFE, Y is CBrF=CF2 | from 60:40 to 65:35 | from 3.5 to 4% |
| K20 | X is TrFE, Y is CBrF=CF2 | from 60:40 to 65:35 | from 4 to 4.5% |
| K21 | X is TrFE, Y is CBrF=CF2 | from 60:40 to 65:35 | from 4.5 to 5% |
| K22 | X is TrFE, Y is CBrF=CF2 | from 60:40 to 65:35 | from 5 to 5.5% |
| K23 | X is TrFE, Y is CBrF=CF2 | from 60:40 to 65:35 | from 5.5 to 6% |
| K24 | X is TrFE, Y is CBrF=CF2 | from 60:40 to 65:35 | from 6 to 6.5% |
| K25 | X is TrFE, Y is CBrF=CF2 | from 65:35 to 70:30 | from 0.5 to 1% |
| K26 | X is TrFE, Y is CBrF=CF2 | from 65:35 to 70:30 | from 1 to 1.5% |
| K27 | X is TrFE, Y is CBrF=CF2 | from 65:35 to 70:30 | from 1.5 to 2% |
| K28 | X is TrFE, Y is CBrF=CF2 | from 65:35 to 70:30 | from 2 to 2.5% |
| K29 | X is TrFE, Y is CBrF=CF2 | from 65:35 to 70:30 | from 2.5 to 3% |
| K30 | X is TrFE, Y is CBrF=CF2 | from 65:35 to 70:30 | from 3 to 3.5% |
| K31 | X is TrFE, Y is CBrF=CF2 | from 65:35 to 70:30 | from 3.5 to 4% |
| K32 | X is TrFE, Y is CBrF=CF2 | from 65:35 to 70:30 | from 4 to 4.5% |
| K33 | X is TrFE, Y is CBrF=CF2 | from 65:35 to 70:30 | from 4.5 to 5% |
| K34 | X is TrFE, Y is CBrF=CF2 | from 65:35 to 70:30 | from 5 to 5.5% |
| K35 | X is TrFE, Y is CBrF=CF2 | from 65:35 to 70:30 | from 5.5 to 6% |
| K36 | X is TrFE, Y is CBrF=CF2 | from 65:35 to 70:30 | from 6 to 6.5% |
| K37 | X is TrFE, Y is CBrF=CF2 | from 70:30 to 75:25 | from 0.5 to 1% |
| K38 | X is TrFE, Y is CBrF=CF2 | from 70:30 to 75:25 | from 1 to 1.5% |
| K39 | X is TrFE, Y is CBrF=CF2 | from 70:30 to 75:25 | from 1.5 to 2% |
| K40 | X is TrFE, Y is CBrF=CF2 | from 70:30 to 75:25 | from 2 to 2.5% |
| K41 | X is TrFE, Y is CBrF=CF2 | from 70:30 to 75:25 | from 2.5 to 3% |
| K42 | X is TrFE, Y is CBrF=CF2 | from 70:30 to 75:25 | from 3 to 3.5% |
| K43 | X is TrFE, Y is CBrF=CF2 | from 70:30 to 75:25 | from 3.5 to 4% |
| K44 | X is TrFE, Y is CBrF=CF2 | from 70:30 to 75:25 | from 4 to 4.5% |
| K45 | X is TrFE, Y is CBrF=CF2 | from 70:30 to 75:25 | from 4.5 to 5% |
| K46 | X is TrFE, Y is CBrF=CF2 | from 70:30 to 75:25 | from 5 to 5.5% |

| Polymer No. | Nature of the starting monomers | VDF:X ratio | Content of Y |
|---|---|---|---|
| K47 | X is TrFE, Y is CBrF=CF2 | from 70:30 to 75:25 | from 5.5 to 6% |
| K48 | X is TrFE, Y is CBrF=CF2 | from 70:30 to 75:25 | from 6 to 6.5% |
| K49 | X is TrFE, Y is CBrF=CF2 | from 75:25 to 80:20 | from 0.5 to 1% |
| K50 | X is TrFE, Y is CBrF=CF2 | from 75:25 to 80:20 | from 1 to 1.5% |
| K51 | X is TrFE, Y is CBrF=CF2 | from 75:25 to 80:20 | from 1.5 to 2% |
| K52 | X is TrFE, Y is CBrF=CF2 | from 75:25 to 80:20 | from 2 to 2.5% |
| K53 | X is TrFE, Y is CBrF=CF2 | from 75:25 to 80:20 | from 2.5 to 3% |
| K54 | X is TrFE, Y is CBrF=CF2 | from 75:25 to 80:20 | from 3 to 3.5% |
| K55 | X is TrFE, Y is CBrF=CF2 | from 75:25 to 80:20 | from 3.5 to 4% |
| K56 | X is TrFE, Y is CBrF=CF2 | from 75:25 to 80:20 | from 4 to 4.5% |
| K57 | X is TrFE, Y is CBrF=CF2 | from 75:25 to 80:20 | from 4.5 to 5% |
| K58 | X is TrFE, Y is CBrF=CF2 | from 75:25 to 80:20 | from 5 to 5.5% |
| K59 | X is TrFE, Y is CBrF=CF2 | from 75:25 to 80:20 | from 5.5 to 6% |
| K60 | X is TrFE, Y is CBrF=CF2 | from 75:25 to 80:20 | from 6 to 6.5% |
| L1 | X is TFE, Y is CBrF=CF2 | from 55:45 to 60:40 | from 0.5 to 1% |
| L2 | X is TFE, Y is CBrF=CF2 | from 55:45 to 60:40 | from 1 to 1.5% |
| L3 | X is TFE, Y is CBrF=CF2 | from 55:45 to 60:40 | from 1.5 to 2% |
| L4 | X is TFE, Y is CBrF=CF2 | from 55:45 to 60:40 | from 2 to 2.5% |
| L5 | X is TFE, Y is CBrF=CF2 | from 55:45 to 60:40 | from 2.5 to 3% |
| L6 | X is TFE, Y is CBrF=CF2 | from 55:45 to 60:40 | from 3 to 3.5% |
| L7 | X is TFE, Y is CBrF=CF2 | from 55:45 to 60:40 | from 3.5 to 4% |
| L8 | X is TFE, Y is CBrF=CF2 | from 55:45 to 60:40 | from 4 to 4.5% |
| L9 | X is TFE, Y is CBrF=CF2 | from 55:45 to 60:40 | from 4.5 to 5% |
| L10 | X is TFE, Y is CBrF=CF2 | from 55:45 to 60:40 | from 5 to 5.5% |
| L11 | X is TFE, Y is CBrF=CF2 | from 55:45 to 60:40 | from 5.5 to 6% |
| L12 | X is TFE, Y is CBrF=CF2 | from 55:45 to 60:40 | from 6 to 6.5% |
| L13 | X is TFE, Y is CBrF=CF2 | from 60:40 to 65:35 | from 0.5 to 1% |
| L14 | X is TFE, Y is CBrF=CF2 | from 60:40 to 65:35 | from 1 to 1.5% |
| L15 | X is TFE, Y is CBrF=CF2 | from 60:40 to 65:35 | from 1.5 to 2% |
| L16 | X is TFE, Y is CBrF=CF2 | from 60:40 to 65:35 | from 2 to 2.5% |
| L17 | X is TFE, Y is CBrF=CF2 | from 60:40 to 65:35 | from 2.5 to 3% |
| L18 | X is TFE, Y is CBrF=CF2 | from 60:40 to 65:35 | from 3 to 3.5% |
| L19 | X is TFE, Y is CBrF=CF2 | from 60:40 to 65:35 | from 3.5 to 4% |
| L20 | X is TFE, Y is CBrF=CF2 | from 60:40 to 65:35 | from 4 to 4.5% |
| L21 | X is TFE, Y is CBrF=CF2 | from 60:40 to 65:35 | from 4.5 to 5% |
| L22 | X is TFE, Y is CBrF=CF2 | from 60:40 to 65:35 | from 5 to 5.5% |
| L23 | X is TFE, Y is CBrF=CF2 | from 60:40 to 65:35 | from 5.5 to 6% |
| L24 | X is TFE, Y is CBrF=CF2 | from 60:40 to 65:35 | from 6 to 6.5% |
| L25 | X is TFE, Y is CBrF=CF2 | from 65:35 to 70:30 | from 0.5 to 1% |
| L26 | X is TFE, Y is CBrF=CF2 | from 65:35 to 70:30 | from 1 to 1.5% |
| L27 | X is TFE, Y is CBrF=CF2 | from 65:35 to 70:30 | from 1.5 to 2% |
| L28 | X is TFE, Y is CBrF=CF2 | from 65:35 to 70:30 | from 2 to 2.5% |
| L29 | X is TFE, Y is CBrF=CF2 | from 65:35 to 70:30 | from 2.5 to 3% |
| L30 | X is TFE, Y is CBrF=CF2 | from 65:35 to 70:30 | from 3 to 3.5% |
| L31 | X is TFE, Y is CBrF=CF2 | from 65:35 to 70:30 | from 3.5 to 4% |
| L32 | X is TFE, Y is CBrF=CF2 | from 65:35 to 70:30 | from 4 to 4.5% |
| L33 | X is TFE, Y is CBrF=CF2 | from 65:35 to 70:30 | from 4.5 to 5% |
| L34 | X is TFE, Y is CBrF=CF2 | from 65:35 to 70:30 | from 5 to 5.5% |
| L35 | X is TFE, Y is CBrF=CF2 | from 65:35 to 70:30 | from 5.5 to 6% |
| L36 | X is TFE, Y is CBrF=CF2 | from 65:35 to 70:30 | from 6 to 6.5% |
| L37 | X is TFE, Y is CBrF=CF2 | from 70:30 to 75:25 | from 0.5 to 1% |
| L38 | X is TFE, Y is CBrF=CF2 | from 70:30 to 75:25 | from 1 to 1.5% |
| L39 | X is TFE, Y is CBrF=CF2 | from 70:30 to 75:25 | from 1.5 to 2% |
| L40 | X is TFE, Y is CBrF=CF2 | from 70:30 to 75:25 | from 2 to 2.5% |
| L41 | X is TFE, Y is CBrF=CF2 | from 70:30 to 75:25 | from 2.5 to 3% |
| L42 | X is TFE, Y is CBrF=CF2 | from 70:30 to 75:25 | from 3 to 3.5% |
| L43 | X is TFE, Y is CBrF=CF2 | from 70:30 to 75:25 | from 3.5 to 4% |
| L44 | X is TFE, Y is CBrF=CF2 | from 70:30 to 75:25 | from 4 to 4.5% |
| L45 | X is TFE, Y is CBrF=CF2 | from 70:30 to 75:25 | from 4.5 to 5% |
| L46 | X is TFE, Y is CBrF=CF2 | from 70:30 to 75:25 | from 5 to 5.5% |
| L47 | X is TFE, Y is CBrF=CF2 | from 70:30 to 75:25 | from 5.5 to 6% |
| L48 | X is TFE, Y is CBrF=CF2 | from 70:30 to 75:25 | from 6 to 6.5% |
| L49 | X is TFE, Y is CBrF=CF2 | from 75:25 to 80:20 | from 0.5 to 1% |
| L50 | X is TFE, Y is CBrF=CF2 | from 75:25 to 80:20 | from 1 to 1.5% |
| L51 | X is TFE, Y is CBrF=CF2 | from 75:25 to 80:20 | from 1.5 to 2% |
| L52 | X is TFE, Y is CBrF=CF2 | from 75:25 to 80:20 | from 2 to 2.5% |
| L53 | X is TFE, Y is CBrF=CF2 | from 75:25 to 80:20 | from 2.5 to 3% |
| L54 | X is TFE, Y is CBrF=CF2 | from 75:25 to 80:20 | from 3 to 3.5% |
| L55 | X is TFE, Y is CBrF=CF2 | from 75:25 to 80:20 | from 3.5 to 4% |
| L56 | X is TFE, Y is CBrF=CF2 | from 75:25 to 80:20 | from 4 to 4.5% |
| L57 | X is TFE, Y is CBrF=CF2 | from 75:25 to 80:20 | from 4.5 to 5% |
| L58 | X is TFE, Y is CBrF=CF2 | from 75:25 to 80:20 | from 5 to 5.5% |
| L59 | X is TFE, Y is CBrF=CF2 | from 75:25 to 80:20 | from 5.5 to 6% |
| L60 | X is TFE, Y is CBrF=CF2 | from 75:25 to 80:20 | from 6 to 6.5% |
| M1 | X is TrFE, Y is a PAVE | from 55:45 to 60:40 | from 0.5 to 1% |
| M2 | X is TrFE, Y is a PAVE | from 55:45 to 60:40 | from 1 to 1.5% |
| M3 | X is TrFE, Y is a PAVE | from 55:45 to 60:40 | from 1.5 to 2% |

-continued

| Polymer No. | Nature of the starting monomers | VDF:X ratio | Content of Y |
|---|---|---|---|
| M4 | X is TrFE, Y is a PAVE | from 55:45 to 60:40 | from 2 to 2.5% |
| M5 | X is TrFE, Y is a PAVE | from 55:45 to 60:40 | from 2.5 to 3% |
| M6 | X is TrFE, Y is a PAVE | from 55:45 to 60:40 | from 3 to 3.5% |
| M7 | X is TrFE, Y is a PAVE | from 55:45 to 60:40 | from 3.5 to 4% |
| M8 | X is TrFE, Y is a PAVE | from 55:45 to 60:40 | from 4 to 4.5% |
| M9 | X is TrFE, Y is a PAVE | from 55:45 to 60:40 | from 4.5 to 5% |
| M10 | X is TrFE, Y is a PAVE | from 55:45 to 60:40 | from 5 to 5.5% |
| M11 | X is TrFE, Y is a PAVE | from 55:45 to 60:40 | from 5.5 to 6% |
| M12 | X is TrFE, Y is a PAVE | from 55:45 to 60:40 | from 6 to 6.5% |
| M13 | X is TrFE, Y is a PAVE | from 60:40 to 65:35 | from 0.5 to 1% |
| M14 | X is TrFE, Y is a PAVE | from 60:40 to 65:35 | from 1 to 1.5% |
| M15 | X is TrFE, Y is a PAVE | from 60:40 to 65:35 | from 1.5 to 2% |
| M16 | X is TrFE, Y is a PAVE | from 60:40 to 65:35 | from 2 to 2.5% |
| M17 | X is TrFE, Y is a PAVE | from 60:40 to 65:35 | from 2.5 to 3% |
| M18 | X is TrFE, Y is a PAVE | from 60:40 to 65:35 | from 3 to 3.5% |
| M19 | X is TrFE, Y is a PAVE | from 60:40 to 65:35 | from 3.5 to 4% |
| M20 | X is TrFE, Y is a PAVE | from 60:40 to 65:35 | from 4 to 4.5% |
| M21 | X is TrFE, Y is a PAVE | from 60:40 to 65:35 | from 4.5 to 5% |
| M22 | X is TrFE, Y is a PAVE | from 60:40 to 65:35 | from 5 to 5.5% |
| M23 | X is TrFE, Y is a PAVE | from 60:40 to 65:35 | from 5.5 to 6% |
| M24 | X is TrFE, Y is a PAVE | from 60:40 to 65:35 | from 6 to 6.5% |
| M25 | X is TrFE, Y is a PAVE | from 65:35 to 70:30 | from 0.5 to 1% |
| M26 | X is TrFE, Y is a PAVE | from 65:35 to 70:30 | from 1 to 1.5% |
| M27 | X is TrFE, Y is a PAVE | from 65:35 to 70:30 | from 1.5 to 2% |
| M28 | X is TrFE, Y is a PAVE | from 65:35 to 70:30 | from 2 to 2.5% |
| M29 | X is TrFE, Y is a PAVE | from 65:35 to 70:30 | from 2.5 to 3% |
| M30 | X is TrFE, Y is a PAVE | from 65:35 to 70:30 | from 3 to 3.5% |
| M31 | X is TrFE, Y is a PAVE | from 65:35 to 70:30 | from 3.5 to 4% |
| M32 | X is TrFE, Y is a PAVE | from 65:35 to 70:30 | from 4 to 4.5% |
| M33 | X is TrFE, Y is a PAVE | from 65:35 to 70:30 | from 4.5 to 5% |
| M34 | X is TrFE, Y is a PAVE | from 65:35 to 70:30 | from 5 to 5.5% |
| M35 | X is TrFE, Y is a PAVE | from 65:35 to 70:30 | from 5.5 to 6% |
| M36 | X is TrFE, Y is a PAVE | from 65:35 to 70:30 | from 6 to 6.5% |
| M37 | X is TrFE, Y is a PAVE | from 70:30 to 75:25 | from 0.5 to 1% |
| M38 | X is TrFE, Y is a PAVE | from 70:30 to 75:25 | from 1 to 1.5% |
| M39 | X is TrFE, Y is a PAVE | from 70:30 to 75:25 | from 1.5 to 2% |
| M40 | X is TrFE, Y is a PAVE | from 70:30 to 75:25 | from 2 to 2.5% |
| M41 | X is TrFE, Y is a PAVE | from 70:30 to 75:25 | from 2.5 to 3% |
| M42 | X is TrFE, Y is a PAVE | from 70:30 to 75:25 | from 3 to 3.5% |
| M43 | X is TrFE, Y is a PAVE | from 70:30 to 75:25 | from 3.5 to 4% |
| M44 | X is TrFE, Y is a PAVE | from 70:30 to 75:25 | from 4 to 4.5% |
| M45 | X is TrFE, Y is a PAVE | from 70:30 to 75:25 | from 4.5 to 5% |
| M46 | X is TrFE, Y is a PAVE | from 70:30 to 75:25 | from 5 to 5.5% |
| M47 | X is TrFE, Y is a PAVE | from 70:30 to 75:25 | from 5.5 to 6% |
| M48 | X is TrFE, Y is a PAVE | from 70:30 to 75:25 | from 6 to 6.5% |
| M49 | X is TrFE, Y is a PAVE | from 75:25 to 80:20 | from 0.5 to 1% |
| M50 | X is TrFE, Y is a PAVE | from 75:25 to 80:20 | from 1 to 1.5% |
| M51 | X is TrFE, Y is a PAVE | from 75:25 to 80:20 | from 1.5 to 2% |
| M52 | X is TrFE, Y is a PAVE | from 75:25 to 80:20 | from 2 to 2.5% |
| M53 | X is TrFE, Y is a PAVE | from 75:25 to 80:20 | from 2.5 to 3% |
| M54 | X is TrFE, Y is a PAVE | from 75:25 to 80:20 | from 3 to 3.5% |
| M55 | X is TrFE, Y is a PAVE | from 75:25 to 80:20 | from 3.5 to 4% |
| M56 | X is TrFE, Y is a PAVE | from 75:25 to 80:20 | from 4 to 4.5% |
| M57 | X is TrFE, Y is a PAVE | from 75:25 to 80:20 | from 4.5 to 5% |
| M58 | X is TrFE, Y is a PAVE | from 75:25 to 80:20 | from 5 to 5.5% |
| M59 | X is TrFE, Y is a PAVE | from 75:25 to 80:20 | from 5.5 to 6% |
| M60 | X is TrFE, Y is a PAVE | from 75:25 to 80:20 | from 6 to 6.5% |
| N1 | X is TFE, Y is a PAVE | from 55:45 to 60:40 | from 0.5 to 1% |
| N2 | X is TFE, Y is a PAVE | from 55:45 to 60:40 | from 1 to 1.5% |
| N3 | X is TFE, Y is a PAVE | from 55:45 to 60:40 | from 1.5 to 2% |
| N4 | X is TFE, Y is a PAVE | from 55:45 to 60:40 | from 2 to 2.5% |
| N5 | X is TFE, Y is a PAVE | from 55:45 to 60:40 | from 2.5 to 3% |
| N6 | X is TFE, Y is a PAVE | from 55:45 to 60:40 | from 3 to 3.5% |
| N7 | X is TFE, Y is a PAVE | from 55:45 to 60:40 | from 3.5 to 4% |
| N8 | X is TFE, Y is a PAVE | from 55:45 to 60:40 | from 4 to 4.5% |
| N9 | X is TFE, Y is a PAVE | from 55:45 to 60:40 | from 4.5 to 5% |
| N10 | X is TFE, Y is a PAVE | from 55:45 to 60:40 | from 5 to 5.5% |
| N11 | X is TFE, Y is a PAVE | from 55:45 to 60:40 | from 5.5 to 6% |
| N12 | X is TFE, Y is a PAVE | from 55:45 to 60:40 | from 6 to 6.5% |
| N13 | X is TFE, Y is a PAVE | from 60:40 to 65:35 | from 0.5 to 1% |
| N14 | X is TFE, Y is a PAVE | from 60:40 to 65:35 | from 1 to 1.5% |
| N15 | X is TFE, Y is a PAVE | from 60:40 to 65:35 | from 1.5 to 2% |
| N16 | X is TFE, Y is a PAVE | from 60:40 to 65:35 | from 2 to 2.5% |
| N17 | X is TFE, Y is a PAVE | from 60:40 to 65:35 | from 2.5 to 3% |
| N18 | X is TFE, Y is a PAVE | from 60:40 to 65:35 | from 3 to 3.5% |
| N19 | X is TFE, Y is a PAVE | from 60:40 to 65:35 | from 3.5 to 4% |
| N20 | X is TFE, Y is a PAVE | from 60:40 to 65:35 | from 4 to 4.5% |
| N21 | X is TFE, Y is a PAVE | from 60:40 to 65:35 | from 4.5 to 5% |
| N22 | X is TFE, Y is a PAVE | from 60:40 to 65:35 | from 5 to 5.5% |
| N23 | X is TFE, Y is a PAVE | from 60:40 to 65:35 | from 5.5 to 6% |
| N24 | X is TFE, Y is a PAVE | from 60:40 to 65:35 | from 6 to 6.5% |
| N25 | X is TFE, Y is a PAVE | from 65:35 to 70:30 | from 0.5 to 1% |
| N26 | X is TFE, Y is a PAVE | from 65:35 to 70:30 | from 1 to 1.5% |
| N27 | X is TFE, Y is a PAVE | from 65:35 to 70:30 | from 1.5 to 2% |
| N28 | X is TFE, Y is a PAVE | from 65:35 to 70:30 | from 2 to 2.5% |
| N29 | X is TFE, Y is a PAVE | from 65:35 to 70:30 | from 2.5 to 3% |
| N30 | X is TFE, Y is a PAVE | from 65:35 to 70:30 | from 3 to 3.5% |
| N31 | X is TFE, Y is a PAVE | from 65:35 to 70:30 | from 3.5 to 4% |
| N32 | X is TFE, Y is a PAVE | from 65:35 to 70:30 | from 4 to 4.5% |
| N33 | X is TFE, Y is a PAVE | from 65:35 to 70:30 | from 4.5 to 5% |
| N34 | X is TFE, Y is a PAVE | from 65:35 to 70:30 | from 5 to 5.5% |
| N35 | X is TFE, Y is a PAVE | from 65:35 to 70:30 | from 5.5 to 6% |
| N36 | X is TFE, Y is a PAVE | from 65:35 to 70:30 | from 6 to 6.5% |
| N37 | X is TFE, Y is a PAVE | from 70:30 to 75:25 | from 0.5 to 1% |
| N38 | X is TFE, Y is a PAVE | from 70:30 to 75:25 | from 1 to 1.5% |
| N39 | X is TFE, Y is a PAVE | from 70:30 to 75:25 | from 1.5 to 2% |
| N40 | X is TFE, Y is a PAVE | from 70:30 to 75:25 | from 2 to 2.5% |
| N41 | X is TFE, Y is a PAVE | from 70:30 to 75:25 | from 2.5 to 3% |
| N42 | X is TFE, Y is a PAVE | from 70:30 to 75:25 | from 3 to 3.5% |
| N43 | X is TFE, Y is a PAVE | from 70:30 to 75:25 | from 3.5 to 4% |
| N44 | X is TFE, Y is a PAVE | from 70:30 to 75:25 | from 4 to 4.5% |
| N45 | X is TFE, Y is a PAVE | from 70:30 to 75:25 | from 4.5 to 5% |
| N46 | X is TFE, Y is a PAVE | from 70:30 to 75:25 | from 5 to 5.5% |
| N47 | X is TFE, Y is a PAVE | from 70:30 to 75:25 | from 5.5 to 6% |
| N48 | X is TFE, Y is a PAVE | from 70:30 to 75:25 | from 6 to 6.5% |
| N49 | X is TFE, Y is a PAVE | from 75:25 to 80:20 | from 0.5 to 1% |
| N50 | X is TFE, Y is a PAVE | from 75:25 to 80:20 | from 1 to 1.5% |
| N51 | X is TFE, Y is a PAVE | from 75:25 to 80:20 | from 1.5 to 2% |
| N52 | X is TFE, Y is a PAVE | from 75:25 to 80:20 | from 2 to 2.5% |
| N53 | X is TFE, Y is a PAVE | from 75:25 to 80:20 | from 2.5 to 3% |
| N54 | X is TFE, Y is a PAVE | from 75:25 to 80:20 | from 3 to 3.5% |
| N55 | X is TFE, Y is a PAVE | from 75:25 to 80:20 | from 3.5 to 4% |
| N56 | X is TFE, Y is a PAVE | from 75:25 to 80:20 | from 4 to 4.5% |
| N57 | X is TFE, Y is a PAVE | from 75:25 to 80:20 | from 4.5 to 5% |
| N58 | X is TFE, Y is a PAVE | from 75:25 to 80:20 | from 5 to 5.5% |
| N59 | X is TFE, Y is a PAVE | from 75:25 to 80:20 | from 5.5 to 6% |
| N60 | X is TFE, Y is a PAVE | from 75:25 to 80:20 | from 6 to 6.5% |
| O1 | X is TrFE, Y is TFE | from 55:45 to 60:40 | from 0.5 to 1% |
| O2 | X is TrFE, Y is TFE | from 55:45 to 60:40 | from 1 to 1.5% |
| O3 | X is TrFE, Y is TFE | from 55:45 to 60:40 | from 1.5 to 2% |
| O4 | X is TrFE, Y is TFE | from 55:45 to 60:40 | from 2 to 2.5% |
| O5 | X is TrFE, Y is TFE | from 55:45 to 60:40 | from 2.5 to 3% |
| O6 | X is TrFE, Y is TFE | from 55:45 to 60:40 | from 3 to 3.5% |
| O7 | X is TrFE, Y is TFE | from 55:45 to 60:40 | from 3.5 to 4% |
| O8 | X is TrFE, Y is TFE | from 55:45 to 60:40 | from 4 to 4.5% |
| O9 | X is TrFE, Y is TFE | from 55:45 to 60:40 | from 4.5 to 5% |
| O10 | X is TrFE, Y is TFE | from 55:45 to 60:40 | from 5 to 5.5% |
| O11 | X is TrFE, Y is TFE | from 55:45 to 60:40 | from 5.5 to 6% |
| O12 | X is TrFE, Y is TFE | from 55:45 to 60:40 | from 6 to 6.5% |
| O13 | X is TrFE, Y is TFE | from 60:40 to 65:35 | from 0.5 to 1% |
| O14 | X is TrFE, Y is TFE | from 60:40 to 65:35 | from 1 to 1.5% |
| O15 | X is TrFE, Y is TFE | from 60:40 to 65:35 | from 1.5 to 2% |
| O16 | X is TrFE, Y is TFE | from 60:40 to 65:35 | from 2 to 2.5% |
| O17 | X is TrFE, Y is TFE | from 60:40 to 65:35 | from 2.5 to 3% |
| O18 | X is TrFE, Y is TFE | from 60:40 to 65:35 | from 3 to 3.5% |
| O19 | X is TrFE, Y is TFE | from 60:40 to 65:35 | from 3.5 to 4% |
| O20 | X is TrFE, Y is TFE | from 60:40 to 65:35 | from 4 to 4.5% |
| O21 | X is TrFE, Y is TFE | from 60:40 to 65:35 | from 4.5 to 5% |
| O22 | X is TrFE, Y is TFE | from 60:40 to 65:35 | from 5 to 5.5% |
| O23 | X is TrFE, Y is TFE | from 60:40 to 65:35 | from 5.5 to 6% |
| O24 | X is TrFE, Y is TFE | from 60:40 to 65:35 | from 6 to 6.5% |
| O25 | X is TrFE, Y is TFE | from 65:35 to 70:30 | from 0.5 to 1% |
| O26 | X is TrFE, Y is TFE | from 65:35 to 70:30 | from 1 to 1.5% |
| O27 | X is TrFE, Y is TFE | from 65:35 to 70:30 | from 1.5 to 2% |
| O28 | X is TrFE, Y is TFE | from 65:35 to 70:30 | from 2 to 2.5% |
| O29 | X is TrFE, Y is TFE | from 65:35 to 70:30 | from 2.5 to 3% |
| O30 | X is TrFE, Y is TFE | from 65:35 to 70:30 | from 3 to 3.5% |
| O31 | X is TrFE, Y is TFE | from 65:35 to 70:30 | from 3.5 to 4% |
| O32 | X is TrFE, Y is TFE | from 65:35 to 70:30 | from 4 to 4.5% |
| O33 | X is TrFE, Y is TFE | from 65:35 to 70:30 | from 4.5 to 5% |
| O34 | X is TrFE, Y is TFE | from 65:35 to 70:30 | from 5 to 5.5% |
| O35 | X is TrFE, Y is TFE | from 65:35 to 70:30 | from 5.5 to 6% |

-continued

| Polymer No. | Nature of the starting monomers | VDF:X ratio | Content of Y |
|---|---|---|---|
| O36 | X is TrFE, Y is TFE | from 65:35 to 70:30 | from 6 to 6.5% |
| O37 | X is TrFE, Y is TFE | from 70:30 to 75:25 | from 0.5 to 1% |
| O38 | X is TrFE, Y is TFE | from 70:30 to 75:25 | from 1 to 1.5% |
| O39 | X is TrFE, Y is TFE | from 70:30 to 75:25 | from 1.5 to 2% |
| O40 | X is TrFE, Y is TFE | from 70:30 to 75:25 | from 2 to 2.5% |
| O41 | X is TrFE, Y is TFE | from 70:30 to 75:25 | from 2.5 to 3% |
| O42 | X is TrFE, Y is TFE | from 70:30 to 75:25 | from 3 to 3.5% |
| O43 | X is TrFE, Y is TFE | from 70:30 to 75:25 | from 3.5 to 4% |
| O44 | X is TrFE, Y is TFE | from 70:30 to 75:25 | from 4 to 4.5% |
| O45 | X is TrFE, Y is TFE | from 70:30 to 75:25 | from 4.5 to 5% |
| O46 | X is TrFE, Y is TFE | from 70:30 to 75:25 | from 5 to 5.5% |
| O47 | X is TrFE, Y is TFE | from 70:30 to 75:25 | from 5.5 to 6% |
| O48 | X is TrFE, Y is TFE | from 70:30 to 75:25 | from 6 to 6.5% |
| O49 | X is TrFE, Y is TFE | from 75:25 to 80:20 | from 0.5 to 1% |
| O50 | X is TrFE, Y is TFE | from 75:25 to 80:20 | from 1 to 1.5% |
| O51 | X is TrFE, Y is TFE | from 75:25 to 80:20 | from 1.5 to 2% |
| O52 | X is TrFE, Y is TFE | from 75:25 to 80:20 | from 2 to 2.5% |
| O53 | X is TrFE, Y is TFE | from 75:25 to 80:20 | from 2.5 to 3% |
| O54 | X is TrFE, Y is TFE | from 75:25 to 80:20 | from 3 to 3.5% |
| O55 | X is TrFE, Y is TFE | from 75:25 to 80:20 | from 3.5 to 4% |
| O56 | X is TrFE, Y is TFE | from 75:25 to 80:20 | from 4 to 4.5% |
| O57 | X is TrFE, Y is TFE | from 75:25 to 80:20 | from 4.5 to 5% |
| O58 | X is TrFE, Y is TFE | from 75:25 to 80:20 | from 5 to 5.5% |
| O59 | X is TrFE, Y is TFE | from 75:25 to 80:20 | from 5.5 to 6% |
| O60 | X is TrFE, Y is TFE | from 75:25 to 80:20 | from 6 to 6.5% |
| Q1 | X is TrFE, Y is 1233xf | from 55:45 to 60:40 | from 0.5 to 1% |
| Q2 | X is TrFE, Y is 1233xf | from 55:45 to 60:40 | from 1 to 1.5% |
| Q3 | X is TrFE, Y is 1233xf | from 55:45 to 60:40 | from 1.5 to 2% |
| Q4 | X is TrFE, Y is 1233xf | from 55:45 to 60:40 | from 2 to 2.5% |
| Q5 | X is TrFE, Y is 1233xf | from 55:45 to 60:40 | from 2.5 to 3% |
| Q6 | X is TrFE, Y is 1233xf | from 55:45 to 60:40 | from 3 to 3.5% |
| Q7 | X is TrFE, Y is 1233xf | from 55:45 to 60:40 | from 3.5 to 4% |
| Q8 | X is TrFE, Y is 1233xf | from 55:45 to 60:40 | from 4 to 4.5% |
| Q9 | X is TrFE, Y is 1233xf | from 55:45 to 60:40 | from 4.5 to 5% |
| Q10 | X is TrFE, Y is 1233xf | from 55:45 to 60:40 | from 5 to 5.5% |
| Q11 | X is TrFE, Y is 1233xf | from 55:45 to 60:40 | from 5.5 to 6% |
| Q12 | X is TrFE, Y is 1233xf | from 55:45 to 60:40 | from 6 to 6.5% |
| Q13 | X is TrFE, Y is 1233xf | from 60:40 to 65:35 | from 0.5 to 1% |
| Q14 | X is TrFE, Y is 1233xf | from 60:40 to 65:35 | from 1 to 1.5% |
| Q15 | X is TrFE, Y is 1233xf | from 60:40 to 65:35 | from 1.5 to 2% |
| Q16 | X is TrFE, Y is 1233xf | from 60:40 to 65:35 | from 2 to 2.5% |
| Q17 | X is TrFE, Y is 1233xf | from 60:40 to 65:35 | from 2.5 to 3% |
| Q18 | X is TrFE, Y is 1233xf | from 60:40 to 65:35 | from 3 to 3.5% |
| Q19 | X is TrFE, Y is 1233xf | from 60:40 to 65:35 | from 3.5 to 4% |
| Q20 | X is TrFE, Y is 1233xf | from 60:40 to 65:35 | from 4 to 4.5% |
| Q21 | X is TrFE, Y is 1233xf | from 60:40 to 65:35 | from 4.5 to 5% |
| Q22 | X is TrFE, Y is 1233xf | from 60:40 to 65:35 | from 5 to 5.5% |
| Q23 | X is TrFE, Y is 1233xf | from 60:40 to 65:35 | from 5.5 to 6% |
| Q24 | X is TrFE, Y is 1233xf | from 60:40 to 65:35 | from 6 to 6.5% |
| Q25 | X is TrFE, Y is 1233xf | from 65:35 to 70:30 | from 0.5 to 1% |
| Q26 | X is TrFE, Y is 1233xf | from 65:35 to 70:30 | from 1 to 1.5% |
| Q27 | X is TrFE, Y is 1233xf | from 65:35 to 70:30 | from 1.5 to 2% |
| Q28 | X is TrFE, Y is 1233xf | from 65:35 to 70:30 | from 2 to 2.5% |
| Q29 | X is TrFE, Y is 1233xf | from 65:35 to 70:30 | from 2.5 to 3% |
| Q30 | X is TrFE, Y is 1233xf | from 65:35 to 70:30 | from 3 to 3.5% |
| Q31 | X is TrFE, Y is 1233xf | from 65:35 to 70:30 | from 3.5 to 4% |
| Q32 | X is TrFE, Y is 1233xf | from 65:35 to 70:30 | from 4 to 4.5% |
| Q33 | X is TrFE, Y is 1233xf | from 65:35 to 70:30 | from 4.5 to 5% |
| Q34 | X is TrFE, Y is 1233xf | from 65:35 to 70:30 | from 5 to 5.5% |
| Q35 | X is TrFE, Y is 1233xf | from 65:35 to 70:30 | from 5.5 to 6% |
| Q36 | X is TrFE, Y is 1233xf | from 65:35 to 70:30 | from 6 to 6.5% |
| Q37 | X is TrFE, Y is 1233xf | from 70:30 to 75:25 | from 0.5 to 1% |
| Q38 | X is TrFE, Y is 1233xf | from 70:30 to 75:25 | from 1 to 1.5% |
| Q39 | X is TrFE, Y is 1233xf | from 70:30 to 75:25 | from 1.5 to 2% |
| Q40 | X is TrFE, Y is 1233xf | from 70:30 to 75:25 | from 2 to 2.5% |
| Q41 | X is TrFE, Y is 1233xf | from 70:30 to 75:25 | from 2.5 to 3% |
| Q42 | X is TrFE, Y is 1233xf | from 70:30 to 75:25 | from 3 to 3.5% |
| Q43 | X is TrFE, Y is 1233xf | from 70:30 to 75:25 | from 3.5 to 4% |
| Q44 | X is TrFE, Y is 1233xf | from 70:30 to 75:25 | from 4 to 4.5% |
| Q45 | X is TrFE, Y is 1233xf | from 70:30 to 75:25 | from 4.5 to 5% |
| Q46 | X is TrFE, Y is 1233xf | from 70:30 to 75:25 | from 5 to 5.5% |
| Q47 | X is TrFE, Y is 1233xf | from 70:30 to 75:25 | from 5.5 to 6% |
| Q48 | X is TrFE, Y is 1233xf | from 70:30 to 75:25 | from 6 to 6.5% |
| Q49 | X is TrFE, Y is 1233xf | from 75:25 to 80:20 | from 0.5 to 1% |
| Q50 | X is TrFE, Y is 1233xf | from 75:25 to 80:20 | from 1 to 1.5% |
| Q51 | X is TrFE, Y is 1233xf | from 75:25 to 80:20 | from 1.5 to 2% |
| Q52 | X is TrFE, Y is 1233xf | from 75:25 to 80:20 | from 2 to 2.5% |
| Q53 | X is TrFE, Y is 1233xf | from 75:25 to 80:20 | from 2.5 to 3% |
| Q54 | X is TrFE, Y is 1233xf | from 75:25 to 80:20 | from 3 to 3.5% |
| Q55 | X is TrFE, Y is 1233xf | from 75:25 to 80:20 | from 3.5 to 4% |
| Q56 | X is TrFE, Y is 1233xf | from 75:25 to 80:20 | from 4 to 4.5% |
| Q57 | X is TrFE, Y is 1233xf | from 75:25 to 80:20 | from 4.5 to 5% |
| Q58 | X is TrFE, Y is 1233xf | from 75:25 to 80:20 | from 5 to 5.5% |
| Q59 | X is TrFE, Y is 1233xf | from 75:25 to 80:20 | from 5.5 to 6% |
| Q60 | X is TrFE, Y is 1233xf | from 75:25 to 80:20 | from 6 to 6.5% |
| R1 | X is TFE, Y is 1233xf | from 55:45 to 60:40 | from 0.5 to 1% |
| R2 | X is TFE, Y is 1233xf | from 55:45 to 60:40 | from 1 to 1.5% |
| R3 | X is TFE, Y is 1233xf | from 55:45 to 60:40 | from 1.5 to 2% |
| R4 | X is TFE, Y is 1233xf | from 55:45 to 60:40 | from 2 to 2.5% |
| R5 | X is TFE, Y is 1233xf | from 55:45 to 60:40 | from 2.5 to 3% |
| R6 | X is TFE, Y is 1233xf | from 55:45 to 60:40 | from 3 to 3.5% |
| R7 | X is TFE, Y is 1233xf | from 55:45 to 60:40 | from 3.5 to 4% |
| R8 | X is TFE, Y is 1233xf | from 55:45 to 60:40 | from 4 to 4.5% |
| R9 | X is TFE, Y is 1233xf | from 55:45 to 60:40 | from 4.5 to 5% |
| R10 | X is TFE, Y is 1233xf | from 55:45 to 60:40 | from 5 to 5.5% |
| R11 | X is TFE, Y is 1233xf | from 55:45 to 60:40 | from 5.5 to 6% |
| R12 | X is TFE, Y is 1233xf | from 55:45 to 60:40 | from 6 to 6.5% |
| R13 | X is TFE, Y is 1233xf | from 60:40 to 65:35 | from 0.5 to 1% |
| R14 | X is TFE, Y is 1233xf | from 60:40 to 65:35 | from 1 to 1.5% |
| R15 | X is TFE, Y is 1233xf | from 60:40 to 65:35 | from 1.5 to 2% |
| R16 | X is TFE, Y is 1233xf | from 60:40 to 65:35 | from 2 to 2.5% |
| R17 | X is TFE, Y is 1233xf | from 60:40 to 65:35 | from 2.5 to 3% |
| R18 | X is TFE, Y is 1233xf | from 60:40 to 65:35 | from 3 to 3.5% |
| R19 | X is TFE, Y is 1233xf | from 60:40 to 65:35 | from 3.5 to 4% |
| R20 | X is TFE, Y is 1233xf | from 60:40 to 65:35 | from 4 to 4.5% |
| R21 | X is TFE, Y is 1233xf | from 60:40 to 65:35 | from 4.5 to 5% |
| R22 | X is TFE, Y is 1233xf | from 60:40 to 65:35 | from 5 to 5.5% |
| R23 | X is TFE, Y is 1233xf | from 60:40 to 65:35 | from 5.5 to 6% |
| R24 | X is TFE, Y is 1233xf | from 60:40 to 65:35 | from 6 to 6.5% |
| R25 | X is TFE, Y is 1233xf | from 65:35 to 70:30 | from 0.5 to 1% |
| R26 | X is TFE, Y is 1233xf | from 65:35 to 70:30 | from 1 to 1.5% |
| R27 | X is TFE, Y is 1233xf | from 65:35 to 70:30 | from 1.5 to 2% |
| R28 | X is TFE, Y is 1233xf | from 65:35 to 70:30 | from 2 to 2.5% |
| R29 | X is TFE, Y is 1233xf | from 65:35 to 70:30 | from 2.5 to 3% |
| R30 | X is TFE, Y is 1233xf | from 65:35 to 70:30 | from 3 to 3.5% |
| R31 | X is TFE, Y is 1233xf | from 65:35 to 70:30 | from 3.5 to 4% |
| R32 | X is TFE, Y is 1233xf | from 65:35 to 70:30 | from 4 to 4.5% |
| R33 | X is TFE, Y is 1233xf | from 65:35 to 70:30 | from 4.5 to 5% |
| R34 | X is TFE, Y is 1233xf | from 65:35 to 70:30 | from 5 to 5.5% |
| R35 | X is TFE, Y is 1233xf | from 65:35 to 70:30 | from 5.5 to 6% |
| R36 | X is TFE, Y is 1233xf | from 65:35 to 70:30 | from 6 to 6.5% |
| R37 | X is TFE, Y is 1233xf | from 70:30 to 75:25 | from 0.5 to 1% |
| R38 | X is TFE, Y is 1233xf | from 70:30 to 75:25 | from 1 to 1.5% |
| R39 | X is TFE, Y is 1233xf | from 70:30 to 75:25 | from 1.5 to 2% |
| R40 | X is TFE, Y is 1233xf | from 70:30 to 75:25 | from 2 to 2.5% |
| R41 | X is TFE, Y is 1233xf | from 70:30 to 75:25 | from 2.5 to 3% |
| R42 | X is TFE, Y is 1233xf | from 70:30 to 75:25 | from 3 to 3.5% |
| R43 | X is TFE, Y is 1233xf | from 70:30 to 75:25 | from 3.5 to 4% |
| R44 | X is TFE, Y is 1233xf | from 70:30 to 75:25 | from 4 to 4.5% |
| R45 | X is TFE, Y is 1233xf | from 70:30 to 75:25 | from 4.5 to 5% |
| R46 | X is TFE, Y is 1233xf | from 70:30 to 75:25 | from 5 to 5.5% |
| R47 | X is TFE, Y is 1233xf | from 70:30 to 75:25 | from 5.5 to 6% |
| R48 | X is TFE, Y is 1233xf | from 70:30 to 75:25 | from 6 to 6.5% |
| R49 | X is TFE, Y is 1233xf | from 75:25 to 80:20 | from 0.5 to 1% |
| R50 | X is TFE, Y is 1233xf | from 75:25 to 80:20 | from 1 to 1.5% |
| R51 | X is TFE, Y is 1233xf | from 75:25 to 80:20 | from 1.5 to 2% |
| R52 | X is TFE, Y is 1233xf | from 75:25 to 80:20 | from 2 to 2.5% |
| R53 | X is TFE, Y is 1233xf | from 75:25 to 80:20 | from 2.5 to 3% |
| R54 | X is TFE, Y is 1233xf | from 75:25 to 80:20 | from 3 to 3.5% |
| R55 | X is TFE, Y is 1233xf | from 75:25 to 80:20 | from 3.5 to 4% |
| R56 | X is TFE, Y is 1233xf | from 75:25 to 80:20 | from 4 to 4.5% |
| R57 | X is TFE, Y is 1233xf | from 75:25 to 80:20 | from 4.5 to 5% |
| R58 | X is TFE, Y is 1233xf | from 75:25 to 80:20 | from 5 to 5.5% |
| R59 | X is TFE, Y is 1233xf | from 75:25 to 80:20 | from 5.5 to 6% |
| R60 | X is TFE, Y is 1233xf | from 75:25 to 80:20 | from 6 to 6.5% |
| S1 | X is TrFE, Y is 1243zf | from 55:45 to 60:40 | from 0.5 to 1% |
| S2 | X is TrFE, Y is 1243zf | from 55:45 to 60:40 | from 1 to 1.5% |
| S3 | X is TrFE, Y is 1243zf | from 55:45 to 60:40 | from 1.5 to 2% |
| S4 | X is TrFE, Y is 1243zf | from 55:45 to 60:40 | from 2 to 2.5% |
| S5 | X is TrFE, Y is 1243zf | from 55:45 to 60:40 | from 2.5 to 3% |
| S6 | X is TrFE, Y is 1243zf | from 55:45 to 60:40 | from 3 to 3.5% |
| S7 | X is TrFE, Y is 1243zf | from 55:45 to 60:40 | from 3.5 to 4% |

-continued

| Polymer No. | Nature of the starting monomers | VDF:X ratio | Content of Y |
|---|---|---|---|
| S8 | X is TrFE, Y is 1243zf | from 55:45 to 60:40 | from 4 to 4.5% |
| S9 | X is TrFE, Y is 1243zf | from 55:45 to 60:40 | from 4.5 to 5% |
| S10 | X is TrFE, Y is 1243zf | from 55:45 to 60:40 | from 5 to 5.5% |
| S11 | X is TrFE, Y is 1243zf | from 55:45 to 60:40 | from 5.5 to 6% |
| S12 | X is TrFE, Y is 1243zf | from 55:45 to 60:40 | from 6 to 6.5% |
| S13 | X is TrFE, Y is 1243zf | from 60:40 to 65:35 | from 0.5 to 1% |
| S14 | X is TrFE, Y is 1243zf | from 60:40 to 65:35 | from 1 to 1.5% |
| S15 | X is TrFE, Y is 1243zf | from 60:40 to 65:35 | from 1.5 to 2% |
| S16 | X is TrFE, Y is 1243zf | from 60:40 to 65:35 | from 2 to 2.5% |
| S17 | X is TrFE, Y is 1243zf | from 60:40 to 65:35 | from 2.5 to 3% |
| S18 | X is TrFE, Y is 1243zf | from 60:40 to 65:35 | from 3 to 3.5% |
| S19 | X is TrFE, Y is 1243zf | from 60:40 to 65:35 | from 3.5 to 4% |
| S20 | X is TrFE, Y is 1243zf | from 60:40 to 65:35 | from 4 to 4.5% |
| S21 | X is TrFE, Y is 1243zf | from 60:40 to 65:35 | from 4.5 to 5% |
| S22 | X is TrFE, Y is 1243zf | from 60:40 to 65:35 | from 5 to 5.5% |
| S23 | X is TrFE, Y is 1243zf | from 60:40 to 65:35 | from 5.5 to 6% |
| S24 | X is TrFE, Y is 1243zf | from 60:40 to 65:35 | from 6 to 6.5% |
| S25 | X is TrFE, Y is 1243zf | from 65:35 to 70:30 | from 0.5 to 1% |
| S26 | X is TrFE, Y is 1243zf | from 65:35 to 70:30 | from 1 to 1.5% |
| S27 | X is TrFE, Y is 1243zf | from 65:35 to 70:30 | from 1.5 to 2% |
| S28 | X is TrFE, Y is 1243zf | from 65:35 to 70:30 | from 2 to 2.5% |
| S29 | X is TrFE, Y is 1243zf | from 65:35 to 70:30 | from 2.5 to 3% |
| S30 | X is TrFE, Y is 1243zf | from 65:35 to 70:30 | from 3 to 3.5% |
| S31 | X is TrFE, Y is 1243zf | from 65:35 to 70:30 | from 3.5 to 4% |
| S32 | X is TrFE, Y is 1243zf | from 65:35 to 70:30 | from 4 to 4.5% |
| S33 | X is TrFE, Y is 1243zf | from 65:35 to 70:30 | from 4.5 to 5% |
| S34 | X is TrFE, Y is 1243zf | from 65:35 to 70:30 | from 5 to 5.5% |
| S35 | X is TrFE, Y is 1243zf | from 65:35 to 70:30 | from 5.5 to 6% |
| S36 | X is TrFE, Y is 1243zf | from 65:35 to 70:30 | from 6 to 6.5% |
| S37 | X is TrFE, Y is 1243zf | from 70:30 to 75:25 | from 0.5 to 1% |
| S38 | X is TrFE, Y is 1243zf | from 70:30 to 75:25 | from 1 to 1.5% |
| S39 | X is TrFE, Y is 1243zf | from 70:30 to 75:25 | from 1.5 to 2% |
| S40 | X is TrFE, Y is 1243zf | from 70:30 to 75:25 | from 2 to 2.5% |
| S41 | X is TrFE, Y is 1243zf | from 70:30 to 75:25 | from 2.5 to 3% |
| S42 | X is TrFE, Y is 1243zf | from 70:30 to 75:25 | from 3 to 3.5% |
| S43 | X is TrFE, Y is 1243zf | from 70:30 to 75:25 | from 3.5 to 4% |
| S44 | X is TrFE, Y is 1243zf | from 70:30 to 75:25 | from 4 to 4.5% |
| S45 | X is TrFE, Y is 1243zf | from 70:30 to 75:25 | from 4.5 to 5% |
| S46 | X is TrFE, Y is 1243zf | from 70:30 to 75:25 | from 5 to 5.5% |
| S47 | X is TrFE, Y is 1243zf | from 70:30 to 75:25 | from 5.5 to 6% |
| S48 | X is TrFE, Y is 1243zf | from 70:30 to 75:25 | from 6 to 6.5% |
| S49 | X is TrFE, Y is 1243zf | from 75:25 to 80:20 | from 0.5 to 1% |
| S50 | X is TrFE, Y is 1243zf | from 75:25 to 80:20 | from 1 to 1.5% |
| S51 | X is TrFE, Y is 1243zf | from 75:25 to 80:20 | from 1.5 to 2% |
| S52 | X is TrFE, Y is 1243zf | from 75:25 to 80:20 | from 2 to 2.5% |
| S53 | X is TrFE, Y is 1243zf | from 75:25 to 80:20 | from 2.5 to 3% |
| S54 | X is TrFE, Y is 1243zf | from 75:25 to 80:20 | from 3 to 3.5% |
| S55 | X is TrFE, Y is 1243zf | from 75:25 to 80:20 | from 3.5 to 4% |
| S56 | X is TrFE, Y is 1243zf | from 75:25 to 80:20 | from 4 to 4.5% |
| S57 | X is TrFE, Y is 1243zf | from 75:25 to 80:20 | from 4.5 to 5% |
| S58 | X is TrFE, Y is 1243zf | from 75:25 to 80:20 | from 5 to 5.5% |
| S59 | X is TrFE, Y is 1243zf | from 75:25 to 80:20 | from 5.5 to 6% |
| S60 | X is TrFE, Y is 1243zf | from 75:25 to 80:20 | from 6 to 6.5% |
| T1 | X is TFE, Y is 1243zf | from 55:45 to 60:40 | from 0.5 to 1% |
| T2 | X is TFE, Y is 1243zf | from 55:45 to 60:40 | from 1 to 1.5% |
| T3 | X is TFE, Y is 1243zf | from 55:45 to 60:40 | from 1.5 to 2% |
| T4 | X is TFE, Y is 1243zf | from 55:45 to 60:40 | from 2 to 2.5% |
| T5 | X is TFE, Y is 1243zf | from 55:45 to 60:40 | from 2.5 to 3% |
| T6 | X is TFE, Y is 1243zf | from 55:45 to 60:40 | from 3 to 3.5% |
| T7 | X is TFE, Y is 1243zf | from 55:45 to 60:40 | from 3.5 to 4% |
| T8 | X is TFE, Y is 1243zf | from 55:45 to 60:40 | from 4 to 4.5% |
| T9 | X is TFE, Y is 1243zf | from 55:45 to 60:40 | from 4.5 to 5% |
| T10 | X is TFE, Y is 1243zf | from 55:45 to 60:40 | from 5 to 5.5% |
| T11 | X is TFE, Y is 1243zf | from 55:45 to 60:40 | from 5.5 to 6% |
| T12 | X is TFE, Y is 1243zf | from 55:45 to 60:40 | from 6 to 6.5% |
| T13 | X is TFE, Y is 1243zf | from 60:40 to 65:35 | from 0.5 to 1% |
| T14 | X is TFE, Y is 1243zf | from 60:40 to 65:35 | from 1 to 1.5% |
| T15 | X is TFE, Y is 1243zf | from 60:40 to 65:35 | from 1.5 to 2% |
| T16 | X is TFE, Y is 1243zf | from 60:40 to 65:35 | from 2 to 2.5% |
| T17 | X is TFE, Y is 1243zf | from 60:40 to 65:35 | from 2.5 to 3% |
| T18 | X is TFE, Y is 1243zf | from 60:40 to 65:35 | from 3 to 3.5% |
| T19 | X is TFE, Y is 1243zf | from 60:40 to 65:35 | from 3.5 to 4% |
| T20 | X is TFE, Y is 1243zf | from 60:40 to 65:35 | from 4 to 4.5% |
| T21 | X is TFE, Y is 1243zf | from 60:40 to 65:35 | from 4.5 to 5% |
| T22 | X is TFE, Y is 1243zf | from 60:40 to 65:35 | from 5 to 5.5% |
| T23 | X is TFE, Y is 1243zf | from 60:40 to 65:35 | from 5.5 to 6% |
| T24 | X is TFE, Y is 1243zf | from 60:40 to 65:35 | from 6 to 6.5% |
| T25 | X is TFE, Y is 1243zf | from 65:35 to 70:30 | from 0.5 to 1% |
| T26 | X is TFE, Y is 1243zf | from 65:35 to 70:30 | from 1 to 1.5% |
| T27 | X is TFE, Y is 1243zf | from 65:35 to 70:30 | from 1.5 to 2% |
| T28 | X is TFE, Y is 1243zf | from 65:35 to 70:30 | from 2 to 2.5% |
| T29 | X is TFE, Y is 1243zf | from 65:35 to 70:30 | from 2.5 to 3% |
| T30 | X is TFE, Y is 1243zf | from 65:35 to 70:30 | from 3 to 3.5% |
| T31 | X is TFE, Y is 1243zf | from 65:35 to 70:30 | from 3.5 to 4% |
| T32 | X is TFE, Y is 1243zf | from 65:35 to 70:30 | from 4 to 4.5% |
| T33 | X is TFE, Y is 1243zf | from 65:35 to 70:30 | from 4.5 to 5% |
| T34 | X is TFE, Y is 1243zf | from 65:35 to 70:30 | from 5 to 5.5% |
| T35 | X is TFE, Y is 1243zf | from 65:35 to 70:30 | from 5.5 to 6% |
| T36 | X is TFE, Y is 1243zf | from 65:35 to 70:30 | from 6 to 6.5% |
| T37 | X is TFE, Y is 1243zf | from 70:30 to 75:25 | from 0.5 to 1% |
| T38 | X is TFE, Y is 1243zf | from 70:30 to 75:25 | from 1 to 1.5% |
| T39 | X is TFE, Y is 1243zf | from 70:30 to 75:25 | from 1.5 to 2% |
| T40 | X is TFE, Y is 1243zf | from 70:30 to 75:25 | from 2 to 2.5% |
| T41 | X is TFE, Y is 1243zf | from 70:30 to 75:25 | from 2.5 to 3% |
| T42 | X is TFE, Y is 1243zf | from 70:30 to 75:25 | from 3 to 3.5% |
| T43 | X is TFE, Y is 1243zf | from 70:30 to 75:25 | from 3.5 to 4% |
| T44 | X is TFE, Y is 1243zf | from 70:30 to 75:25 | from 4 to 4.5% |
| T45 | X is TFE, Y is 1243zf | from 70:30 to 75:25 | from 4.5 to 5% |
| T46 | X is TFE, Y is 1243zf | from 70:30 to 75:25 | from 5 to 5.5% |
| T47 | X is TFE, Y is 1243zf | from 70:30 to 75:25 | from 5.5 to 6% |
| T48 | X is TFE, Y is 1243zf | from 70:30 to 75:25 | from 6 to 6.5% |
| T49 | X is TFE, Y is 1243zf | from 75:25 to 80:20 | from 0.5 to 1% |
| T50 | X is TFE, Y is 1243zf | from 75:25 to 80:20 | from 1 to 1.5% |
| T51 | X is TFE, Y is 1243zf | from 75:25 to 80:20 | from 1.5 to 2% |
| T52 | X is TFE, Y is 1243zf | from 75:25 to 80:20 | from 2 to 2.5% |
| T53 | X is TFE, Y is 1243zf | from 75:25 to 80:20 | from 2.5 to 3% |
| T54 | X is TFE, Y is 1243zf | from 75:25 to 80:20 | from 3 to 3.5% |
| T55 | X is TFE, Y is 1243zf | from 75:25 to 80:20 | from 3.5 to 4% |
| T56 | X is TFE, Y is 1243zf | from 75:25 to 80:20 | from 4 to 4.5% |
| T57 | X is TFE, Y is 1243zf | from 75:25 to 80:20 | from 4.5 to 5% |
| T58 | X is TFE, Y is 1243zf | from 75:25 to 80:20 | from 5 to 5.5% |
| T59 | X is TFE, Y is 1243zf | from 75:25 to 80:20 | from 5.5 to 6% |
| T60 | X is TFE, Y is 1243zf | from 75:25 to 80:20 | from 6 to 6.5% |
| U1 | X is TrFE, Y is 1225zc | from 55:45 to 60:40 | from 0.5 to 1% |
| U2 | X is TrFE, Y is 1225zc | from 55:45 to 60:40 | from 1 to 1.5% |
| U3 | X is TrFE, Y is 1225zc | from 55:45 to 60:40 | from 1.5 to 2% |
| U4 | X is TrFE, Y is 1225zc | from 55:45 to 60:40 | from 2 to 2.5% |
| U5 | X is TrFE, Y is 1225zc | from 55:45 to 60:40 | from 2.5 to 3% |
| U6 | X is TrFE, Y is 1225zc | from 55:45 to 60:40 | from 3 to 3.5% |
| U7 | X is TrFE, Y is 1225zc | from 55:45 to 60:40 | from 3.5 to 4% |
| U8 | X is TrFE, Y is 1225zc | from 55:45 to 60:40 | from 4 to 4.5% |
| U9 | X is TrFE, Y is 1225zc | from 55:45 to 60:40 | from 4.5 to 5% |
| U10 | X is TrFE, Y is 1225zc | from 55:45 to 60:40 | from 5 to 5.5% |
| U11 | X is TrFE, Y is 1225zc | from 55:45 to 60:40 | from 5.5 to 6% |
| U12 | X is TrFE, Y is 1225zc | from 55:45 to 60:40 | from 6 to 6.5% |
| U13 | X is TrFE, Y is 1225zc | from 60:40 to 65:35 | from 0.5 to 1% |
| U14 | X is TrFE, Y is 1225zc | from 60:40 to 65:35 | from 1 to 1.5% |
| U15 | X is TrFE, Y is 1225zc | from 60:40 to 65:35 | from 1.5 to 2% |
| U16 | X is TrFE, Y is 1225zc | from 60:40 to 65:35 | from 2 to 2.5% |
| U17 | X is TrFE, Y is 1225zc | from 60:40 to 65:35 | from 2.5 to 3% |
| U18 | X is TrFE, Y is 1225zc | from 60:40 to 65:35 | from 3 to 3.5% |
| U19 | X is TrFE, Y is 1225zc | from 60:40 to 65:35 | from 3.5 to 4% |
| U20 | X is TrFE, Y is 1225zc | from 60:40 to 65:35 | from 4 to 4.5% |
| U21 | X is TrFE, Y is 1225zc | from 60:40 to 65:35 | from 4.5 to 5% |
| U22 | X is TrFE, Y is 1225zc | from 60:40 to 65:35 | from 5 to 5.5% |
| U23 | X is TrFE, Y is 1225zc | from 60:40 to 65:35 | from 5.5 to 6% |
| U24 | X is TrFE, Y is 1225zc | from 60:40 to 65:35 | from 6 to 6.5% |
| U25 | X is TrFE, Y is 1225zc | from 65:35 to 70:30 | from 0.5 to 1% |
| U26 | X is TrFE, Y is 1225zc | from 65:35 to 70:30 | from 1 to 1.5% |
| U27 | X is TrFE, Y is 1225zc | from 65:35 to 70:30 | from 1.5 to 2% |
| U28 | X is TrFE, Y is 1225zc | from 65:35 to 70:30 | from 2 to 2.5% |
| U29 | X is TrFE, Y is 1225zc | from 65:35 to 70:30 | from 2.5 to 3% |
| U30 | X is TrFE, Y is 1225zc | from 65:35 to 70:30 | from 3 to 3.5% |
| U31 | X is TrFE, Y is 1225zc | from 65:35 to 70:30 | from 3.5 to 4% |
| U32 | X is TrFE, Y is 1225zc | from 65:35 to 70:30 | from 4 to 4.5% |
| U33 | X is TrFE, Y is 1225zc | from 65:35 to 70:30 | from 4.5 to 5% |
| U34 | X is TrFE, Y is 1225zc | from 65:35 to 70:30 | from 5 to 5.5% |
| U35 | X is TrFE, Y is 1225zc | from 65:35 to 70:30 | from 5.5 to 6% |
| U36 | X is TrFE, Y is 1225zc | from 65:35 to 70:30 | from 6 to 6.5% |
| U37 | X is TrFE, Y is 1225zc | from 70:30 to 75:25 | from 0.5 to 1% |
| U38 | X is TrFE, Y is 1225zc | from 70:30 to 75:25 | from 1 to 1.5% |
| U39 | X is TrFE, Y is 1225zc | from 70:30 to 75:25 | from 1.5 to 2% |

-continued

| Polymer No. | Nature of the starting monomers | VDF:X ratio | Content of Y |
|---|---|---|---|
| U40 | X is TrFE, Y is 1225zc | from 70:30 to 75:25 | from 2 to 2.5% |
| U41 | X is TrFE, Y is 1225zc | from 70:30 to 75:25 | from 2.5 to 3% |
| U42 | X is TrFE, Y is 1225zc | from 70:30 to 75:25 | from 3 to 3.5% |
| U43 | X is TrFE, Y is 1225zc | from 70:30 to 75:25 | from 3.5 to 4% |
| U44 | X is TrFE, Y is 1225zc | from 70:30 to 75:25 | from 4 to 4.5% |
| U45 | X is TrFE, Y is 1225zc | from 70:30 to 75:25 | from 4.5 to 5% |
| U46 | X is TrFE, Y is 1225zc | from 70:30 to 75:25 | from 5 to 5.5% |
| U47 | X is TrFE, Y is 1225zc | from 70:30 to 75:25 | from 5.5 to 6% |
| U48 | X is TrFE, Y is 1225zc | from 70:30 to 75:25 | from 6 to 6.5% |
| U49 | X is TrFE, Y is 1225zc | from 75:25 to 80:20 | from 0.5 to 1% |
| U50 | X is TrFE, Y is 1225zc | from 75:25 to 80:20 | from 1 to 1.5% |
| U51 | X is TrFE, Y is 1225zc | from 75:25 to 80:20 | from 1.5 to 2% |
| U52 | X is TrFE, Y is 1225zc | from 75:25 to 80:20 | from 2 to 2.5% |
| U53 | X is TrFE, Y is 1225zc | from 75:25 to 80:20 | from 2.5 to 3% |
| U54 | X is TrFE, Y is 1225zc | from 75:25 to 80:20 | from 3 to 3.5% |
| U55 | X is TrFE, Y is 1225zc | from 75:25 to 80:20 | from 3.5 to 4% |
| U56 | X is TrFE, Y is 1225zc | from 75:25 to 80:20 | from 4 to 4.5% |
| U57 | X is TrFE, Y is 1225zc | from 75:25 to 80:20 | from 4.5 to 5% |
| U58 | X is TrFE, Y is 1225zc | from 75:25 to 80:20 | from 5 to 5.5% |
| U59 | X is TrFE, Y is 1225zc | from 75:25 to 80:20 | from 5.5 to 6% |
| U60 | X is TrFE, Y is 1225zc | from 75:25 to 80:20 | from 6 to 6.5% |
| V1 | X is TFE, Y is 1225zc | from 55:45 to 60:40 | from 0.5 to 1% |
| V2 | X is TFE, Y is 1225zc | from 55:45 to 60:40 | from 1 to 1.5% |
| V3 | X is TFE, Y is 1225zc | from 55:45 to 60:40 | from 1.5 to 2% |
| V4 | X is TFE, Y is 1225zc | from 55:45 to 60:40 | from 2 to 2.5% |
| V5 | X is TFE, Y is 1225zc | from 55:45 to 60:40 | from 2.5 to 3% |
| V6 | X is TFE, Y is 1225zc | from 55:45 to 60:40 | from 3 to 3.5% |
| V7 | X is TFE, Y is 1225zc | from 55:45 to 60:40 | from 3.5 to 4% |
| V8 | X is TFE, Y is 1225zc | from 55:45 to 60:40 | from 4 to 4.5% |
| V9 | X is TFE, Y is 1225zc | from 55:45 to 60:40 | from 4.5 to 5% |
| V10 | X is TFE, Y is 1225zc | from 55:45 to 60:40 | from 5 to 5.5% |
| V11 | X is TFE, Y is 1225zc | from 55:45 to 60:40 | from 5.5 to 6% |
| V12 | X is TFE, Y is 1225zc | from 55:45 to 60:40 | from 6 to 6.5% |
| V13 | X is TFE, Y is 1225zc | from 60:40 to 65:35 | from 0.5 to 1% |
| V14 | X is TFE, Y is 1225zc | from 60:40 to 65:35 | from 1 to 1.5% |
| V15 | X is TFE, Y is 1225zc | from 60:40 to 65:35 | from 1.5 to 2% |
| V16 | X is TFE, Y is 1225zc | from 60:40 to 65:35 | from 2 to 2.5% |
| V17 | X is TFE, Y is 1225zc | from 60:40 to 65:35 | from 2.5 to 3% |
| V18 | X is TFE, Y is 1225zc | from 60:40 to 65:35 | from 3 to 3.5% |
| V19 | X is TFE, Y is 1225zc | from 60:40 to 65:35 | from 3.5 to 4% |
| V20 | X is TFE, Y is 1225zc | from 60:40 to 65:35 | from 4 to 4.5% |
| V21 | X is TFE, Y is 1225zc | from 60:40 to 65:35 | from 4.5 to 5% |
| V22 | X is TFE, Y is 1225zc | from 60:40 to 65:35 | from 5 to 5.5% |
| V23 | X is TFE, Y is 1225zc | from 60:40 to 65:35 | from 5.5 to 6% |
| V24 | X is TFE, Y is 1225zc | from 60:40 to 65:35 | from 6 to 6.5% |
| V25 | X is TFE, Y is 1225zc | from 65:35 to 70:30 | from 0.5 to 1% |
| V26 | X is TFE, Y is 1225zc | from 65:35 to 70:30 | from 1 to 1.5% |
| V27 | X is TFE, Y is 1225zc | from 65:35 to 70:30 | from 1.5 to 2% |
| V28 | X is TFE, Y is 1225zc | from 65:35 to 70:30 | from 2 to 2.5% |
| V29 | X is TFE, Y is 1225zc | from 65:35 to 70:30 | from 2.5 to 3% |
| V30 | X is TFE, Y is 1225zc | from 65:35 to 70:30 | from 3 to 3.5% |
| V31 | X is TFE, Y is 1225zc | from 65:35 to 70:30 | from 3.5 to 4% |
| V32 | X is TFE, Y is 1225zc | from 65:35 to 70:30 | from 4 to 4.5% |
| V33 | X is TFE, Y is 1225zc | from 65:35 to 70:30 | from 4.5 to 5% |
| V34 | X is TFE, Y is 1225zc | from 65:35 to 70:30 | from 5 to 5.5% |
| V35 | X is TFE, Y is 1225zc | from 65:35 to 70:30 | from 5.5 to 6% |
| V36 | X is TFE, Y is 1225zc | from 65:35 to 70:30 | from 6 to 6.5% |
| V37 | X is TFE, Y is 1225zc | from 70:30 to 75:25 | from 0.5 to 1% |
| V38 | X is TFE, Y is 1225zc | from 70:30 to 75:25 | from 1 to 1.5% |
| V39 | X is TFE, Y is 1225zc | from 70:30 to 75:25 | from 1.5 to 2% |
| V40 | X is TFE, Y is 1225zc | from 70:30 to 75:25 | from 2 to 2.5% |
| V41 | X is TFE, Y is 1225zc | from 70:30 to 75:25 | from 2.5 to 3% |
| V42 | X is TFE, Y is 1225zc | from 70:30 to 75:25 | from 3 to 3.5% |
| V43 | X is TFE, Y is 1225zc | from 70:30 to 75:25 | from 3.5 to 4% |
| V44 | X is TFE, Y is 1225zc | from 70:30 to 75:25 | from 4 to 4.5% |
| V45 | X is TFE, Y is 1225zc | from 70:30 to 75:25 | from 4.5 to 5% |
| V46 | X is TFE, Y is 1225zc | from 70:30 to 75:25 | from 5 to 5.5% |
| V47 | X is TFE, Y is 1225zc | from 70:30 to 75:25 | from 5.5 to 6% |
| V48 | X is TFE, Y is 1225zc | from 70:30 to 75:25 | from 6 to 6.5% |
| V49 | X is TFE, Y is 1225zc | from 75:25 to 80:20 | from 0.5 to 1% |
| V50 | X is TFE, Y is 1225zc | from 75:25 to 80:20 | from 1 to 1.5% |
| V51 | X is TFE, Y is 1225zc | from 75:25 to 80:20 | from 1.5 to 2% |
| V52 | X is TFE, Y is 1225zc | from 75:25 to 80:20 | from 2 to 2.5% |
| V53 | X is TFE, Y is 1225zc | from 75:25 to 80:20 | from 2.5 to 3% |
| V54 | X is TFE, Y is 1225zc | from 75:25 to 80:20 | from 3 to 3.5% |
| V55 | X is TFE, Y is 1225zc | from 75:25 to 80:20 | from 3.5 to 4% |
| V56 | X is TFE, Y is 1225zc | from 75:25 to 80:20 | from 4 to 4.5% |
| V57 | X is TFE, Y is 1225zc | from 75:25 to 80:20 | from 4.5 to 5% |
| V58 | X is TFE, Y is 1225zc | from 75:25 to 80:20 | from 5 to 5.5% |
| V59 | X is TFE, Y is 1225zc | from 75:25 to 80:20 | from 5.5 to 6% |
| V60 | X is TFE, Y is 1225zc | from 75:25 to 80:20 | from 6 to 6.5% |
| W1 | X is TrFE, Y is 1225ye | from 55:45 to 60:40 | from 0.5 to 1% |
| W2 | X is TrFE, Y is 1225ye | from 55:45 to 60:40 | from 1 to 1.5% |
| W3 | X is TrFE, Y is 1225ye | from 55:45 to 60:40 | from 1.5 to 2% |
| W4 | X is TrFE, Y is 1225ye | from 55:45 to 60:40 | from 2 to 2.5% |
| W5 | X is TrFE, Y is 1225ye | from 55:45 to 60:40 | from 2.5 to 3% |
| W6 | X is TrFE, Y is 1225ye | from 55:45 to 60:40 | from 3 to 3.5% |
| W7 | X is TrFE, Y is 1225ye | from 55:45 to 60:40 | from 3.5 to 4% |
| W8 | X is TrFE, Y is 1225ye | from 55:45 to 60:40 | from 4 to 4.5% |
| W9 | X is TrFE, Y is 1225ye | from 55:45 to 60:40 | from 4.5 to 5% |
| W10 | X is TrFE, Y is 1225ye | from 55:45 to 60:40 | from 5 to 5.5% |
| W11 | X is TrFE, Y is 1225ye | from 55:45 to 60:40 | from 5.5 to 6% |
| W12 | X is TrFE, Y is 1225ye | from 55:45 to 60:40 | from 6 to 6.5% |
| W13 | X is TrFE, Y is 1225ye | from 60:40 to 65:35 | from 0.5 to 1% |
| W14 | X is TrFE, Y is 1225ye | from 60:40 to 65:35 | from 1 to 1.5% |
| W15 | X is TrFE, Y is 1225ye | from 60:40 to 65:35 | from 1.5 to 2% |
| W16 | X is TrFE, Y is 1225ye | from 60:40 to 65:35 | from 2 to 2.5% |
| W17 | X is TrFE, Y is 1225ye | from 60:40 to 65:35 | from 2.5 to 3% |
| W18 | X is TrFE, Y is 1225ye | from 60:40 to 65:35 | from 3 to 3.5% |
| W19 | X is TrFE, Y is 1225ye | from 60:40 to 65:35 | from 3.5 to 4% |
| W20 | X is TrFE, Y is 1225ye | from 60:40 to 65:35 | from 4 to 4.5% |
| W21 | X is TrFE, Y is 1225ye | from 60:40 to 65:35 | from 4.5 to 5% |
| W22 | X is TrFE, Y is 1225ye | from 60:40 to 65:35 | from 5 to 5.5% |
| W23 | X is TrFE, Y is 1225ye | from 60:40 to 65:35 | from 5.5 to 6% |
| W24 | X is TrFE, Y is 1225ye | from 60:40 to 65:35 | from 6 to 6.5% |
| W25 | X is TrFE, Y is 1225ye | from 65:35 to 70:30 | from 0.5 to 1% |
| W26 | X is TrFE, Y is 1225ye | from 65:35 to 70:30 | from 1 to 1.5% |
| W27 | X is TrFE, Y is 1225ye | from 65:35 to 70:30 | from 1.5 to 2% |
| W28 | X is TrFE, Y is 1225ye | from 65:35 to 70:30 | from 2 to 2.5% |
| W29 | X is TrFE, Y is 1225ye | from 65:35 to 70:30 | from 2.5 to 3% |
| W30 | X is TrFE, Y is 1225ye | from 65:35 to 70:30 | from 3 to 3.5% |
| W31 | X is TrFE, Y is 1225ye | from 65:35 to 70:30 | from 3.5 to 4% |
| W32 | X is TrFE, Y is 1225ye | from 65:35 to 70:30 | from 4 to 4.5% |
| W33 | X is TrFE, Y is 1225ye | from 65:35 to 70:30 | from 4.5 to 5% |
| W34 | X is TrFE, Y is 1225ye | from 65:35 to 70:30 | from 5 to 5.5% |
| W35 | X is TrFE, Y is 1225ye | from 65:35 to 70:30 | from 5.5 to 6% |
| W36 | X is TrFE, Y is 1225ye | from 65:35 to 70:30 | from 6 to 6.5% |
| W37 | X is TrFE, Y is 1225ye | from 70:30 to 75:25 | from 0.5 to 1% |
| W38 | X is TrFE, Y is 1225ye | from 70:30 to 75:25 | from 1 to 1.5% |
| W39 | X is TrFE, Y is 1225ye | from 70:30 to 75:25 | from 1.5 to 2% |
| W40 | X is TrFE, Y is 1225ye | from 70:30 to 75:25 | from 2 to 2.5% |
| W41 | X is TrFE, Y is 1225ye | from 70:30 to 75:25 | from 2.5 to 3% |
| W42 | X is TrFE, Y is 1225ye | from 70:30 to 75:25 | from 3 to 3.5% |
| W43 | X is TrFE, Y is 1225ye | from 70:30 to 75:25 | from 3.5 to 4% |
| W44 | X is TrFE, Y is 1225ye | from 70:30 to 75:25 | from 4 to 4.5% |
| W45 | X is TrFE, Y is 1225ye | from 70:30 to 75:25 | from 4.5 to 5% |
| W46 | X is TrFE, Y is 1225ye | from 70:30 to 75:25 | from 5 to 5.5% |
| W47 | X is TrFE, Y is 1225ye | from 70:30 to 75:25 | from 5.5 to 6% |
| W48 | X is TrFE, Y is 1225ye | from 70:30 to 75:25 | from 6 to 6.5% |
| W49 | X is TrFE, Y is 1225ye | from 75:25 to 80:20 | from 0.5 to 1% |
| W50 | X is TrFE, Y is 1225ye | from 75:25 to 80:20 | from 1 to 1.5% |
| W51 | X is TrFE, Y is 1225ye | from 75:25 to 80:20 | from 1.5 to 2% |
| W52 | X is TrFE, Y is 1225ye | from 75:25 to 80:20 | from 2 to 2.5% |
| W53 | X is TrFE, Y is 1225ye | from 75:25 to 80:20 | from 2.5 to 3% |
| W54 | X is TrFE, Y is 1225ye | from 75:25 to 80:20 | from 3 to 3.5% |
| W55 | X is TrFE, Y is 1225ye | from 75:25 to 80:20 | from 3.5 to 4% |
| W56 | X is TrFE, Y is 1225ye | from 75:25 to 80:20 | from 4 to 4.5% |
| W57 | X is TrFE, Y is 1225ye | from 75:25 to 80:20 | from 4.5 to 5% |
| W58 | X is TrFE, Y is 1225ye | from 75:25 to 80:20 | from 5 to 5.5% |
| W59 | X is TrFE, Y is 1225ye | from 75:25 to 80:20 | from 5.5 to 6% |
| W60 | X is TrFE, Y is 1225ye | from 75:25 to 80:20 | from 6 to 6.5% |
| X1 | X is TFE, Y is 1225ye | from 55:45 to 60:40 | from 0.5 to 1% |
| X2 | X is TFE, Y is 1225ye | from 55:45 to 60:40 | from 1 to 1.5% |
| X3 | X is TFE, Y is 1225ye | from 55:45 to 60:40 | from 1.5 to 2% |
| X4 | X is TFE, Y is 1225ye | from 55:45 to 60:40 | from 2 to 2.5% |
| X5 | X is TFE, Y is 1225ye | from 55:45 to 60:40 | from 2.5 to 3% |
| X6 | X is TFE, Y is 1225ye | from 55:45 to 60:40 | from 3 to 3.5% |
| X7 | X is TFE, Y is 1225ye | from 55:45 to 60:40 | from 3.5 to 4% |
| X8 | X is TFE, Y is 1225ye | from 55:45 to 60:40 | from 4 to 4.5% |
| X9 | X is TFE, Y is 1225ye | from 55:45 to 60:40 | from 4.5 to 5% |
| X10 | X is TFE, Y is 1225ye | from 55:45 to 60:40 | from 5 to 5.5% |
| X11 | X is TFE, Y is 1225ye | from 55:45 to 60:40 | from 5.5 to 6% |

-continued

| Polymer No. | Nature of the starting monomers | VDF:X ratio | Content of Y |
|---|---|---|---|
| X12 | X is TFE, Y is 1225ye | from 55:45 to 60:40 | from 6 to 6.5% |
| X13 | X is TFE, Y is 1225ye | from 60:40 to 65:35 | from 0.5 to 1% |
| X14 | X is TFE, Y is 1225ye | from 60:40 to 65:35 | from 1 to 1.5% |
| X15 | X is TFE, Y is 1225ye | from 60:40 to 65:35 | from 1.5 to 2% |
| X16 | X is TFE, Y is 1225ye | from 60:40 to 65:35 | from 2 to 2.5% |
| X17 | X is TFE, Y is 1225ye | from 60:40 to 65:35 | from 2.5 to 3% |
| X18 | X is TFE, Y is 1225ye | from 60:40 to 65:35 | from 3 to 3.5% |
| X19 | X is TFE, Y is 1225ye | from 60:40 to 65:35 | from 3.5 to 4% |
| X20 | X is TFE, Y is 1225ye | from 60:40 to 65:35 | from 4 to 4.5% |
| X21 | X is TFE, Y is 1225ye | from 60:40 to 65:35 | from 4.5 to 5% |
| X22 | X is TFE, Y is 1225ye | from 60:40 to 65:35 | from 5 to 5.5% |
| X23 | X is TFE, Y is 1225ye | from 60:40 to 65:35 | from 5.5 to 6% |
| X24 | X is TFE, Y is 1225ye | from 60:40 to 65:35 | from 6 to 6.5% |
| X25 | X is TFE, Y is 1225ye | from 65:35 to 70:30 | from 0.5 to 1% |
| X26 | X is TFE, Y is 1225ye | from 65:35 to 70:30 | from 1 to 1.5% |
| X27 | X is TFE, Y is 1225ye | from 65:35 to 70:30 | from 1.5 to 2% |
| X28 | X is TFE, Y is 1225ye | from 65:35 to 70:30 | from 2 to 2.5% |
| X29 | X is TFE, Y is 1225ye | from 65:35 to 70:30 | from 2.5 to 3% |
| X30 | X is TFE, Y is 1225ye | from 65:35 to 70:30 | from 3 to 3.5% |
| X31 | X is TFE, Y is 1225ye | from 65:35 to 70:30 | from 3.5 to 4% |
| X32 | X is TFE, Y is 1225ye | from 65:35 to 70:30 | from 4 to 4.5% |
| X33 | X is TFE, Y is 1225ye | from 65:35 to 70:30 | from 4.5 to 5% |
| X34 | X is TFE, Y is 1225ye | from 65:35 to 70:30 | from 5 to 5.5% |
| X35 | X is TFE, Y is 1225ye | from 65:35 to 70:30 | from 5.5 to 6% |
| X36 | X is TFE, Y is 1225ye | from 65:35 to 70:30 | from 6 to 6.5% |
| X37 | X is TFE, Y is 1225ye | from 70:30 to 75:25 | from 0.5 to 1% |
| X38 | X is TFE, Y is 1225ye | from 70:30 to 75:25 | from 1 to 1.5% |
| X39 | X is TFE, Y is 1225ye | from 70:30 to 75:25 | from 1.5 to 2% |
| X40 | X is TFE, Y is 1225ye | from 70:30 to 75:25 | from 2 to 2.5% |
| X41 | X is TFE, Y is 1225ye | from 70:30 to 75:25 | from 2.5 to 3% |
| X42 | X is TFE, Y is 1225ye | from 70:30 to 75:25 | from 3 to 3.5% |
| X43 | X is TFE, Y is 1225ye | from 70:30 to 75:25 | from 3.5 to 4% |
| X44 | X is TFE, Y is 1225ye | from 70:30 to 75:25 | from 4 to 4.5% |
| X45 | X is TFE, Y is 1225ye | from 70:30 to 75:25 | from 4.5 to 5% |
| X46 | X is TFE, Y is 1225ye | from 70:30 to 75:25 | from 5 to 5.5% |
| X47 | X is TFE, Y is 1225ye | from 70:30 to 75:25 | from 5.5 to 6% |
| X48 | X is TFE, Y is 1225ye | from 70:30 to 75:25 | from 6 to 6.5% |
| X49 | X is TFE, Y is 1225ye | from 75:25 to 80:20 | from 0.5 to 1% |
| X50 | X is TFE, Y is 1225ye | from 75:25 to 80:20 | from 1 to 1.5% |
| X51 | X is TFE, Y is 1225ye | from 75:25 to 80:20 | from 1.5 to 2% |
| X52 | X is TFE, Y is 1225ye | from 75:25 to 80:20 | from 2 to 2.5% |
| X53 | X is TFE, Y is 1225ye | from 75:25 to 80:20 | from 2.5 to 3% |
| X54 | X is TFE, Y is 1225ye | from 75:25 to 80:20 | from 3 to 3.5% |
| X55 | X is TFE, Y is 1225ye | from 75:25 to 80:20 | from 3.5 to 4% |
| X56 | X is TFE, Y is 1225ye | from 75:25 to 80:20 | from 4 to 4.5% |
| X57 | X is TFE, Y is 1225ye | from 75:25 to 80:20 | from 4.5 to 5% |
| X58 | X is TFE, Y is 1225ye | from 75:25 to 80:20 | from 5 to 5.5% |
| X59 | X is TFE, Y is 1225ye | from 75:25 to 80:20 | from 5.5 to 6% |
| X60 | X is TFE, Y is 1225ye | from 75:25 to 80:20 | from 6 to 6.5% |

In the preceding table, the PAVE can in particular be PMVE. Alternatively, the PAVE can in particular be PPVE.

The polymers described above can optionally be crosslinked, for example by means of 2,2,4-trimethyl-1,6-hexanediamine. Alternatively, the polymers described above are not crosslinked.

The polymers described above are used to manufacture ferroelectric memory devices.

"Ferroelectric memory device" is understood to mean a device which makes it possible to store information, in that it exhibits at least two distinct polarization states, it being possible for the change from one state to the other to be effected by application of an electric field and the polarization being obtained in the absence of an electric field. The memory is thus of bistable and nonvolatile type.

A ferroelectric memory device requires a coercive field strength which is sufficiently high (greater than 10 V/μm and, for example, greater than 15 V/μm) to be able to usefully store information, without being too high (less than 50 V/μm), in order to be able to easily read the information stored and to have available sufficiently thick devices. In addition, the remanent polarization should be high (greater than 10 mC/m$^2$) in order to have a sufficiently strong signal during the reading of the information. The ferroelectric memory device should preferably be able to operate at an ambient temperature of 20° C. approximately and at higher temperatures, preferably of 30° C. approximately, indeed even of 40° C. approximately, 50° C. approximately or 60° C. approximately.

A polymer of "relaxer" type exhibits a low coercive field strength (typically less than 10 V/μm) and a low (typically less than 10 mC/m$^2$), indeed even zero, remanent polarization. Consequently, such materials are not appropriate for a ferroelectric memory device. They are appropriate for manufacturing actuators or capacitors which can be used for the storage of energy or as volatile memories (which have to be recharged over time).

Thus, the ferroelectric polymer of the invention is not a polymer of relaxer type or having strong relaxer properties.

A ferroelectric memory device according to the invention is also distinguished by its shape and its structure of electric components, such as capacitors intended for the storage of energy, for example. Capacitors intended for the storage of energy, for example, are produced from two films of metalized polymers having a high surface area, which are rolled up and encapsulated in a packaging.

On the other hand, the ferroelectric memory device according to the invention is preferably a printed and flexible device. It can exhibit a thickness of 1 to 10 μm, for a surface area of 0.01 to 10 mm$^2$, preferably of 0.1 to 1 mm$^2$.

According to one embodiment, the ferroelectric memory device according to the invention makes it possible to store information without recharging, at a temperature of 20° C., for a duration of greater than one second, preferably of greater than one hour and more particularly greater than one day, and in particular of greater than one year.

According to one embodiment, these minimum durations of storage of the information without recharging are also obtained at a temperature of at least 30° C., preferably at a temperature of at least 40° C. and more particularly at a temperature of at least 50° C., indeed even of at least 60° C.

The ferroelectric memory device according to the invention generally comprises a layer comprising one of the polymers described above and two electrodes positioned on either side of this layer and intended to apply an electric field to the polymer layer. The electrodes/ferroelectric polymer/electrodes assembly can be deposited on a substrate. The layer comprising the polymer can consist of the polymer in question; or also alternatively it can consist of a mixture of several of the above polymers; or also alternatively it can consist of a mixture of above polymers (preferably just one) with one or more additional materials (for example a semiconducting polymer).

The ferroelectric memory device thus makes it possible to store at least one bit of information.

The term covers both an individual ferroelectric memory cell, comprising two separate polarization states and thus being able to store one bit of information, and integrated ferroelectric memory devices, which comprise a plurality of cells and can thus store a plurality of bits of information.

The ferroelectric memory device according to the invention preferably exhibits writing means and reading means. The writing means make it possible to apply, to the polymer layer, an electric field suitable for modifying the polymerization of the polymer layer. The reading means make it possible to measure the state of polarization of the polymer layer.

The polymer layer in the ferroelectric memory device exhibits a thickness which is preferably less than 1 μm. For example, the thickness can be from 10 nm to 900 nm or from 100 nm to 800 nm.

The use of the polymers described above makes it possible to use varied thicknesses and in particular greater thicknesses than with the P(VDF-TrFE) layers described in the state of the art, as a result of the lower value of the coercitive field strength. This is advantageous as far as a thin layer can exhibit problems of heterogeneity related to the roughness of the materials.

The electrodes present in the ferroelectric memory device can be metallic, for example made of aluminum, platinum, titanium, copper, silver or gold.

They can also consist of a conducting polymer, for example doped polypyrrole, doped polypyrrole derivatives, doped polyaniline, doped polyaniline derivatives, doped polythiophenes and doped polythiophene derivatives. Poly (3,4-ethylenedioxythiophene), optionally combined with polystyrenesulfonate, is a preferred conducting polymer.

The electrodes can also comprise a layer of conducting polymer (in contact with the central layer of ferroelectric polymer) and a metal layer. In this regard, reference is expressly made to the schemes of FIGS. 1, 2a, 2b, 2c, 2d and 2e of the document WO 02/43071.

According to another embodiment, the layer of ferroelectric polymer is combined with a layer of semiconducting material. The semiconducting material can, for example, be poly[2-methoxy-5-(2'-ethylhexyloxy)-p-phenylene-vinylene].

The device according to the invention can in particular be a ferroelectric capacitor. In such a device, the information is stored by aligning the direction of the internal polarization along an applied external field. In order to read the information, a commutating voltage is applied and a more or less high charge displacement current response is measured, depending on whether the internal polarization is or is not aligned with the applied field. The reading can thus be destructive of the information stored, in which case a rewriting voltage has to be applied after the reading operation.

Alternatively, the device according to the invention can be a ferroelectric field-effect transistor. In such a device, the layer of ferroelectric polymer is combined with a layer of semiconducting material, for example of semiconducting polymer. The layer of ferroelectric polymer acts as gate insulator. The functionality of the device originates from the attenuation of the concentration of charge carriers in the semiconducting material as a result of the ferroelectric polarization of the gate insulator. In a ferroelectric field-effect transistor, the reading of the information is nondestructive.

Alternatively, the device according to the invention can be a ferroelectric diode. In such a device, the ferroelectric polymer is mixed with a semiconducting polymer in order to provide a composite layer comprising ferroelectric domains and semiconducting domains. The semiconducting polymer can, for example, be poly(3-hexylthiophene) having irregular regions. This device combines some of the advantages of the ferroelectric capacitor (in particular its simplicity of construction) and of the ferroelectric field-effect transistor (namely, to provide resistive-type commutation).

The device according to the invention can also be an integrated memory, comprising a plurality of ferroelectric cells (each cell storing one bit of information) connected in matrix fashion. The ferroelectric cells can in particular be ferroelectric capacitors, ferroelectric field-effect transistors or ferroelectric diodes.

Such an integrated memory comprises a first array of electrodes, on one side of the layer of ferroelectric polymer, and a second array of electrodes, on the other side of the layer of ferroelectric polymer.

Figure 2:
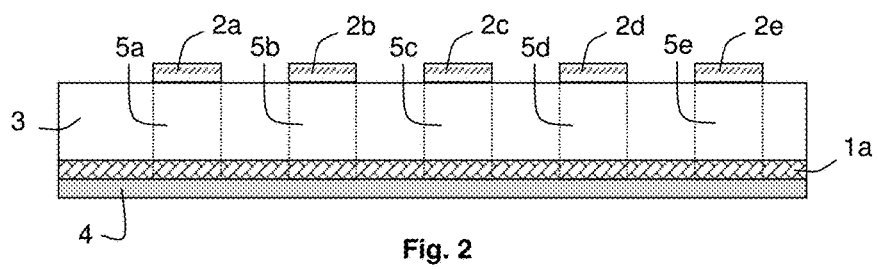
FIG. 2 diagrammatically represents the same embodiment in cross section.

By way of example and with reference to FIGS. 1 and 2, an integrated memory can comprise a single layer 3 of ferroelectric polymer, sandwiched between a first array of electrodes 1a, 1b, 1c, 1d, 1e and a second array of electrodes 2a, 2b, 2c, 2d 2e. Each array of electrodes is, for example, a series of parallel bands, the two arrays having crosswise, preferably orthogonal, directions. Individual ferroelectric memory cells 5a, 5b, 5c, 5d, 5e are delimited by intersections of the facing arrays of electrodes; each comprises a volume of ferroelectric polymer and portions of electrodes located on either side of this volume. The assembly of the device is positioned on a substrate 4, which is, for example, a metalized silicon wafer (in particular metalized with aluminum or platinum).

The manufacture of the ferroelectric memory device according to the invention is preferably carried out by deposition of successive layers or films (of ferroelectric polymer, of materials forming electrodes, optionally of semiconducting material) on a substrate. Deposition can be carried out in particular by coating, by spincoating, by spraying, by roll-to-roll printing, by silkscreen printing or by inkjet printing.

Another subject matter of the invention is all the polymers described above, as such.

Another subject matter of the invention is a film as such, the film consisting of any one of the above polymers and exhibiting a thickness of less than 1 μm; or a thickness from 10 nm to 100 nm; or a thickness from 100 nm to 200 nm; or a thickness from 200 nm to 300 nm; or a thickness from 200 nm to 300 nm; or a thickness from 300 nm to 400 nm; or a thickness from 400 nm to 500 nm; or a thickness from 500 nm to 600 nm; or a thickness from 600 nm to 700 nm; or a thickness from 700 nm to 800 nm; or a thickness from 800 nm to 900 nm; or a thickness from 900 nm to 1 μm.

The film is advantageously subjected to a heat treatment in order to increase its crystallinity, that is to say a state of heating in an oven. The heating time can, for example, be from 10 minutes to 5 hours, in particular from 30 minutes to 2 hours. The heating temperature can be from 40° C. to 5° C., preferably from 25 to 10° C., for example approximately 15° C. lower than the melting point of the polymer (measured by differential scanning calorimetry).

Another subject matter of the invention is a ferroelectric memory device comprising at least one layer which comprises a ferroelectric polymer and at least two electrodes on either side of this layer, the ferroelectric polymer being of general formula P(VDF-X-Y), in which VDF represents vinylidene fluoride units, X represents trifluoroethylene or tetrafluoroethylene units and Y represents units resulting from a third monomer and in which the relative proportions of the VDF, X and Y units are adjusted so that the polymer exhibits the physical properties of any one of the polymers P1 to P64 appearing in the following table:

| Polymer No. | Ec | Pr | Tc |
|---|---|---|---|
| P1 | <50 V/μm | >15 mC/m$^2$ | >20° C. |
| P2 | <50 V/μm | >15 mC/m$^2$ | >30° C. |
| P3 | <50 V/μm | >15 mC/m$^2$ | >40° C. |

-continued

| Polymer No. | Ec | Pr | Tc |
|---|---|---|---|
| P4 | <50 V/μm | >15 mC/m$^2$ | >50° C. |
| P5 | <50 V/μm | >25 mC/m$^2$ | >20° C. |
| P6 | <50 V/μm | >25 mC/m$^2$ | >30° C. |
| P7 | <50 V/μm | >25 mC/m$^2$ | >40° C. |
| P8 | <50 V/μm | >25 mC/m$^2$ | >50° C. |
| P9 | <50 V/μm | >35 mC/m$^2$ | >20° C. |
| P10 | <50 V/μm | >35 mC/m$^2$ | >30° C. |
| P11 | <50 V/μm | >35 mC/m$^2$ | >40° C. |
| P12 | <50 V/μm | >35 mC/m$^2$ | >50° C. |
| P13 | <50 V/μm | >45 mC/m$^2$ | >20° C. |
| P14 | <50 V/μm | >45 mC/m$^2$ | >30° C. |
| P15 | <50 V/μm | >45 mC/m$^2$ | >40° C. |
| P16 | <50 V/μm | >45 mC/m$^2$ | >50° C. |
| P17 | <40 V/μm | >15 mC/m$^2$ | >20° C. |
| P18 | <40 V/μm | >15 mC/m$^2$ | >30° C. |
| P19 | <40 V/μm | >15 mC/m$^2$ | >40° C. |
| P20 | <40 V/μm | >15 mC/m$^2$ | >50° C. |
| P21 | <40 V/μm | >25 mC/m$^2$ | >20° C. |
| P22 | <40 V/μm | >25 mC/m$^2$ | >30° C. |
| P23 | <40 V/μm | >25 mC/m$^2$ | >40° C. |
| P24 | <40 V/μm | >25 mC/m$^2$ | >50° C. |
| P25 | <40 V/μm | >35 mC/m$^2$ | >20° C. |
| P26 | <40 V/μm | >35 mC/m$^2$ | >30° C. |
| P27 | <40 V/μm | >35 mC/m$^2$ | >40° C. |
| P28 | <40 V/μm | >35 mC/m$^2$ | >50° C. |
| P29 | <40 V/μm | >45 mC/m$^2$ | >20° C. |
| P30 | <40 V/μm | >45 mC/m$^2$ | >30° C. |
| P31 | <40 V/μm | >45 mC/m$^2$ | >40° C. |
| P32 | <40 V/μm | >45 mC/m$^2$ | >50° C. |
| P33 | <30 V/μm | >15 mC/m$^2$ | >20° C. |
| P34 | <30 V/μm | >15 mC/m$^2$ | >30° C. |
| P35 | <30 V/μm | >15 mC/m$^2$ | >40° C. |
| P36 | <30 V/μm | >15 mC/m$^2$ | >50° C. |
| P37 | <30 V/μm | >25 mC/m$^2$ | >20° C. |
| P38 | <30 V/μm | >25 mC/m$^2$ | >30° C. |
| P39 | <30 V/μm | >25 mC/m$^2$ | >40° C. |
| P40 | <30 V/μm | >25 mC/m$^2$ | >50° C. |
| P41 | <30 V/μm | >35 mC/m$^2$ | >20° C. |
| P42 | <30 V/μm | >35 mC/m$^2$ | >30° C. |
| P43 | <30 V/μm | >35 mC/m$^2$ | >40° C. |
| P44 | <30 V/μm | >35 mC/m$^2$ | >50° C. |
| P45 | <30 V/μm | >45 mC/m$^2$ | >20° C. |
| P46 | <30 V/μm | >45 mC/m$^2$ | >30° C. |
| P47 | <30 V/μm | >45 mC/m$^2$ | >40° C. |
| P48 | <30 V/μm | >45 mC/m$^2$ | >50° C. |
| P49 | <20 V/μm | >15 mC/m$^2$ | >20° C. |
| P50 | <20 V/μm | >15 mC/m$^2$ | >30° C. |
| P51 | <20 V/μm | >15 mC/m$^2$ | >40° C. |
| P52 | <20 V/μm | >15 mC/m$^2$ | >50° C. |
| P53 | <20 V/μm | >25 mC/m$^2$ | >20° C. |
| P54 | <20 V/μm | >25 mC/m$^2$ | >30° C. |
| P55 | <20 V/μm | >25 mC/m$^2$ | >40° C. |
| P56 | <20 V/μm | >25 mC/m$^2$ | >50° C. |
| P57 | <20 V/μm | >35 mC/m$^2$ | >20° C. |
| P58 | <20 V/μm | >35 mC/m$^2$ | >30° C. |
| P59 | <20 V/μm | >35 mC/m$^2$ | >40° C. |
| P60 | <20 V/μm | >35 mC/m$^2$ | >50° C. |
| P61 | <20 V/μm | >45 mC/m$^2$ | >20° C. |
| P62 | <20 V/μm | >45 mC/m$^2$ | >30° C. |
| P63 | <20 V/μm | >45 mC/m$^2$ | >40° C. |
| P64 | <20 V/μm | >45 mC/m$^2$ | >50° C. |

In the above table, the Curie temperature is denoted by Tc, the coercitive field strength is denoted by Ec and the remanent polarization is denoted by Pr. These parameters are measured as follows.

The thermal properties of the semicrystalline polymers, such as the temperatures and enthalpies of fusion and of Curie transition, are analyzed by differential scanning calorimetry (DSC).

The cell comprising the sample (from 5 to 15 mg approximately), and also an empty cell acting as reference, are subjected to a temperature cycle at a given rate and the heat flow in the sample cell, in comparison with that of the reference cell, is recorded during the temperature gradient, on heating and on cooling. The Curie transition is expressed by a first-order transition at a temperature lower than that of the melting. Two cycles are carried out in the interval −20/200° C. at a heating rate and a cooling rate at 10° C./min. The data are collected on the second cycle and the value of the temperature at the apex of the 1$^{st}$ transition gives the Curie temperature. The Curie transition is also characterized by the specific enthalpy of the phenomenon, expressed in Joules per gram of polymer, and is measured as the area of the peak of the transition with respect to the base line in the DSC diagram.

As regards the measurement of the coercitive field strength and of the remanent polarization, the procedure is carried out as follows.

Films of polymers are prepared from a 14% by weight solution in methyl ethyl ketone filtered through a 0.2 μm filter. The solution is coated onto a sheet of glass and left to dry for 12 hours. The films are detached from the surface and placed in an oven under vacuum at 80° C. for four hours in order to evaporate the solvent. The films are subsequently placed in an oven at 15° C. below the melting temperature of the polymer, measured by differential scanning telemetry, for one hour.

The ferroelectric characteristics of the material, in particular its remanent polarization and its coercitive field strength, are measured at 20° C. according to the method described in the patent FR 2 538 157. The polymer film is placed between two electrodes, forming an active surface area of 9 mm$^2$. The measurements are carried out at ambient temperature. An alternating electric field (sinusoidal signal over a period of 18 s) is then applied to the polymer film and the resulting current is measured using a current amplifier. As this current is composed of several contributions (capacitive current, polarization current and resistive current), a computer program analyzes the signal and extracts the polarization current. The polarization (C/m$^2$) is calculated from the integration with respect to time of the polarization current and gives an account of the ferroelectricity of the material.

The remanent polarization (Pr) is defined as the value of the polarization measured at zero field. The coercitive field strength (Ec) is defined as the value of the applied field for which the polarization measured is zero.

According to one embodiment, the polymers P1 to P64 are P(VDF-TrFE-CTFE) polymers.

According to one embodiment, the polymers P1 to P64 are P(VDF-TFE-CTFE) polymers.

According to one embodiment, the polymers P1 to P64 are P(VDF-TrFE-CFE) polymers.

According to one embodiment, the polymers P1 to P64 are P(VDF-TFE-CFE) polymers.

According to one embodiment, the polymers P1 to P64 are P(VDF-TrFE-HFP) polymers.

According to one embodiment, the polymers P1 to P64 are P(VDF-TFE-HFP) polymers.

According to one embodiment, the polymers P1 to P64 are P(VDF-TrFE-VF) polymers.

According to one embodiment, the polymers P1 to P64 are P(VDF-TFE-VF) polymers.

According to one embodiment, the polymers P1 to P64 are P(VDF-TrFE-1234yf) polymers.

According to one embodiment, the polymers P1 to P64 are P(VDF-TFE-1234yf) polymers.

According to one embodiment, the polymers P1 to P64 are P(VDF-TrFE-bromotrifluoroethylene) polymers.

According to one embodiment, the polymers P1 to P64 are P(VDF-TFE-bromotrifluoroethylene) polymers.

According to one embodiment, the polymers P1 to P64 are P(VDF-TrFE-PPVE) polymers.

According to one embodiment, the polymers P1 to P64 are P(VDF-TFE-PPVE) polymers.

According to one embodiment, the polymers P1 to P64 are P(VDF-TrFE-PMVE) polymers.

According to one embodiment, the polymers P1 to P64 are P(VDF-TFE-PMVE) polymers.

According to one embodiment, the polymers P1 to P64 are P(VDF-TrFE-TFE) polymers.

According to one embodiment, the polymers P1 to P64 are P(VDF-TrFE-1233xf) polymers.

According to one embodiment, the polymers P1 to P64 are P(VDF-TFE-1233xf) polymers.

According to one embodiment, the polymers P1 to P64 are P(VDF-TrFE-1243zf) polymers.

According to one embodiment, the polymers P1 to P64 are P(VDF-TFE-1243zf) polymers.

According to one embodiment, the polymers P1 to P64 are P(VDF-TrFE-1225zc) polymers.

According to one embodiment, the polymers P1 to P64 are P(VDF-TFE-1225zc) polymers.

According to one embodiment, the polymers P1 to P64 are P(VDF-TrFE-1225ye) polymers.

According to one embodiment, the polymers P1 to P64 are P(VDF-TFE-1225ye) polymers.

Another subject matter of the invention is all these polymers P1 to P64, as such.

Another subject matter of the invention is the use of these polymers P1 to P64 for the manufacture of ferroelectric memory devices.

Another subject matter of the invention is a film as such, the film consisting of any one of these polymers P1 to P64 and exhibiting a thickness of less than 1 µm; or a thickness from 10 nm to 100 nm; or a thickness from 100 nm to 200 nm; or a thickness from 200 nm to 300 nm; or a thickness from 200 nm to 300 nm; or a thickness from 300 nm to 400 nm; or a thickness from 400 nm to 500 nm; or a thickness from 500 nm to 600 nm; or a thickness from 600 nm to 700 nm; or a thickness from 700 nm to 800 nm; or a thickness from 800 nm to 900 nm; or a thickness from 900 nm to 1 µm.

EXAMPLE

Several films of P(VDF-TrFE), P(VDF-TrFE-CTFE) and P(VDF-TrFE-CFE) polymers manufactured from varied proportions of monomers are obtained according to the following protocol. Films of polymers are prepared from a 14% by weight solution in methyl ethyl ketone filtered through a 0.2 µm filter. The solution is coated onto a sheet of glass and left to dry for 12 hours. The films are detached from the surface and placed in an oven under vacuum at 80° C. for four hours in order to evaporate the solvent. The films are subsequently placed in an oven at 15° C. below the melting temperature of the polymer, measured by differential scanning calorimetry, for one hour.

The Curie temperature (Tc), the coercitive field strength (Ec) and the remanent polarization (Pr) of these different polymers are measured by employing the measurement protocols described above. The results are summarized in the table below:

| Polymer No. | VDF/(VDF + TrFE) in mol % | CFE (mol %) | CTFE (mol %) | Tc (° C.) | Ec (V/µm) | Pr (mC/m$^2$) |
|---|---|---|---|---|---|---|
| 1 (invention) | 68.3 | — | 4.5 | 49.2 | 32 | 33.5 |
| 2 (invention) | 71 | — | 6 | 32 | 32 | 27 |
| 3 (invention) | 61 | — | 4.1 | 52.4 | 18.3 | 16.6 |
| 4 (invention) | 68 | 4.5 | — | 32 | 37.7 | 48.7 |
| 5 (invention) | 61.5 | 6.1 | — | 21 | 27.7 | 16.6 |
| 6 (comparative) | 62.3 | 7.7 | — | 12 | 10 | 8.9 |
| 7 (comparative) | 66.4 | — | 9.7 | 20 | 6.6 | 11.6 |
| 8 (comparative) | 70 | — | — | 102 | 54 | 65 |
| 9 (comparative) | 75 | — | — | 114 | 52 | 64 |

The invention claimed is:

1. A non-volatile ferroelectric memory device comprising, in said non-volatile ferroelectric memory device, at least one layer which comprises a ferroelectric polymer and at least two electrodes on either side of this layer, the ferroelectric polymer being of general formula P(VDF-X-Y), in which VDF represents vinylidene fluoride units, X represents trifluoroethylene or tetrafluoroethylene units and Y represents tetrafluoroethylene, vinyl fluoride, perfluoro(alkyl vinyl) ether, bromotrifluoroethylene, chlorotrifluoroethylene, tetrafluoropropene, chlorotrifluoropropene, trifluoropropene or pentafluoropropene units, monomer, the molar proportion of Y units in the polymer has a value from 0.1 to 6.5%, and the ferroelectric polymer having a remanent polarization greater than 15 mC/m$^2$.

2. The device as claimed in claim 1, in which Y represents tetrafluoroethylene, vinyl fluoride, perfluoro(alkyl vinyl) ether, bromotrifluoroethylene, tetrafluoropropene, chlorotrifluoropropene, trifluoropropene or pentafluoropropene units.

3. The device as claimed in claim 1, in which X represents trifluoroethylene units.

4. The device as claimed in claim 1, in which the molar ratio of the VDF units to the X units in the polymer has a value from 55:45 to 80:20.

5. The device as claimed in claim 4, wherein the molar ratio of VDF units to X units is 60:40 to 75:25.

6. The device as claimed in claim 1, in which the layer of ferroelectric polymer has a thickness of less than 1 µm.

7. The device as claimed in claim 6, wherein the layer of ferroelectric polymer has a thickness from 10 nm to 900 nm.

8. The device as claimed in claim 6, wherein the layer of ferroelectric polymer has a thickness from 100 nm to 800 nm.

9. The device as claimed in claim 1, comprising a semiconducting material, as a mixture with the ferroelectric polymer or in the form of a separate layer.

10. The device as claimed in claim 9, wherein the semiconducting material is a semiconducting polymer.

11. The device as claimed in claim 1, which comprises or which is a ferroelectric capacitor.

12. The device as claimed in claim 1, which comprises or which is a ferroelectric field-effect transistor.

13. The device as claimed in claim 1, which comprises or which is a ferroelectric diode.

14. The device as claimed in claim 1, which is an integrated memory device comprising two arrays of electrodes on either side of the layer of ferroelectric polymer or on either side of a plurality of layers of the ferroelectric polymer.

15. The device as claimed in claim 1, in which the ferroelectric polymer is deposited on a substrate by spin coating, spraying or printing.

16. The device as claimed in claim 1, wherein the molar proportion of Y units is from 0.5 to 6%.

17. The device as claimed in claim 1, wherein the molar proportion of Y units is from 2 to 5%.

* * * * *